(12) United States Patent
Huang et al.

(10) Patent No.: US 12,557,371 B2
(45) Date of Patent: Feb. 17, 2026

(54) SEMICONDUCTOR STRUCTURE AND METHOD FOR MANUFACTURING THE SAME

(71) Applicant: Taiwan Semiconductor Manufacturing Co., Ltd., Hsinchu (TW)

(72) Inventors: Mao-Lin Huang, Hsinchu (TW); Lung-Kun Chu, New Taipei (TW); Chung-Wei Hsu, Baoshan Township (TW); Kuo-Cheng Chiang, Zhubei (TW); Chih-Hao Wang, Baoshan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 414 days.

(21) Appl. No.: 18/151,598

(22) Filed: Jan. 9, 2023

(65) Prior Publication Data
US 2023/0411219 A1    Dec. 21, 2023

Related U.S. Application Data

(60) Provisional application No. 63/412,116, filed on Sep. 30, 2022, provisional application No. 63/366,440, filed on Jun. 15, 2022.

(51) Int. Cl.
*H10D 84/03* (2025.01)
*H10D 30/01* (2025.01)
(Continued)

(52) U.S. Cl.
CPC ......... *H10D 84/038* (2025.01); *H10D 30/014* (2025.01); *H10D 30/0415* (2025.01);
(Continued)

(58) Field of Classification Search
CPC ............... H10D 84/038; H10D 30/014; H10D 30/0415; H10D 30/43; H10D 30/6735; H10D 30/6739; H10D 62/121; H10D 64/017; H10D 84/0167; H10D 84/0181; H10D 84/85; H10D 30/797; H10D 30/6757; H10D 62/822; H10D 64/518;
(Continued)

(56) References Cited

U.S. PATENT DOCUMENTS 9,209,247 B2    12/2015    Colinge et al.
9,236,267 B2    1/2016    De et al.
(Continued)

FOREIGN PATENT DOCUMENTS

TW          202207468 A       2/2022

*Primary Examiner* — Amit Chatly
(74) *Attorney, Agent, or Firm* — Slater Matsil, LLP

(57) ABSTRACT

A semiconductor device includes a first channel region disposed in a first device region over a substrate; a first gate dielectric layer disposed over the first channel region; a second gate dielectric layer disposed over the second channel region; and a gate electrode disposed over the first gate dielectric layer. The first gate dielectric layer includes a first dipole dopant and the second gate dielectric layer includes a second dipole dopant embedded therein. A boundary between the first gate dielectric layer and the second gate dielectric layer contains the first dipole dopant and the second dipole dopant.

20 Claims, 60 Drawing Sheets

(51) Int. Cl.
*H10D 30/43* (2025.01)
*H10D 30/67* (2025.01)
*H10D 62/10* (2025.01)
*H10D 64/01* (2025.01)
*H10D 84/01* (2025.01)
*H10D 84/85* (2025.01)

(52) U.S. Cl.
CPC ......... *H10D 30/43* (2025.01); *H10D 30/6735* (2025.01); *H10D 30/6739* (2025.01); *H10D 62/121* (2025.01); *H10D 64/017* (2025.01); *H10D 84/0167* (2025.01); *H10D 84/0181* (2025.01); *H10D 84/85* (2025.01)

(58) Field of Classification Search
CPC .. H10D 64/691; H10D 84/83; H10D 84/0144; B82Y 10/00; H01L 21/28185
See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2010/0044798 | A1* | 2/2010 | Hooker ............ H01L 21/28185 257/369 |
| 2016/0181414 | A1* | 6/2016 | Huang ................ H10D 62/822 438/283 |
| 2022/0093648 | A1 | 3/2022 | Lavric et al. |

* cited by examiner

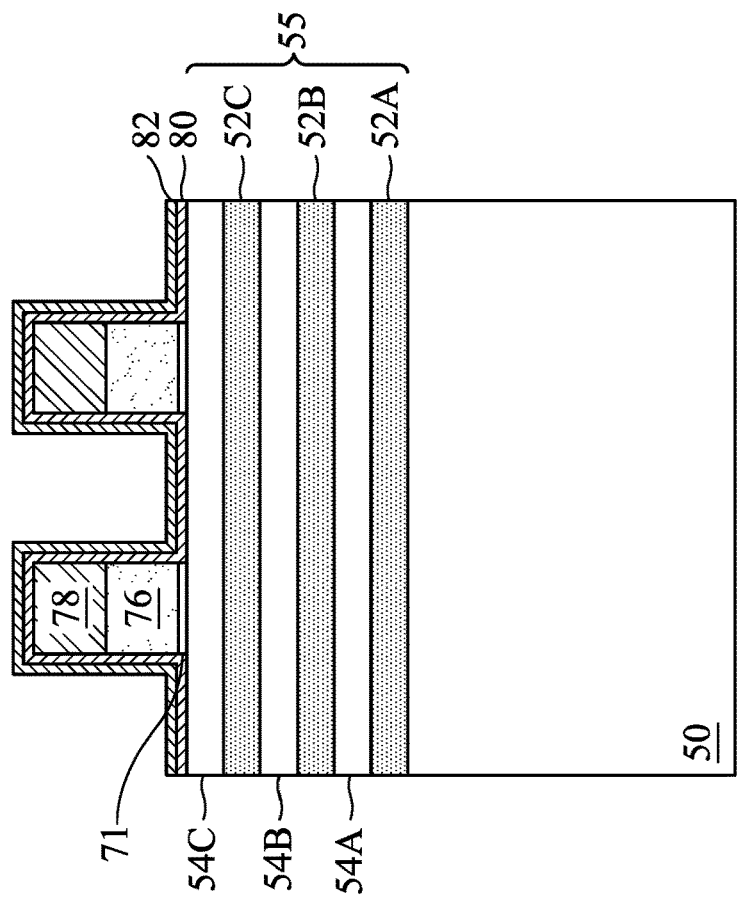
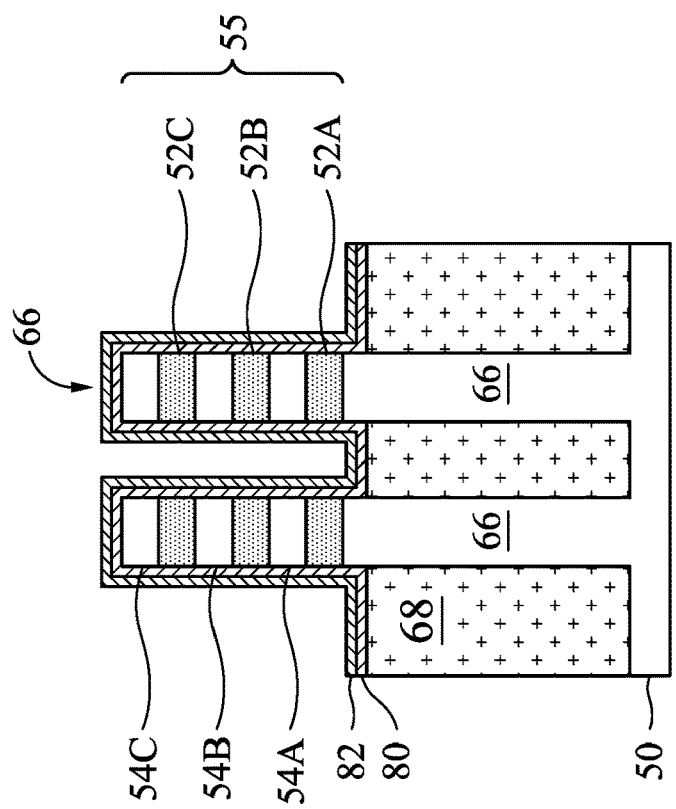
Figure 7A
Figure 7B

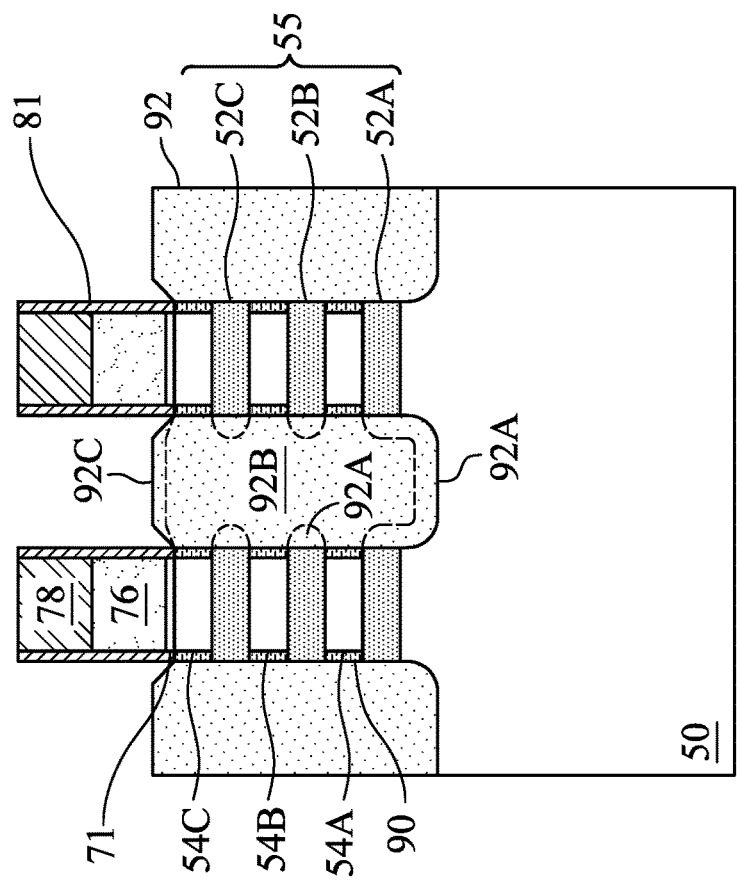
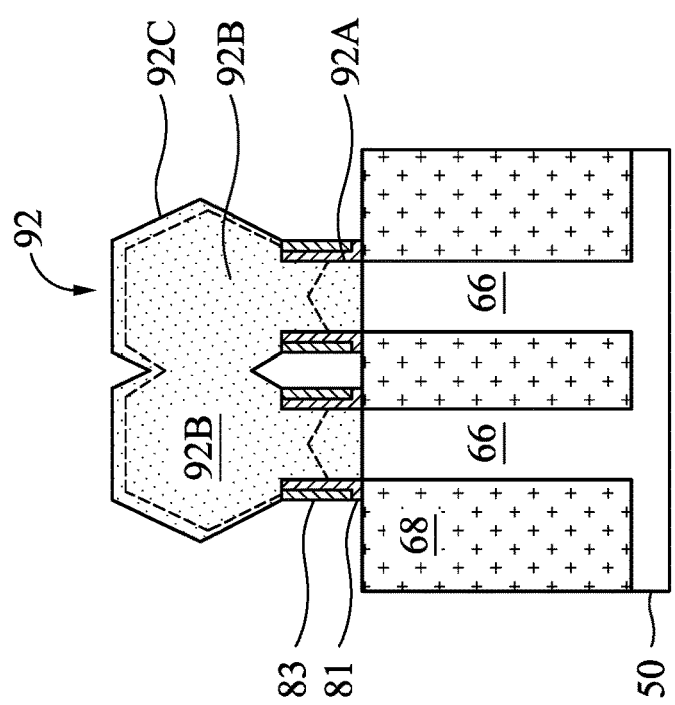
Figure 12B
Figure 12A

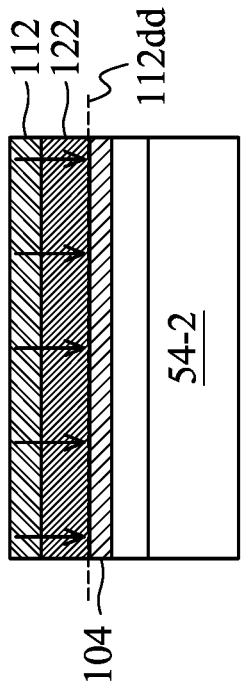
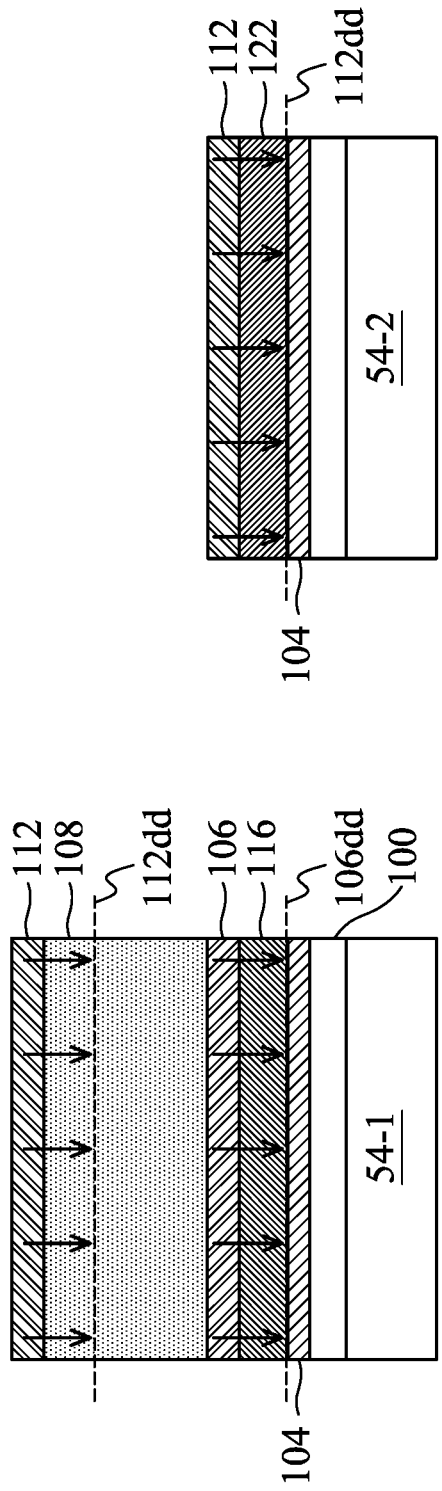
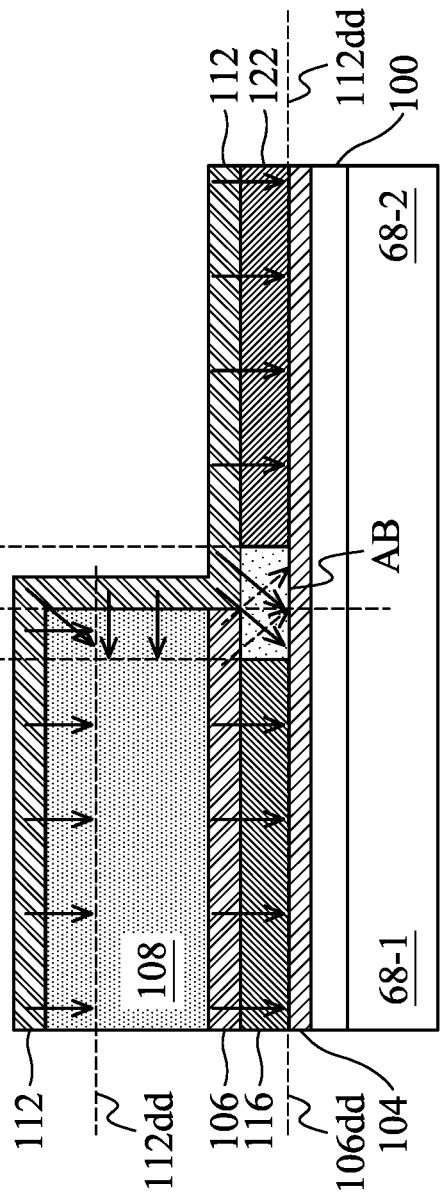
Figure 22A
Figure 22B
Figure 22C

SEMICONDUCTOR STRUCTURE AND METHOD FOR MANUFACTURING THE SAME

PRIORITY CLAIM AND CROSS-REFERENCE

This application claims the benefit of U.S. Provisional Application No. 63/366,440, filed on Jun. 15, 2022, and entitled "SEMICONDUCTOR STRUCTURE AND METHOD FOR MANUFACTURING THE SAME," and U.S. Provisional Application No. 63/412,116, filed on Sep. 30, 2022 and entitled "SEMICONDUCTOR STRUCTURE AND METHOD FOR MANUFACTURING THE SAME," which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 8A, 8B, 9A, 9B, 10A, 10B, 11A, 11B, 11C, 12A, 12B, 12C, 12D, 13A, 13B, 13C, 14A, 14B, 15A, 15B, 16A, 16B, 17A, 17B, 17C, 18A, 18B, 18C, 19A, 19B, 19C, 20A, 20B, 20C, 21A, 21B, 21C, 25A, 25B, 25C, 26A, 26B, 26C, 26D, 26E, 26F, 26G, 26H, 27A, 27B, 27C, 27D, 28A, 28B, 28C, and 28D are cross-sectional views of intermediate stages in the manufacturing of nano-FETs, in accordance with some embodiments.

FIGS. 22A, 22B, 22C, 23A, 23B, 24A, and 24B are various close-up and process views of stages in the manufacturing of nano-FETs, in accordance with some embodiments.

DETAILED DESCRIPTION

Figure 1:
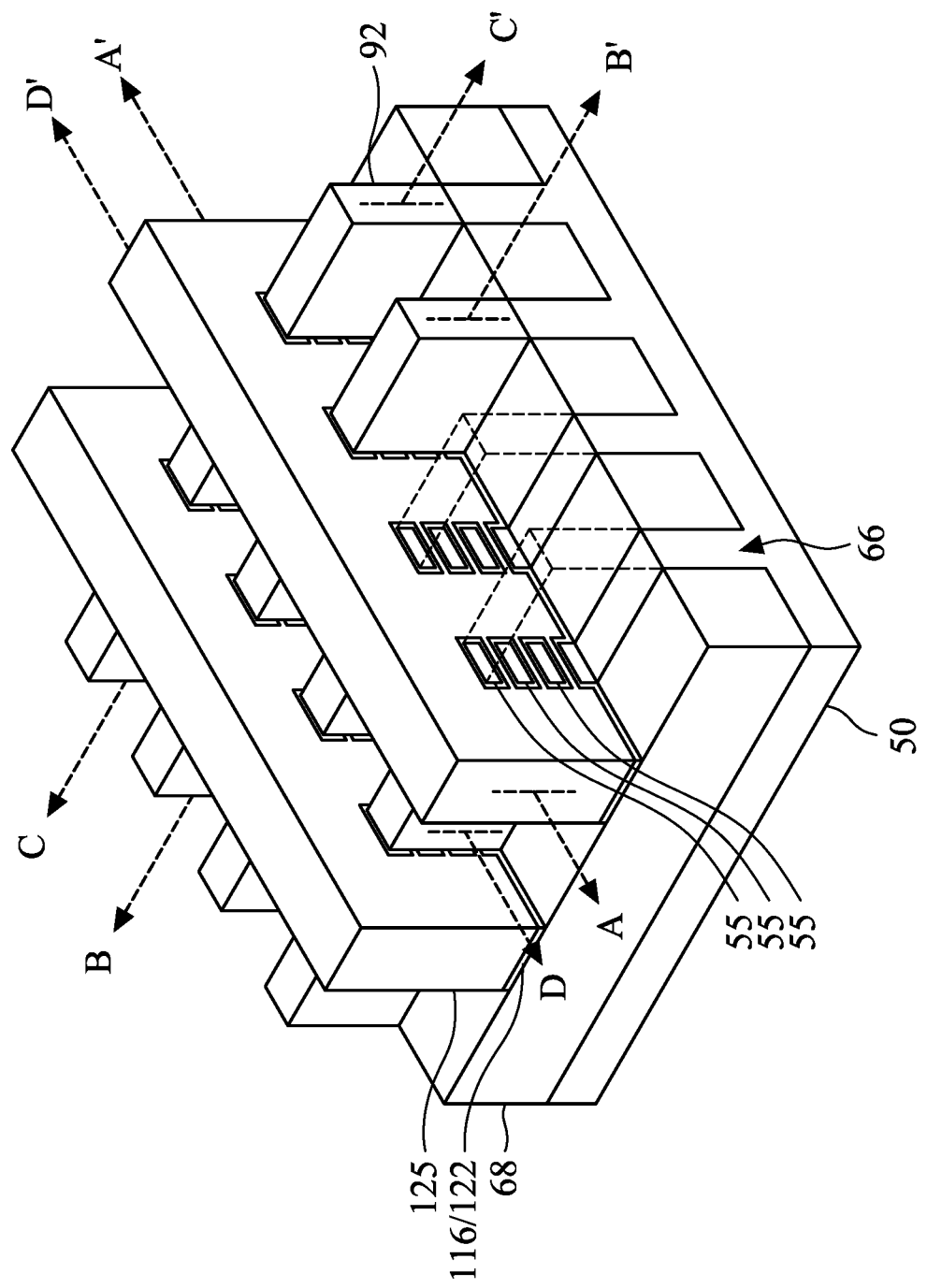
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As discussed in greater detail below, embodiments illustrated in the present disclosure provide semiconductor devices which comprise doped gate dielectric layers. In particular, the doped dielectric layers are doped with one or more dipole dopants so as to affect threshold voltages of gate structures and provide the gate structures to have various threshold voltages in various regions. Different dipole dopants may be used on different gate dielectric layers. Embodiments utilize masking and dopant drive-in processes which are simplified and have the benefit of providing better boundary control between device areas. In particular, a single masking process is used to distinguish between adjacent device areas, thereby reducing costs and eliminating or reducing dipole overlap. Reducing or eliminating dipole overlap allowing devices to be placed more compactly together.

Embodiments are described below in a particular context, e.g., a die comprising nano-FETs. Various embodiments may be applied, however, to dies comprising other types of transistors (e.g., fin field effect transistors (FinFETs), planar transistors, or the like) in lieu of or in combination with the nano-FETs. Some examples of some of such embodiments are described below as well.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 is illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers (such as doped gate dielectric layers 116/122, discussed below) are over top surfaces of the fins 66 and along top surfaces, sidewalls, and bottom surfaces of the nanostructures 55. Gate electrodes 125 are over the gate dielectric layers 116/122. Epitaxial source/drain regions 92 are disposed on the fins 66 on opposing sides of the gate dielectric layers 116/122 and the gate electrodes 125.

FIG. 1 further illustrates reference cross-sections that are used in later figures. Cross-section A-A' is along a longitudinal axis of a gate electrode 125 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET in a first threshold region and in a direction of, for example, a current flow between the epitaxial source/drain regions 92 of the nano-FET in the first threshold region. Cross-section C-C' is parallel to cross-section B-B' and is parallel to a longitudinal axis of a fin 66 of the nano-FET in a second threshold region and in a direction of, for example, a current flow between the epitaxial source/drain regions 92 of the nano-FET in the second threshold region. Subsequent figures refer to these reference cross-sections for clarity. Cross-section D-D' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 28D are cross-sectional views of intermediate stages in the manufacturing of nano-FETs, in accordance with some embodiments. FIGS. 2 through 5, 6A, 13A, 14A, 15A, 16A, 17A, 18A, 19A, 20A, 21A, 25A, 26A, 27A, and 28A illustrate reference cross-section A-A' illustrated in FIG. 1. FIGS. 6B, 7B, 8B, 9B, 10B, 11B, 11C, 12B, 12D, 13B, 14B, 15B, 16B, 17B, 18B, 19B, 20B, 21B, 25B, 26B, 27B, and 28B illustrate reference cross-section B-B' illustrated in FIG. 1. FIGS. 6B, 7B, 8B, 9B, 10B, 11B, 11C, 12B, 12D, 13B, 14B, 15B, 16B, 17B, 18B, 19B, 20B, 21B, 25B, 26B, 27B, and 28B illustrate reference cross-section C-C' illustrated in FIG. 1. FIGS. 7A, 8A, 9A, 10A, 11A, 12A, 12C, 13C, 26H, 27D, and 28D reference cross-section D-D' illustrated in FIG. 1.

Figure 2:
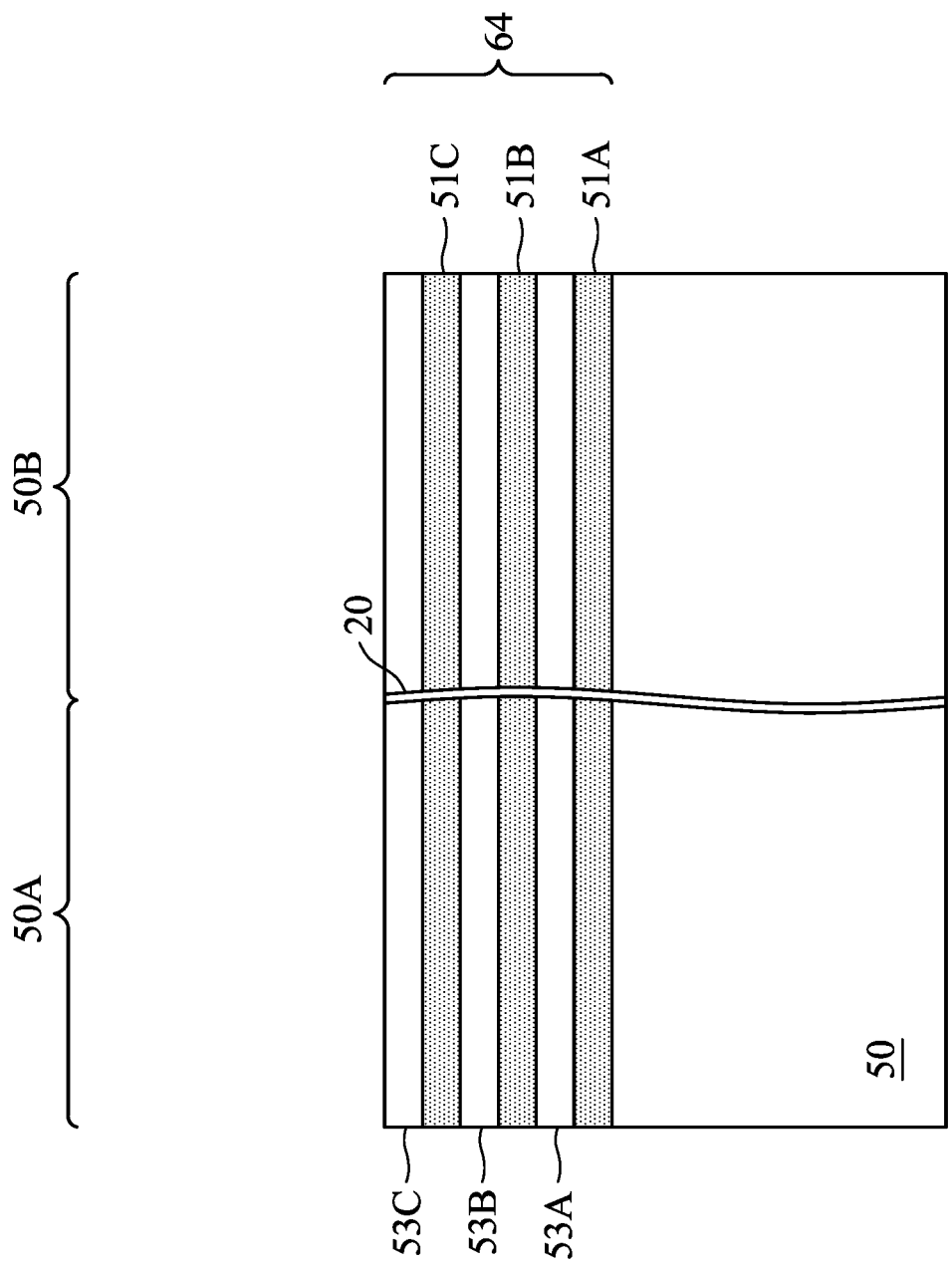

In FIG. 2, a substrate 50 is provided for forming the nano-FETs. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 includes a first region 50A and a second region 50B. In some embodiments, the first region 50A and the second region 50B are for forming different devices. For example, the first region 50A may be a logic device region, and the second region 50B may be an I/O device region. Alternatively, both the first region 50A and the second region 50B are the logic device region or the I/O region with different functional circuits. In some embodiments, the first region 50A and the second region 50B may be used for forming devices of the same conductivity type or different conductivity types. For example, in an embodiment, both the first region 50A and the second region 50B are for forming n-type devices, such as NMOS transistors (e.g., n-type nano-FETs), or p-type devices, such as PMOS transistors (e.g., p-type nano-FETs). In some embodiments, the first region 50A can be for forming n-type devices, such as an NMOS device region for forming NMOS transistors (e.g., n-type nano-FETs), and the second region 50B can be for forming p-type devices, such as a PMOS device region for forming PMOS transistors (e.g., p-type nano-FETs). The first region 50A may be physically separated from the second region 50B (as illustrated by divider 20), and any number of device features (e.g., other active devices, doped regions, isolation structures, etc.) may be disposed between the first region 50A and the second region 50B. Although one first region 50A and one second region 50B are illustrated, any number of first regions 50A and second regions 50B may be provided. For the sake of simplicity, only one region is illustrated in the subsequent Figures, however, it should be understood that the processes described below may be utilized in any of the regions contemplated. Descriptions are provided below for handling multiple regions, including for example, masking one or more regions while performing processes on the other region(s). Where different processes or materials may be used for different regions, such will be noted within the context of the discussion.

Figure 34:
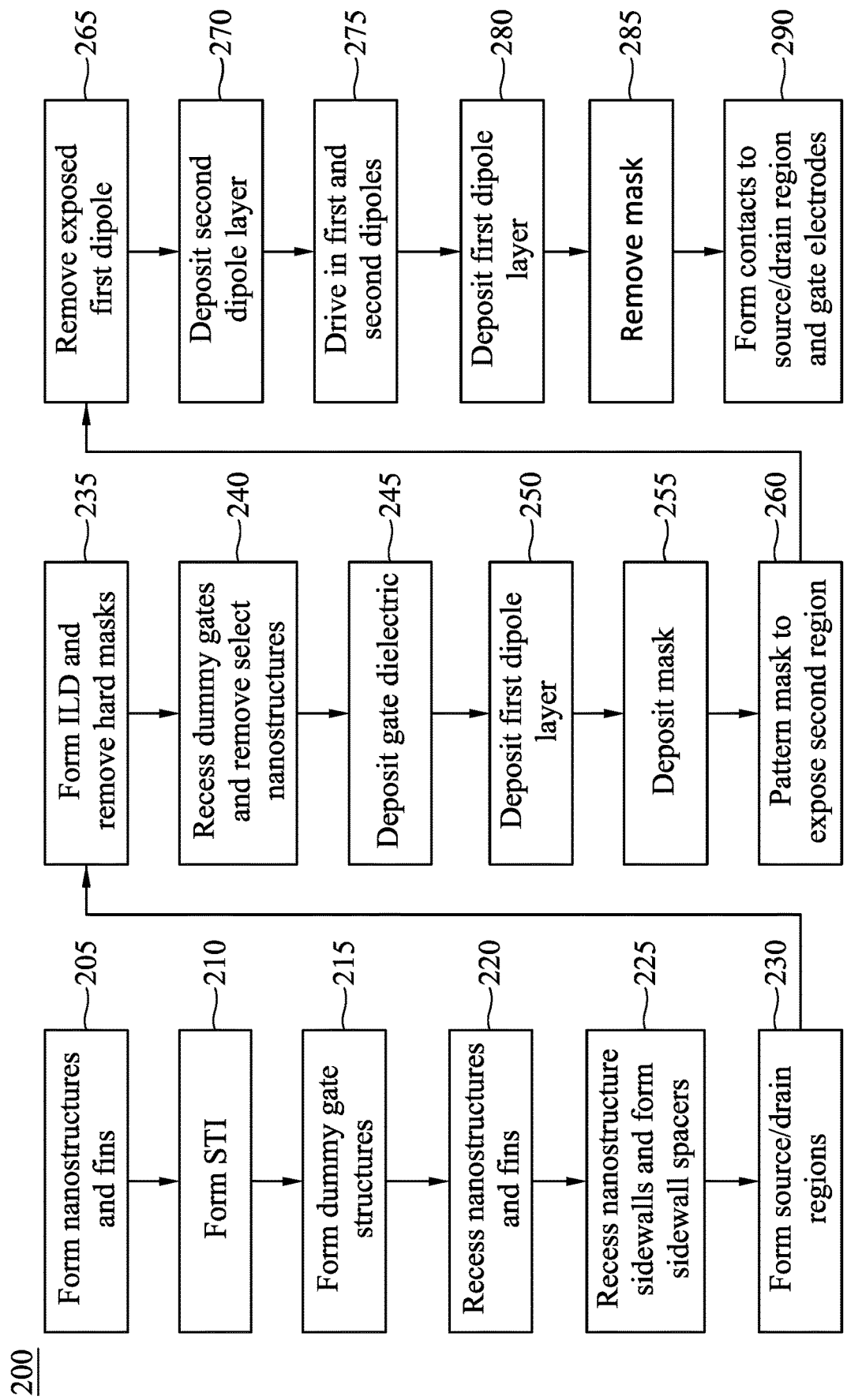
FIG. 34 is a flow diagram of a dipole doping process, in accordance with some embodiments.

Further in FIG. 2, a multi-layer stack 64 is formed over the substrate 50. This process is illustrated as step 205 of the flow diagram of FIG. 34. The multi-layer stack 64 includes alternating layers of first semiconductor layers 51A-51C (collectively referred to as first semiconductor layers 51) and second semiconductor layers 53A-53C (collectively referred to as second semiconductor layers 53). The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material. Similarly, the second semiconductor layers 53 of the second semiconductor material may be removed without significantly removing the first semiconductor layers 51. For purposes of illustration and as discussed in greater detail below, the first semiconductor layers 51 will be removed, and the second semiconductor layers 53 will be patterned to form channel regions of the nano-FETs in both the first region 50A and the second region 50B. Nevertheless, in some embodiments, the second semiconductor layer 53 will be removed, and the first semiconductor layer 51 may be patterned to form channel regions of the nano-FETs. In such embodiments, the channel regions in both the first region 50A and the second region 50B may have a same material composition (e.g., silicon or other suitable semiconductor materials) and be formed simultaneously.

In still other embodiments, the first semiconductor layers 51 will be removed in the first region 50A, and the second semiconductor layers 53 will be patterned to form channel regions of the nano-FETs in the first region 50A. Also, the second semiconductor layer 53 will be removed, and the first semiconductor layer 51 will be patterned to form channel regions of the nano-FETs in the second region 50B. Nevertheless, in some embodiments, the second semiconductor layers 53 may be removed, and the first semiconductor layers 51 may be patterned to form channel regions of the nano-FETs in the first region 50A, and the first semiconductor layers 51 may be removed, and the second semiconductor layers 53 may be patterned to form channel regions of the nano-FETs in the second region 50B. In such embodiments, the channel regions in both the first region 50A and the second region 50B have different material compositions (e.g., one is silicon, silicon carbide, or the like, and another is silicon germanium or another semiconductor material). FIGS. 29A, 29B, 29C and 29D illustrate a structure resulting from such embodiments where the channel region in the first region 50A formed of a semiconductor material such as silicon or silicon carbide, and the channel region in the second region 50B formed of another semiconductor material such as silicon germanium, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like.

Figure 3:
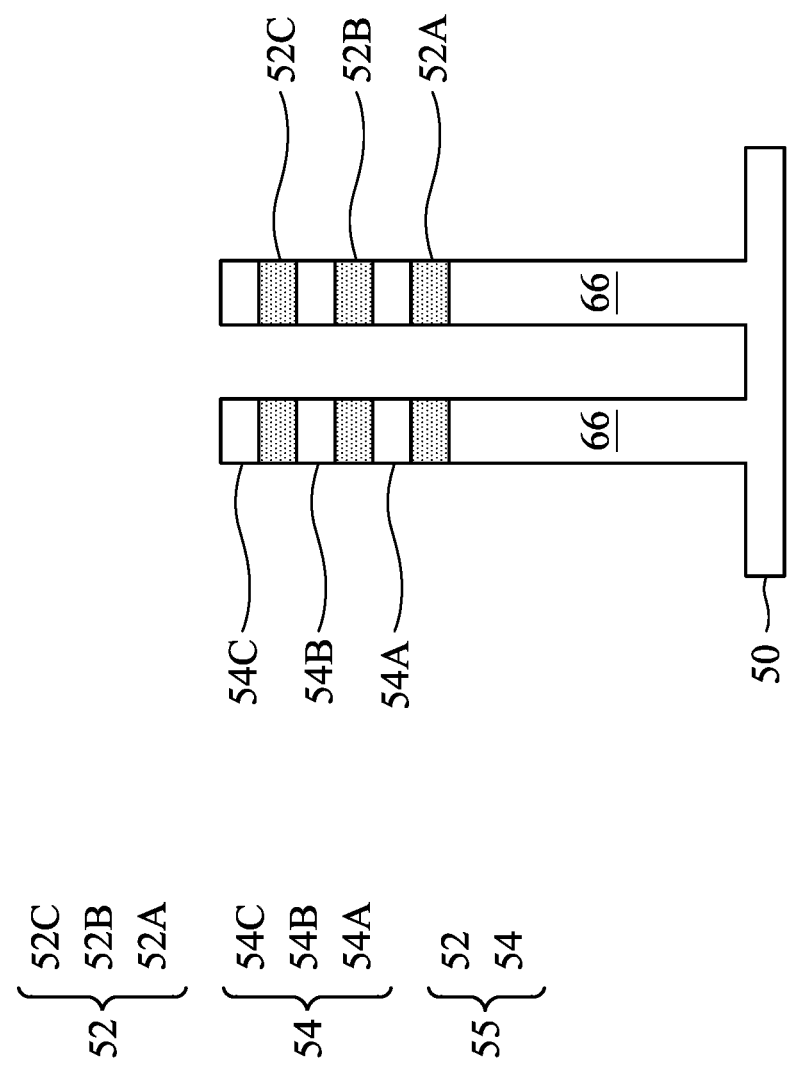

Referring to FIG. 3, fins 66 are formed in the substrate 50, and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nanostructures 54A-54C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66. Such a process is illustrated with respect to FIGS. 32-33D, and discussed in further detail below.

FIG. 3 illustrates the fins 66 as having substantially equal widths for illustrative purposes. In some embodiments, widths of the fins 66 in the first region 50A may be greater or thinner than the fins 66 in the second region 50B. Further, while each of the fins 66 and the nanostructures 55 are illustrated as having a consistent width throughout, in some embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
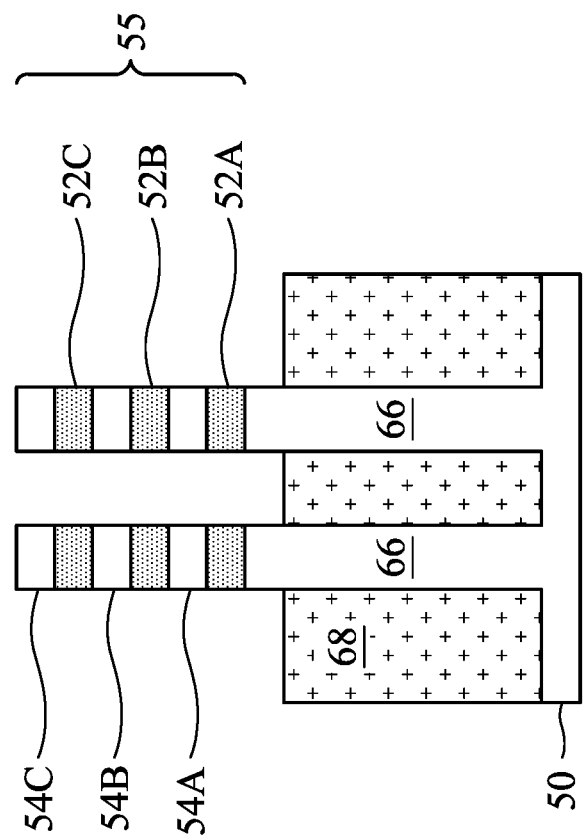

In FIG. 4, shallow trench isolation (STI) regions 68 are formed adjacent the fins 66. This process is illustrated as step 210 of the flow diagram of FIG. 34. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Further in FIG. 4, appropriate wells (not separately illustrated) may be formed in the fins 66 and nanostructures 55, and/or the substrate 50. The wells may have a conductivity type opposite from a conductivity type of source/drain regions that will be subsequently formed in each of the regions 50A and 50B, etc. For example, in some embodiments, a p-type well is formed in an n-type region, and an n-type well is formed in a p-type region. In some embodiments, a p-type well or an n-type well is formed in both the n-type region and the p-type region. The n-type well may be formed by performing an n-type impurity implant. The n-type impurities may be phosphorus, arsenic, antimony, or the like implanted in the region to a concentration in the range of $10^{13}$ cm$^{-3}$ to $10^{14}$ cm$^{-3}$. The p-type well may be formed by performing a p-type impurity implant. The p-type impurities may be boron, boron fluoride, indium, or the like implanted in the region to a concentration in the range of $10^{13}$ cm$^{-3}$ to $10^{14}$ cm$^{-3}$. After the implants are implanted, an anneal process may be performed to repair damage and activate the p-type and/or n-type impurities that were implanted. In some embodiments where epitaxial structures are epitaxially grown for the fins 66 and the nanostructures 55, the grown materials may be in situ doped during growth, which may obviate the implantations, although in situ and implantation doping may be used together.

Figure 5:
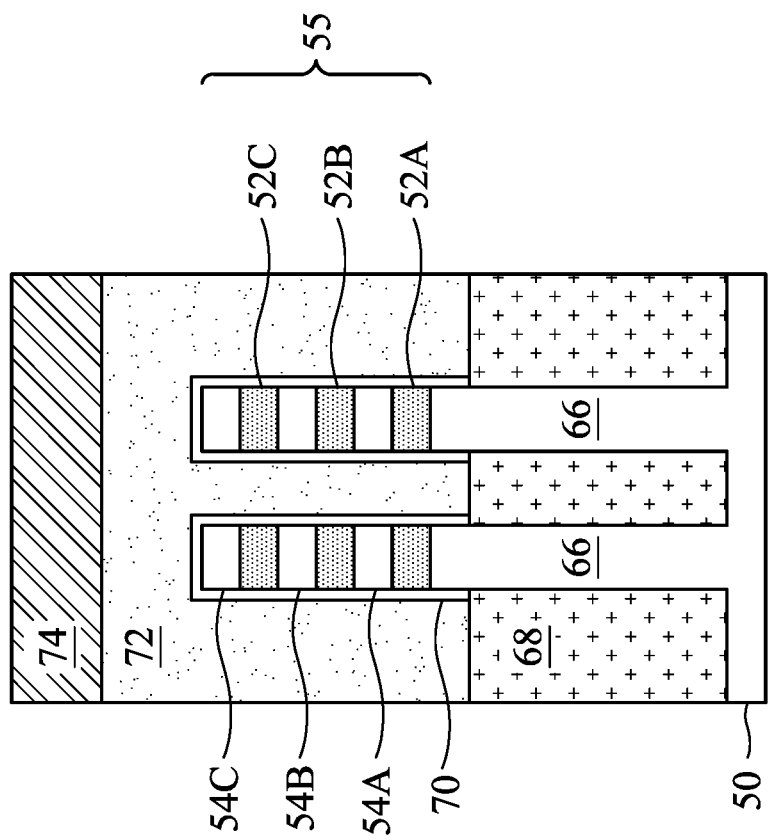

In FIG. 5, a dummy dielectric layer 70 is formed on the fins 66 and/or the nanostructures 55. This process is illustrated as step 215 of the flow diagram of FIG. 34. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a chemical mechanical polishing (CMP). The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In some embodiments, the mask layer 74 may include both an oxide layer and a nitride layer, such as silicon oxide and silicon nitride. In some embodiments, the same dummy gate layer 72 and mask layer 74 are formed across both the first region 50A and the second region 50B. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

FIGS. 6A through 28D illustrate various additional steps in the manufacturing of embodiment devices. FIGS. 6A, 6B, 7A, 7B, 8A, 8B, 9A, 9B, 10A, 10B, 11A, 11B, 11C, 12A, 12B, 12C, 12D, 13A, 13B, 13C, 14A, 14B, 15A, 15B, 16A, 16B, 26H, 27D, 28D illustrate structures in either the first region 50A or the second region 50B.

Figure 6A:
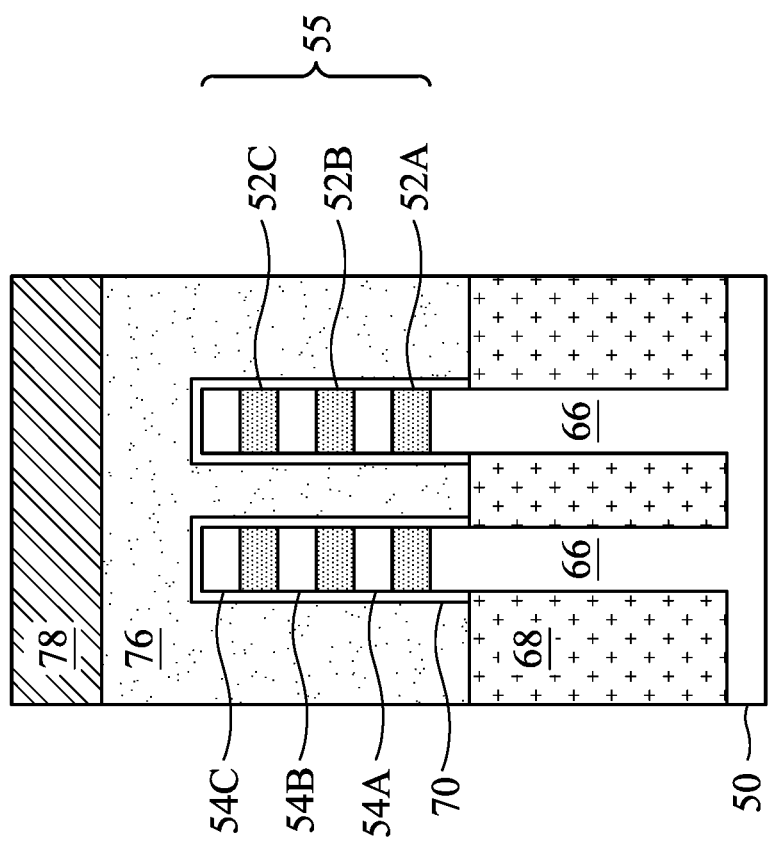
Figure 6B:
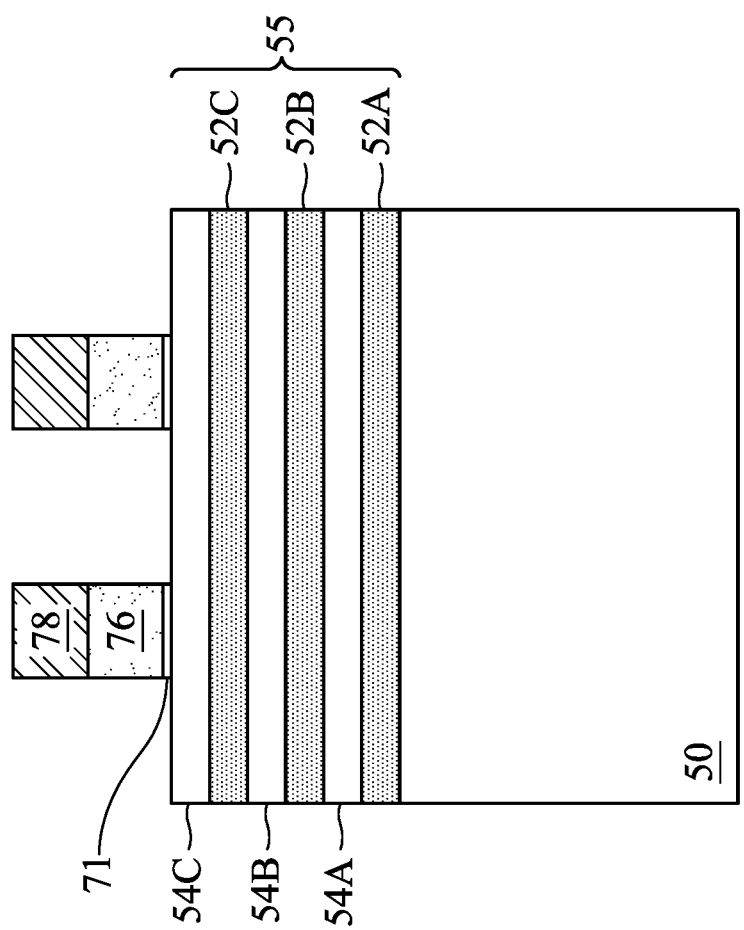

In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. This process is also illustrated as step 215 of the flow diagram of FIG. 34. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55 and the masks 78; sidewalls of the dummy gates 76 and the dummy gate dielectrics 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After forming the first spacer layer 80 and prior to forming the second spacer layer 82, implants for lightly doped source/drain (LDD) regions (not separately illustrated) may be performed. Appropriate type impurities (e.g., n-type or p-type) may be implanted into the fins 66 and/or the nanostructures 55. The n-type impurities may be any of the n-type impurities previously described, and the p-type impurities may be any of the p-type impurities previously described. The LDD regions may have a concentration of impurities in the range of $10^{15}$ cm$^{-3}$ to $10^{19}$ cm$^{-3}$. An anneal process may be used to repair implant damage and to activate the implanted impurities.

Figure 8B:
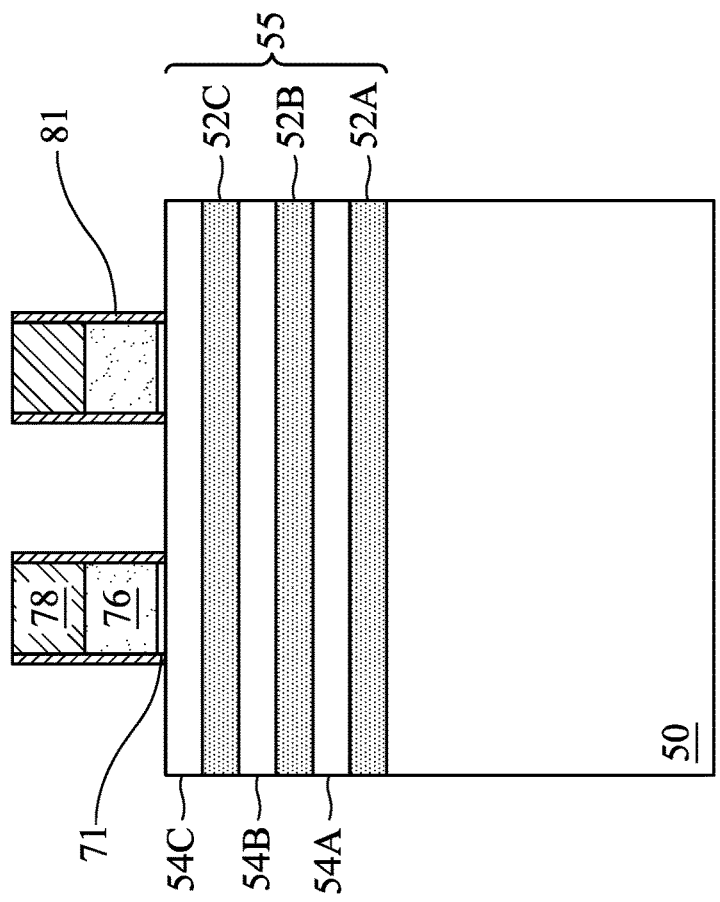
Figure 8A:
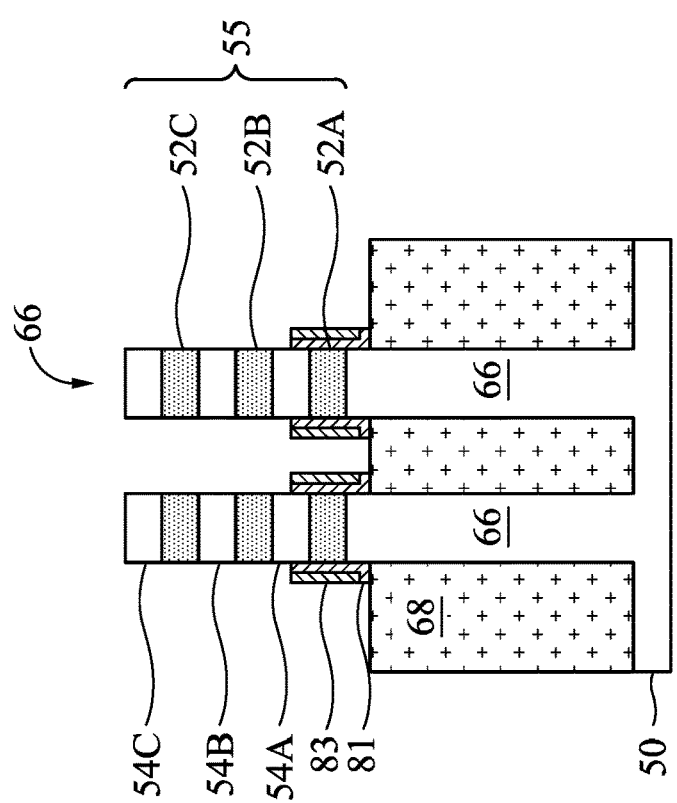

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-aligned subsequently formed source/drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etch process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 act as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, a different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps, for example by masking the first region 50A to form p-type devices in the second region 50B and by masking the second region 50B to form n-type devices in the first region or vice versa.

Figure 9B:
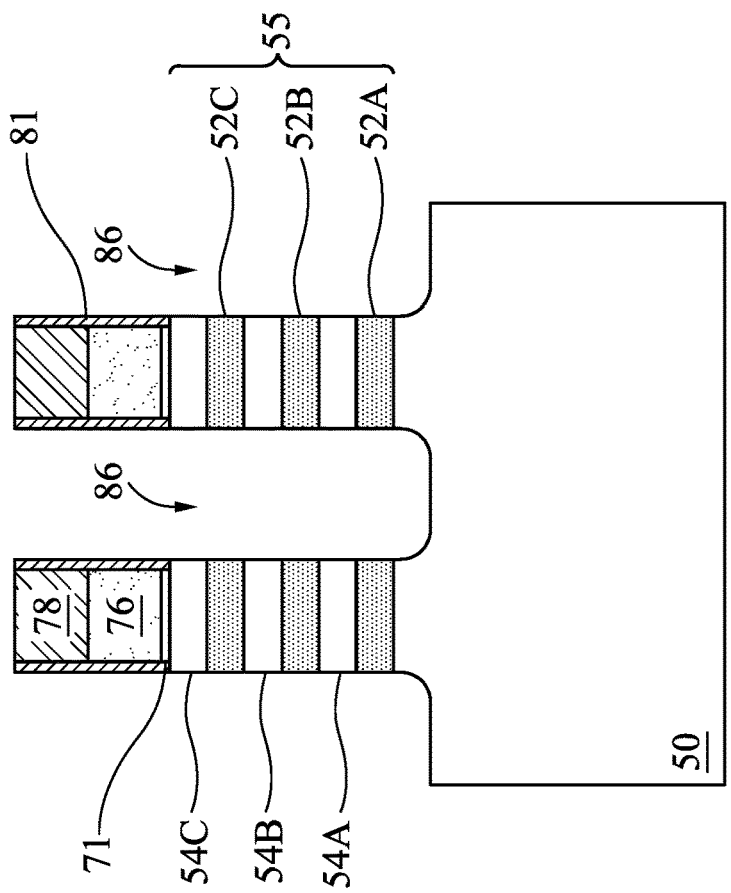
Figure 9A:
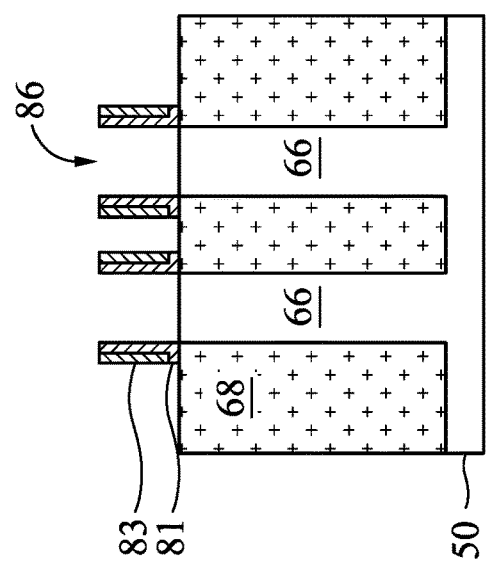

In FIGS. 9A and 9B, first recesses 86 are formed in the fins 66, the nanostructures 55, and the substrate 50, in accordance with some embodiments. This process is illustrated as step 220 of the flow diagram of FIG. 34. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10B:
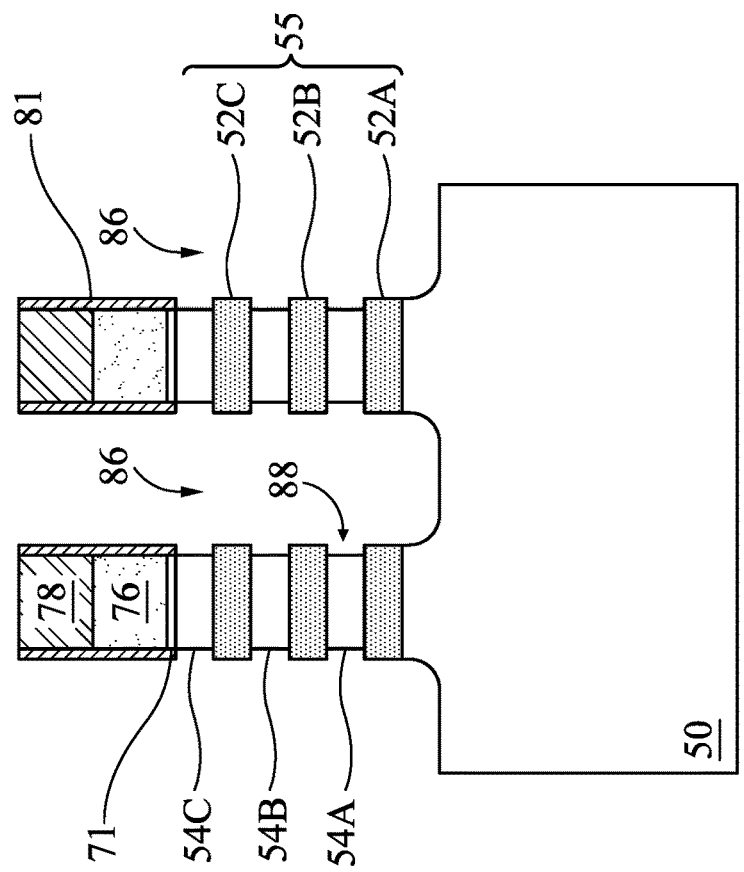
Figure 10A:
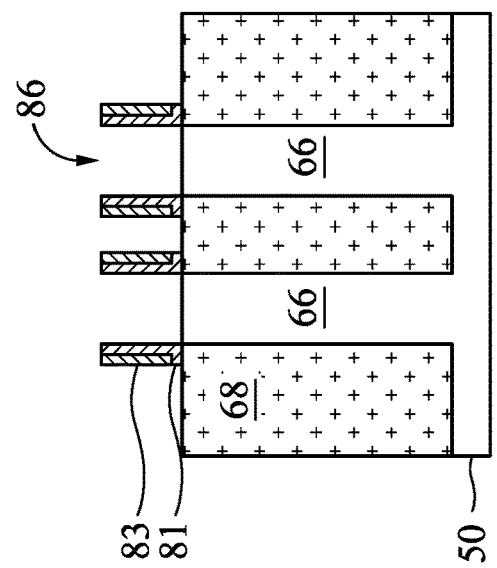

In FIGS. 10A and 10B, portions of sidewalls of the layers of the multi-layer stack 64 formed of the first semiconductor materials (e.g., the first nanostructures 52) exposed by the first recesses 86 are etched to form sidewall recesses 88 in the first region 50A and the second region 50B. This process is illustrated as step 225 of the flow diagram of FIG. 34. Although sidewalls of the first nanostructures 52 in sidewall recesses 88 are illustrated as being straight in FIG. 10B, the sidewalls may be concave or convex. The sidewalls may be etched using isotropic etching processes, such as a wet etch or the like.

Figure 11B:
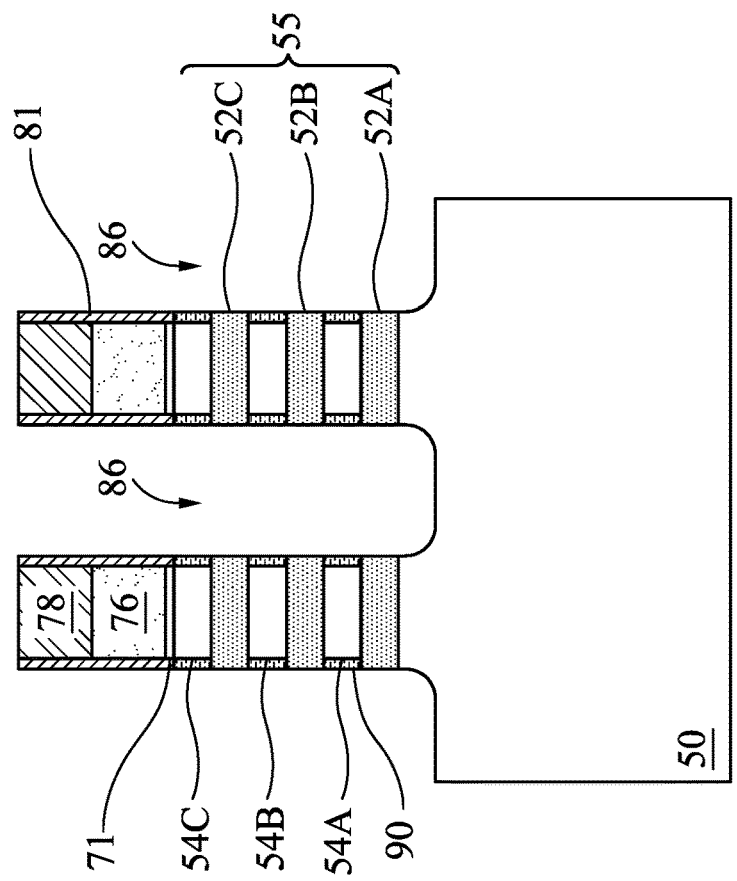
Figure 11A:
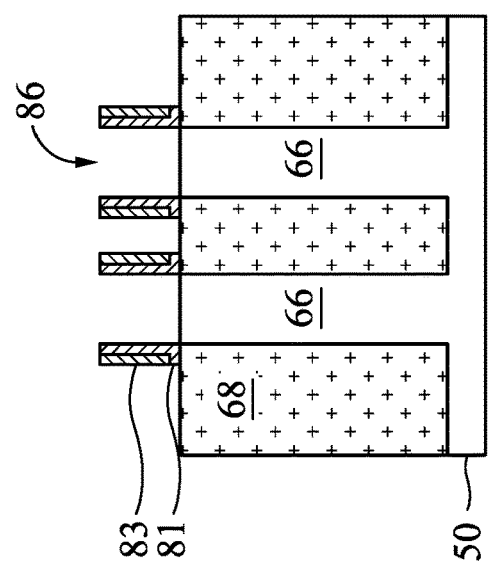
Figure 11C:
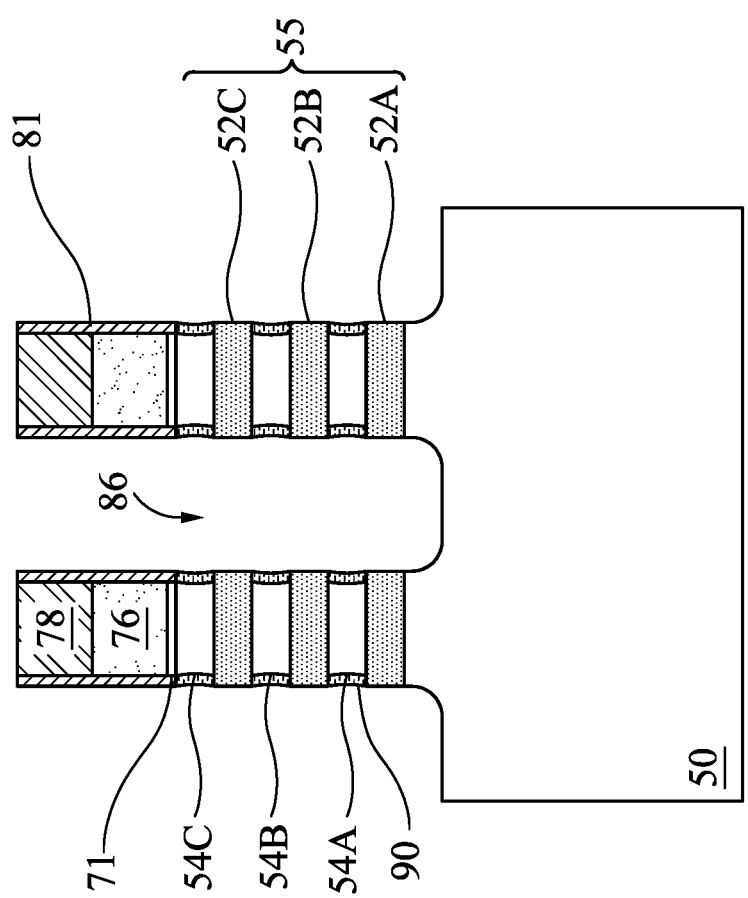

In FIGS. 11A, 11B, and 11C, first inner spacers 90 are formed in the sidewall recess 88. This process is also illustrated as step 225 of the flow diagram of FIG. 34. The first inner spacers 90 may be formed by depositing an inner spacer layer over the structures illustrated in FIGS. 10A and 10B. The first inner spacers 90 act as isolation features between subsequently formed source/drain regions and a gate structure. As will be discussed in greater detail below, source/drain regions will be formed in the first recesses 86, while the first nanostructures 52 in the first region 50A and the second region 50B will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the first region 50A and the second region 50B, the outer sidewalls of the first inner spacers 90 may extend beyond or be recessed from sidewalls of the second nanostructures 54.

Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers are recessed from sidewalls of the first nanostructures 52. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A, 12B, 12C, and 12D) by subsequent etching processes, such as etching processes used to form gate structures.

Figure 12D:
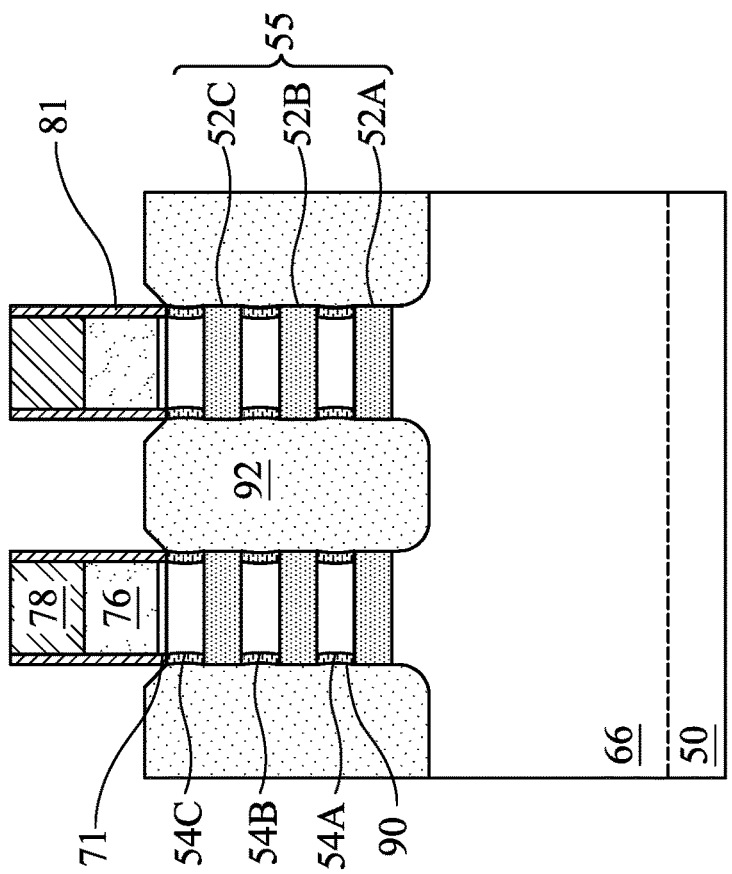

In FIGS. 12A, 12B, 12C, and 12D, epitaxial source/drain regions 92 are formed in the first recesses 86. This process is illustrated as step 230 of the flow diagram of FIG. 34. In some embodiments, the epitaxial source/drain regions 92 may exert stress on the second nanostructures 54 in the first region 50A and the second region 50B, thereby improving performance. As illustrated in FIG. 12B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs. Source/drain region(s) 92 may refer to a source or a drain, individually or collectively dependent upon the context.

The epitaxial source/drain regions 92 may include any acceptable material, such as appropriate for an n-type or p-type device, depending on whether a device is in the first region 50A or second region 50B, etc. For example, when n-type devices are formed, the epitaxial source/drain regions 92 may include materials exerting a tensile strain in the channel regions, such as silicon, SiC, SiCP, SiP, or the like. Similarly, when p-type devices are formed, the epitaxial source/drain regions 92 may include materials exerting a compressive strain in the channel regions, such as SiGe, SiGeB, Ge, GeSn, or the like.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal process. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

Figure 12C:
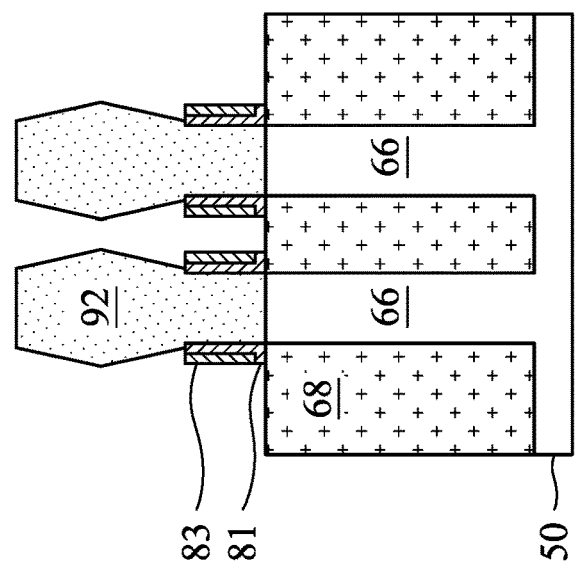

As a result of the epitaxy processes used to form the epitaxial source/drain regions 92, upper surfaces of the epitaxial source/drain regions 92 have facets which expand laterally outward beyond sidewalls of the nanostructures 55. In some embodiments, these facets cause adjacent epitaxial source/drain regions 92 of a same device to merge as illustrated by FIG. 12A. In other embodiments, adjacent epitaxial source/drain regions 92 remain separated after the epitaxy process is completed as illustrated by FIG. 12C. In the embodiments illustrated in FIGS. 12A and 12C, the first spacers 81 may be formed to a top surface of the STI regions 68, thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

FIG. 12D illustrates an embodiment in which sidewalls of the first nanostructures 52 are concave, outer sidewalls of the first inner spacers 90 are concave, and the first inner spacers 90 are recessed from sidewalls of the second nanostructures 54. As illustrated in FIG. 12D, the epitaxial source/drain regions 92 may be formed in contact with the first inner spacers 90 and may extend past sidewalls of the second nanostructures 54.

Figure 13B:
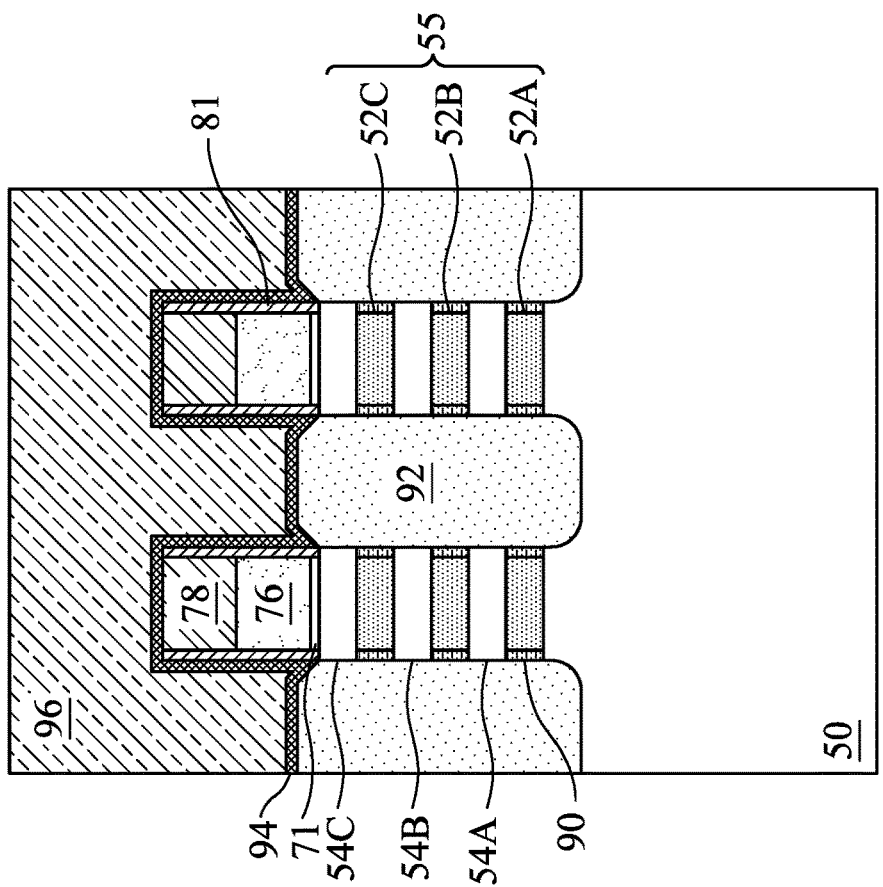
Figure 13A:
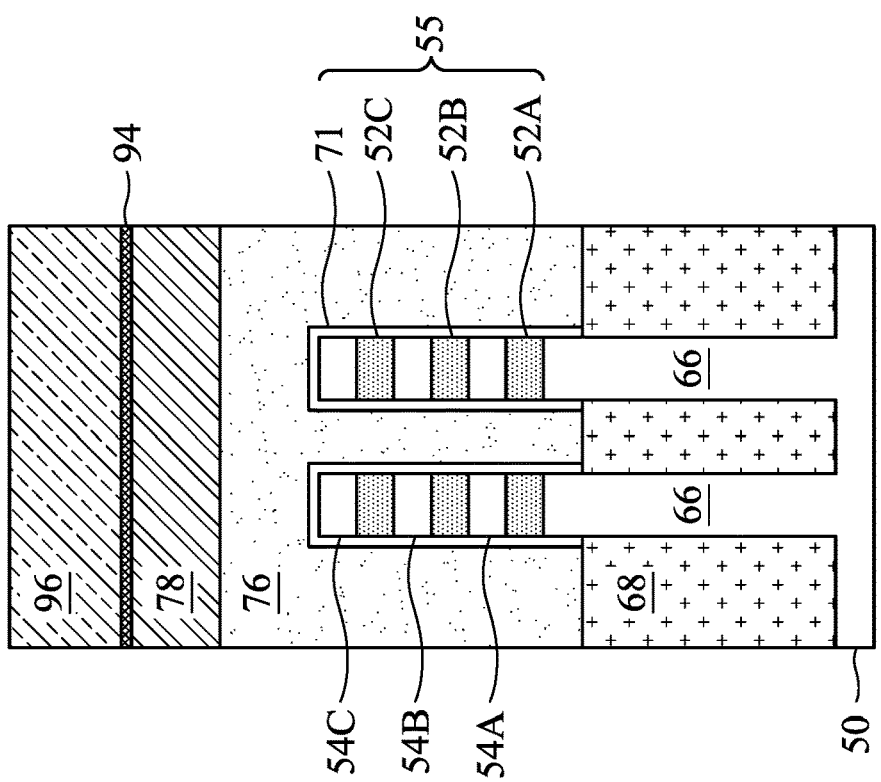
Figure 13C:
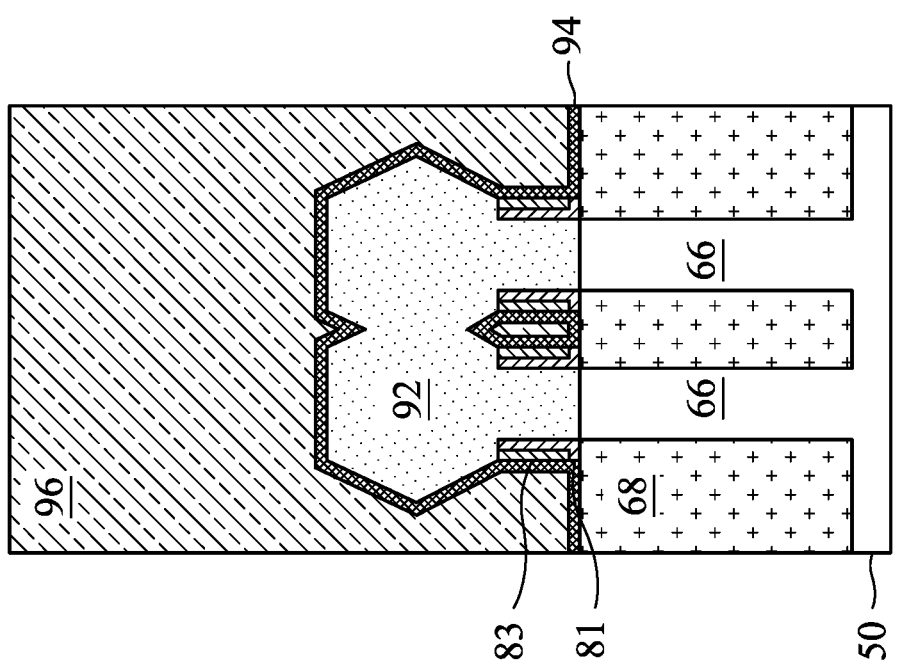

In FIGS. 13A, 13B, and 13C, a first interlayer dielectric (ILD) 96 is deposited over the structure illustrated in FIGS. 6A, 12B, and 12A (the processes of FIGS. 7A-12D do not alter the cross-section illustrated in FIG. 6A), respectively. This process is illustrated as step 235 of the flow diagram of FIG. 34. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as silicon nitride, silicon oxide, silicon oxynitride, or the like, having a different etch rate than the material of the first ILD 96.

Figure 14B:
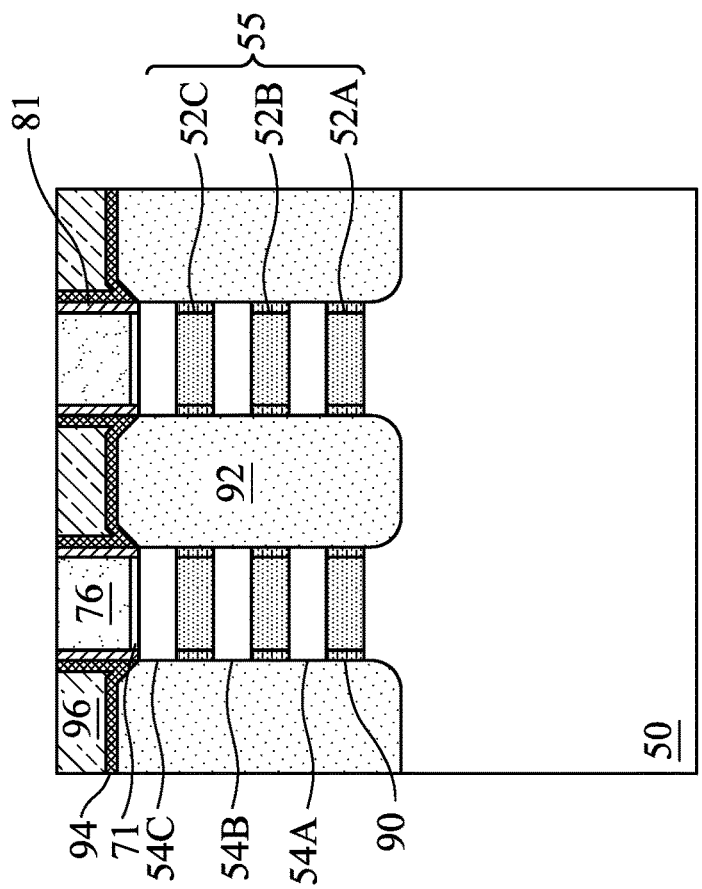
Figure 14A:
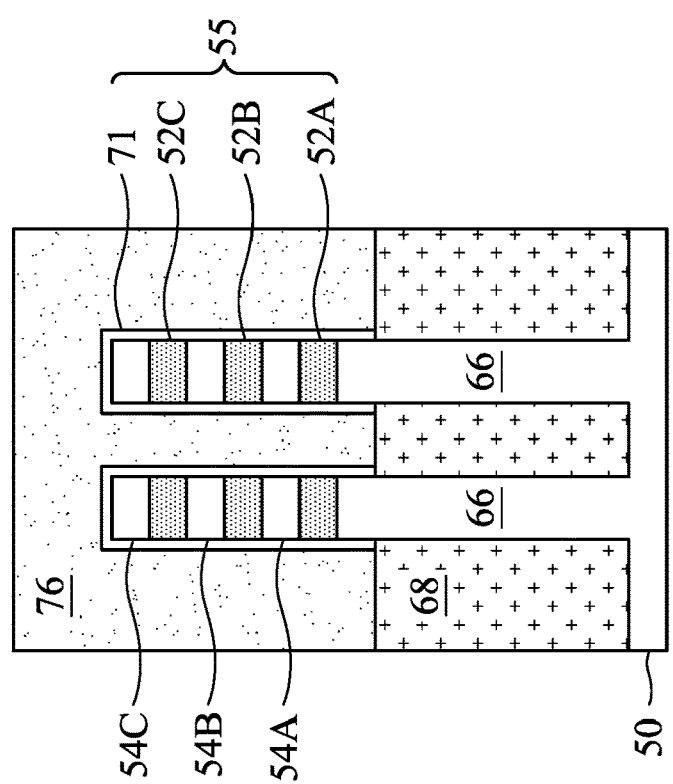

In FIGS. 14A and 14B, a planarization process, such as a CMP, may be performed to level the top surface of the first ILD 96 with the top surfaces of the dummy gates 76 or the masks 78. This process is also illustrated as step 235 of the flow diagram of FIG. 34. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with the top surface of the masks 78 and the first spacers 81.

Figure 15B:
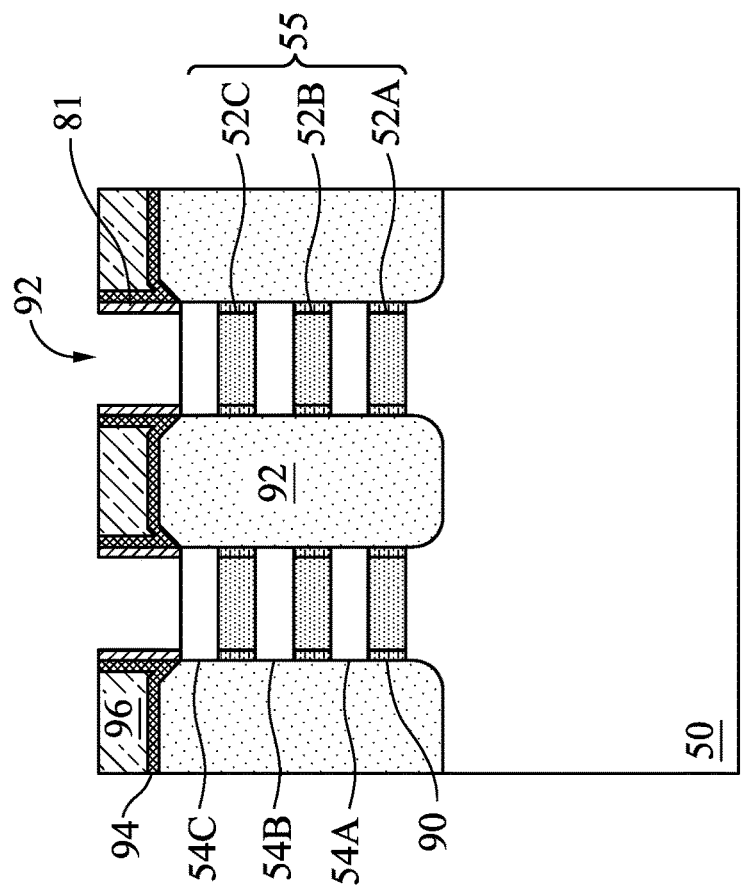
Figure 15A:
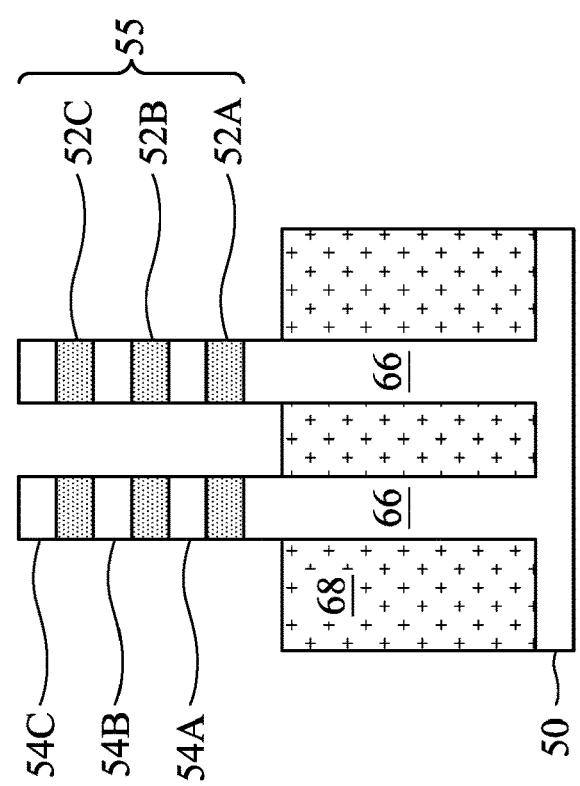

In FIGS. 15A and 15B, the dummy gates 76 and the masks 78 (if present), are removed in one or more etching steps so that second recesses 98 are formed. This process is illustrated as step 240 of the flow diagram of FIG. 34. Portions of the dummy gate dielectrics 71 in the second recesses 98 are also removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55, which act as the channel regions, are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 16A:
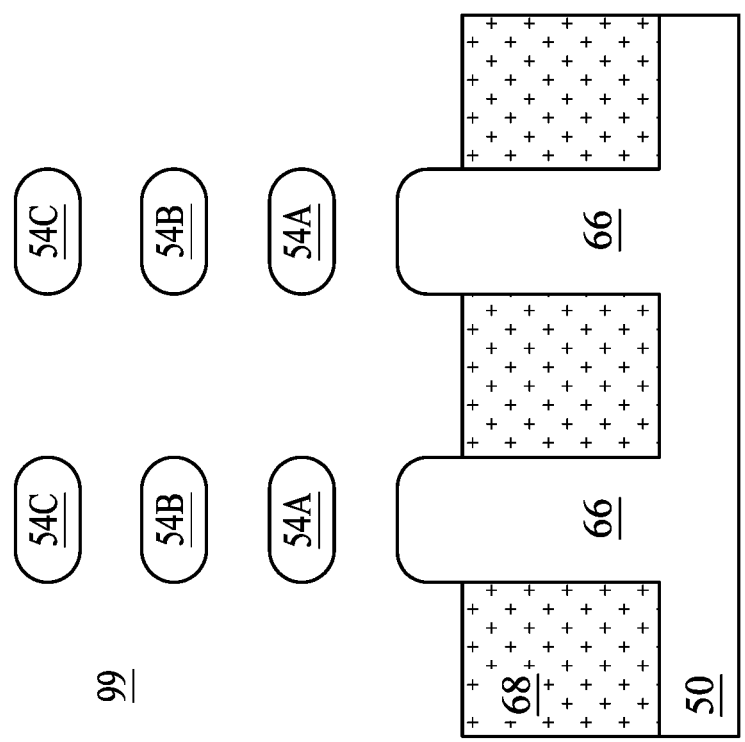
Figure 16B:
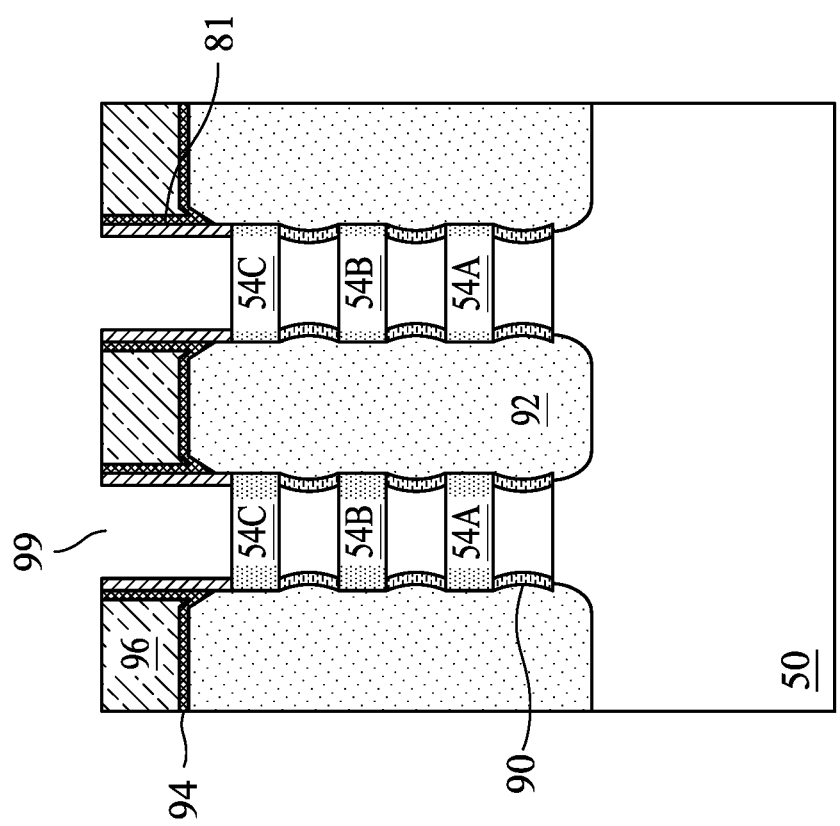

In FIGS. 16A and 16B, the first nanostructures 52 in the first region 50A and the second region 50B are removed, thereby forming openings 99 between the second nanostructures 54 and/or the fins 66. This process is also illustrated as step 240 of the flow diagram of FIG. 34. FIG. 16A is an enlarged version of the structure of FIG. 15A after the first nanostructures 52 have been removed, to show better detail for the forming of replacement gates in the following Figures. The first nanostructures 52 may be removed by an isotropic etching process such as wet etch or the like using etchants which are selective to the materials of the first nanostructures 52, while the second nanostructures 54, the substrate 50, the STI regions 68 remain relatively unetched as compared to the first nanostructures 52. In some embodiments in which the first nanostructures 52 include, e.g., SiGe, and the second nanostructures 54 include, e.g., Si or SiC, tetramethylammonium hydroxide (TMAH), ammonium hydroxide ($NH_4OH$), or the like may be used to remove the first nanostructures 52. In some embodiments in which the first nanostructures 52 include, e.g., Si or SiC, and the second nanostructures 54 include, e.g., SiGe, hydrogen fluoride, another fluorine-based etchant, or the like may be used to remove the first nanostructures 52. The remaining second nanostructures 54 may each be between about 1 nm and 10 nm thick and have a width in FIG. 16A between about 5 nm and 100 nm wide.

In other embodiments, the first nanostructures 52 in the first region 50A and the second region 50B may comprise different materials and may be removed separately, for example, by forming a mask in the first region 50A and performing an isotropic process such as wet etch or the like using etchants which are selective to the materials of the second nanostructures 54, while the first nanostructures 52, the substrate 50, the STI regions 68 remain relatively unetched as compared to the second nanostructures 54. The first nanostructures 52 in the first region 50A may be removed by forming a mask in the second region 50B and performing an isotropic process such as wet etch or the like using etchants which are selective to the materials of the first nanostructures 52, while the second nanostructures 54, the substrate 50, the STI regions 68 remain relatively unetched as compared to the first nanostructures 52. In other embodiments, the second nanostructures 54 may be removed in the first region 50A and/or the second region 50B and the first nanostructures 52 may remain behind to be utilized as channel regions for corresponding transistors. FIGS. 29A, 29B, 29C, and 29D illustrate a structure resulting from such embodiments which illustrate the channel region in the first region 50A and second region 50B as being provided by the first nanostructures 52, for example.

In FIGS. 17A, 17B, and 17C through FIGS. 28A, 28B, 28C, and 28D replacement gates are formed. Various views will be described in their respective contexts. The cross-sections along the A-A' reference line illustrate the first region 50A and the second region 50B and the boundary region between the first region 50A and the second region 50B. The gates in the first region 50A are configured to operate a first threshold voltage and the gates in the second region 50B are configured to operate a second threshold voltage. Because the subsequently formed gate electrode will contact both the channel regions in the first region 50A and in the second region 50B, the same gate electrode signal can be used to switch the gates on in the first region 50A or the second region 50B at a first switching voltage and then increased to a second switching voltage to switch the gates on in both the first region 50A and the second region 50B.

Embodiments below describe and illustrate in the accompanying Figures a process of setting different gate threshold voltages in the first region 50A and the second region 50B using different dipole configurations in the first region 50A and the second region 50B for nano-FET transistors formed in the first region 50A and the second region 50B. In some embodiments, the dipole used in the first region 50A is different than the dipole used in the second region 50B, while in other embodiments, the dipoles are the same, but deposited at different concentrations to result in a doped gate dielectric with different dipole concentrations. The second nanostructures 54 (i.e., 54A, 54B, and 54C) for the channel regions in the first region 50A have been appended with a "–1" and the nanostructures 54 for the channel regions in the second region 50B have been appended with a "–2."

Dipoles used in such embodiments have advantages. A dipole changes the behavior of the gate without necessarily causing an increase in the sizes/thicknesses of the functional gate layers. This is helpful because the vertical spacing between adjacent ones of the second nanostructures may be between about 3 nm and 10 nm. Utilizing a dipole provides zero thickness engineering of the gate function, which in turn leaves space for the gate electrode fill and other layers.

Rather than use two separate masks to form the different dipoles for the first region 50A and the second region 50B, embodiment processes provide the ability to form different dipoles utilizing a single mask. In addition to reducing the number of steps and amount of materials needed, this also provides the benefit of having better boundary control between the two regions, as will be explained in further detail below.

Figure 17A:
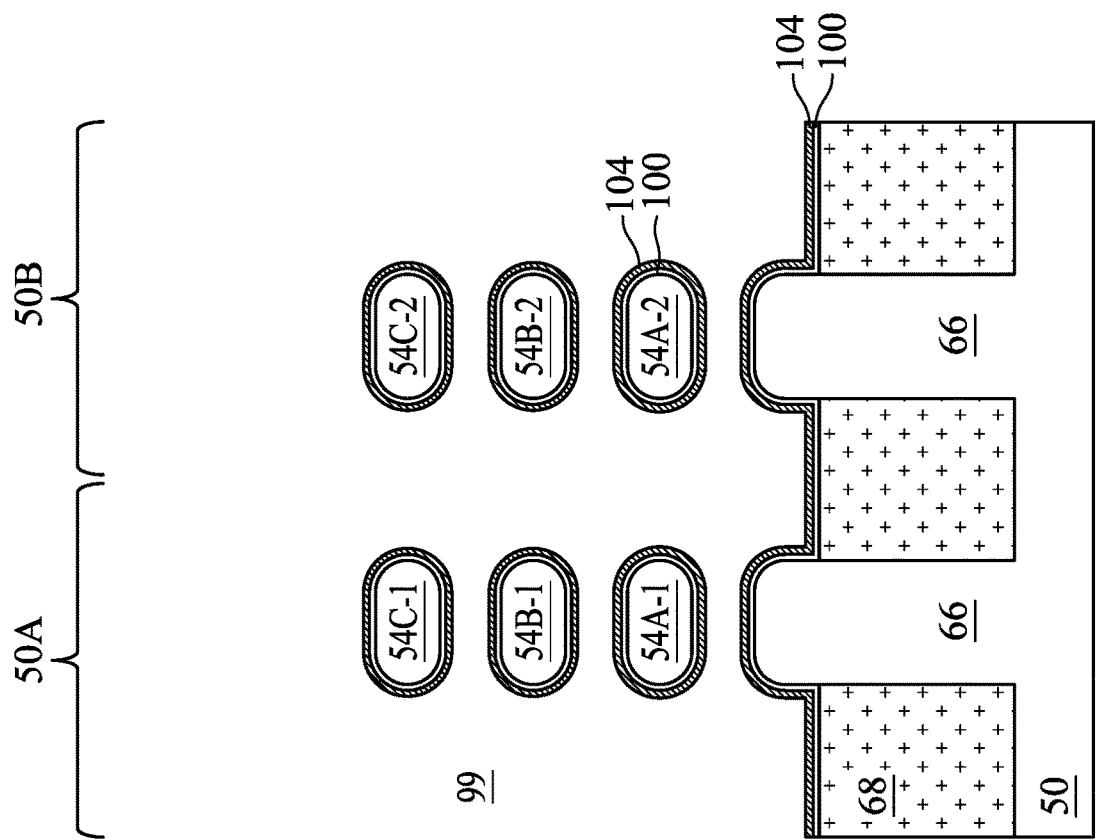
Figure 17C:
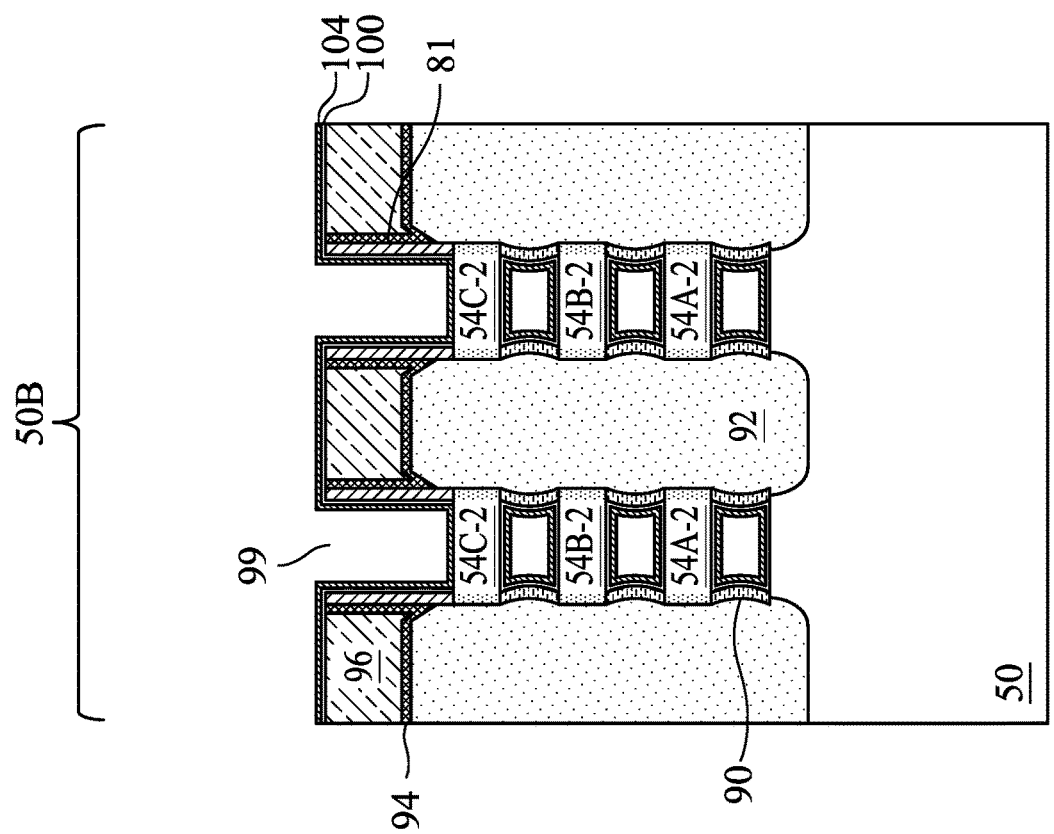
Figure 17B:
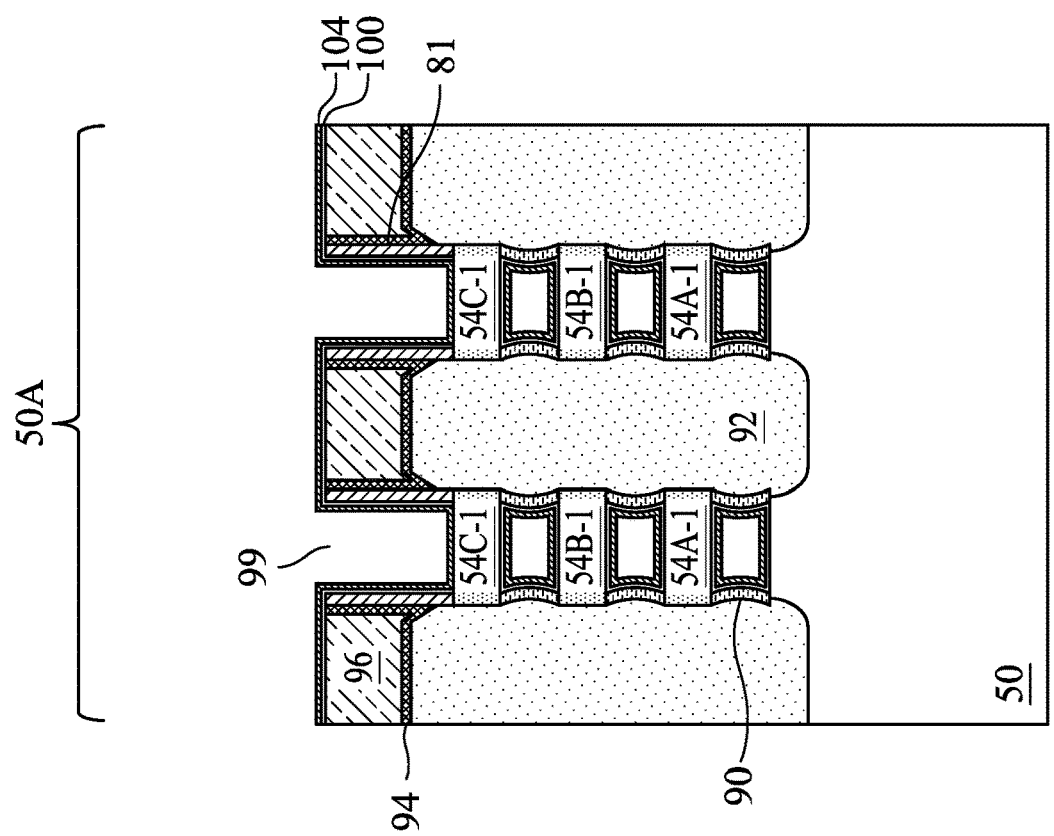

In FIGS. 17A, 17B, and 17C, an interfacial layer 100 may be formed over exposed surfaces of the second nanostructures 54 and the fins 66 in the openings 99, in accordance with some embodiments. This process is illustrated as step 245 of the flow diagram of FIG. 34. In some embodiments, the interfacial layer 100 may include silicon oxide, silicon oxynitride, silicon nitride, germanium oxide, germanium oxynitride, and the like. The interfacial layer 100 is optional and in embodiments utilizing the interfacial layer 100, it may have a thickness of about 5 angstroms to about 30 angstroms. In some embodiments, chemical oxidization using an oxidizing agent such as SPM (a mixture of $H_2SO_4$ and $H_2O_2$), SC1 (a mixture of $NH_4OH$ and $H_2O_2$), or ozone-deionized water (a mixture of $O_3$ and deionized water) is performed to oxidize exterior portions of the second nanostructures 54 and the fins 66. In some embodiments, to form the interfacial layer 100, a thermal oxidization is performed by treating (e.g., soaking) the second nanostructures 54 and the fins 66 in an oxygen-containing gas source, where the oxygen-containing gas source includes, e.g., $N_2O$, $O_2$, a mixture of $N_2O$ and $H_2$, or a mixture of $O_2$ and $H_2$, as examples. The thermal oxidization may be performed at a temperature between about 500° C. and about 1000° C. Note that in the illustrated embodiments, the interfacial layer 100 is formed using a conformal process, such as CVD, ALD, or the like and so is deposited over the second nanostructures 54, the fins 66, the inner spacers 90, along sidewalls of the first spacers 81, and along the upper surface of the first ILD 96. If using an oxidizing process, however, the interfacial layer 100 may be selectively formed from the exterior portions of the second nanostructures 54 and the fins 66, and therefore, would be selectively formed over the exposed surfaces of the second nanostructures 54, and the fins 66, and not over other surfaces, such as the sidewalls of the first inner spacers 90 and the first spacers 81.

Next, a dielectric layer 104 is formed in the second recesses 98 and the openings 99 in the first region 50A and the second region 50B, in accordance with some embodiments. This process is also illustrated as step 245 of the flow diagram of FIG. 34. The dielectric layer 104 may be conformally deposited over the interfacial layer 100 (e.g., wrapping around the second nanostructures 54), including along sidewalls of the first spacers 81, and along the upper surface of the first ILD 96. In an example embodiment, the dielectric layer 104 may be a high-k material, for example, having a dielectric constant higher than 7.0 and may include metal oxide or metal silicate. For example, the dielectric layer 104 may include hafnium oxide, hafnium silicate, hafnium silicon oxynitride, hafnium aluminum oxide, hafnium lanthanum oxide, or the like, or a combination thereof. The dielectric layer 104 may have a thickness of about 5 angstroms to about 30 angstroms. The formation methods of the dielectric layer 104 may include Molecular-Beam Deposition (MBD), ALD, CVD, PECVD, or the like. In some embodiments, the dielectric layer 104 is formed by ALD at a temperature between about 200° C. and about 400° C.

Figure 18A:
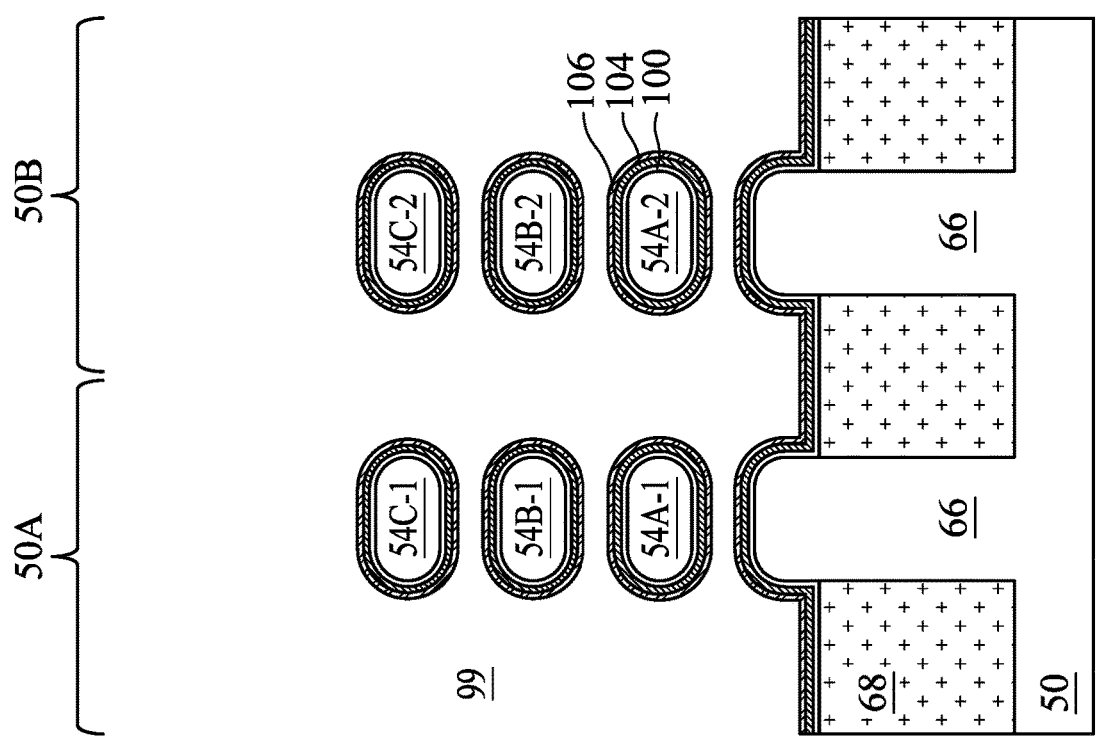
Figure 18C:
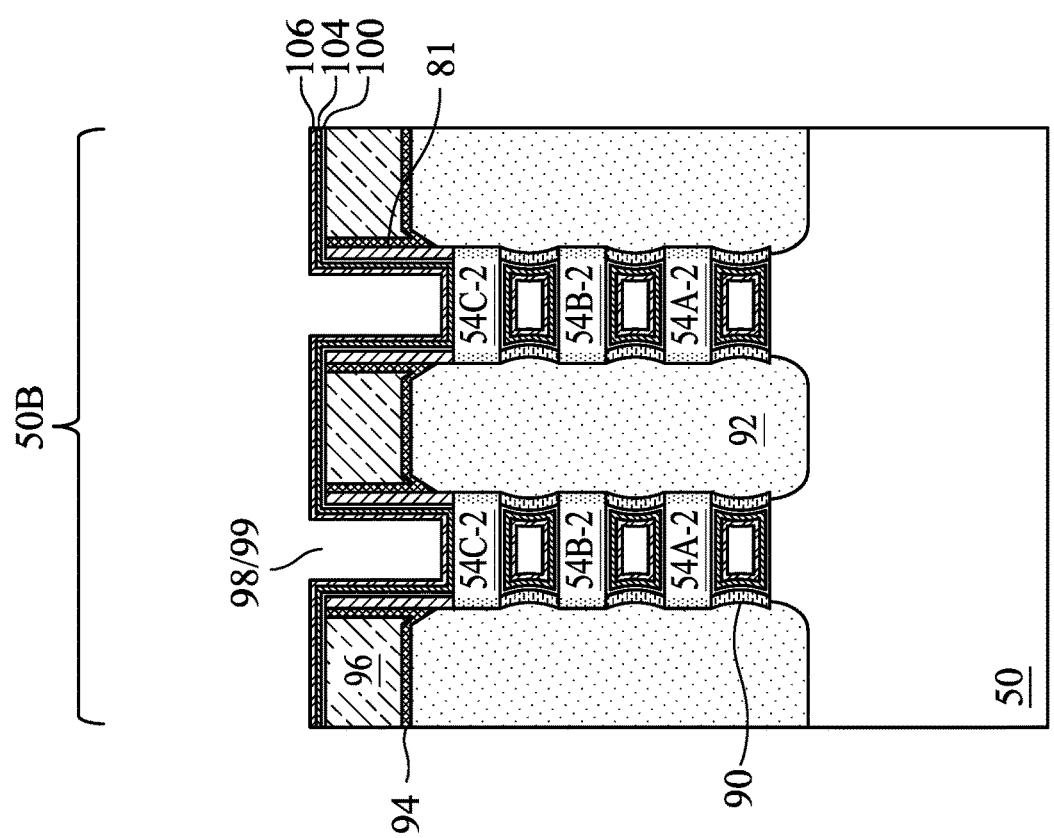
Figure 18B:
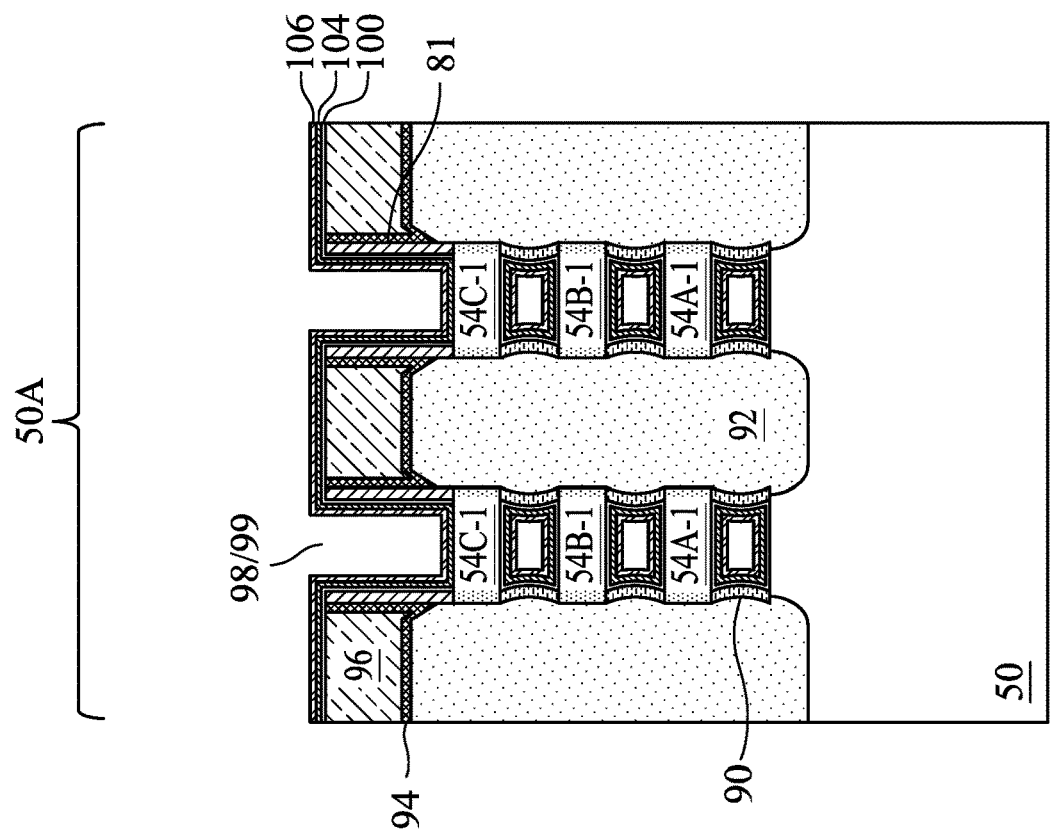

Next, in FIGS. 18A, 18B, and 18C, a first dipole layer 106 is formed over the dielectric layer 104 in both the first region 50A and in the second region 50B. This process is illustrated as step 250 of the flow diagram of FIG. 34. The first dipole layer 106 may be an oxide or a nitride of a first dipole dopant. In some embodiments, the first dipole layer 106 may include an n-type dipole, such as La, Y, Sc, Gd, an element having an electronegativity smaller than Hf, or the like; or a p-type dipole, such as Al, Ti, In, Ga, Zn, an element having an electronegativity larger than Hf, or the like. Accordingly, the first dipole layer 106 may be, for example, lanthanum oxide, lanthanum nitride, yttrium oxide, yttrium nitride, scandium oxide, scandium nitride, gadolinium oxide, gadolinium nitride, aluminum oxide, aluminum nitride, titanium oxide, titanium nitride, indium oxide, indium nitride, gallium oxide, gallium nitride, zinc oxide, zinc nitride, or the like. The first dipole layer 106 may be formed any suitable deposition methods such as ALD or CVD.

In a subsequent step, the first dipole layer 106 will be annealed (anneal process 114, discussed below) to drive in available ions from the first dipole layer 106 into the dielectric layer 104. If the first dipole layer 106 is too thin, then the dielectric layer 104 may not undergo enough modification to achieve the desired voltage threshold level. On the other hand, if the first dipole layer 106 is too thick, it may be difficult to remove the first dipole layer 106 after dipole drive in or removal may cause more incidental damage to surrounding structures than desired. In some embodiments, a thickness of the first dipole layer 106 may be between about 1 angstrom and about 50 angstroms.

Figure 19A:
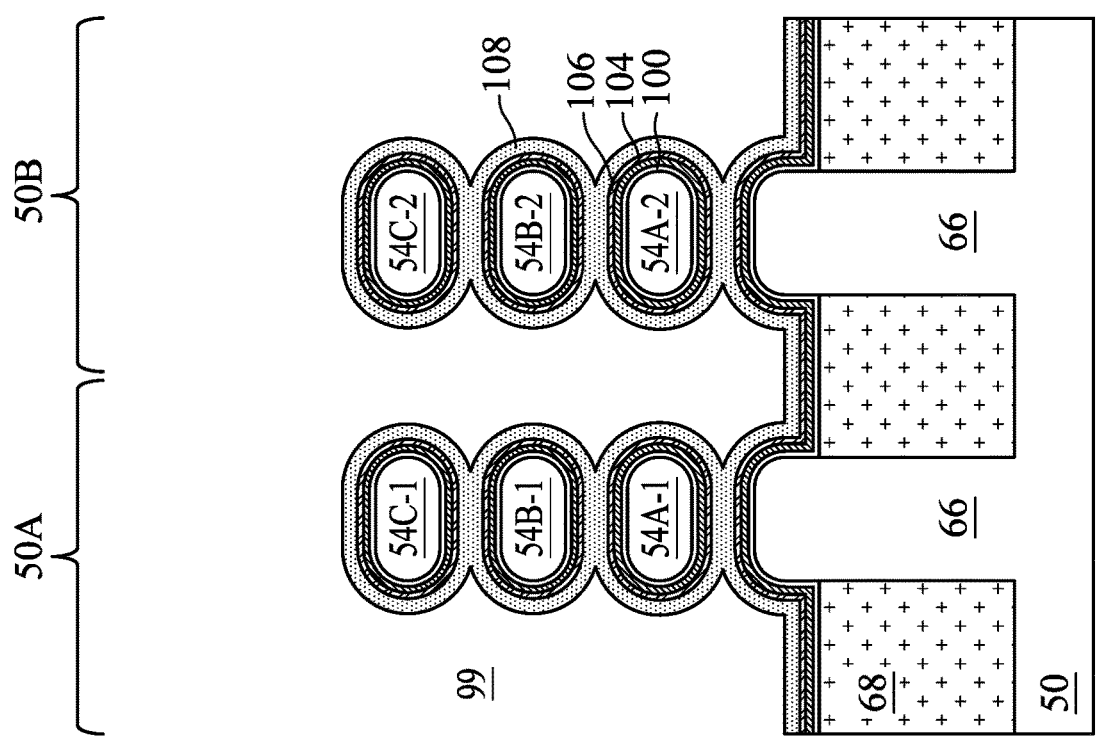
Figure 19B:
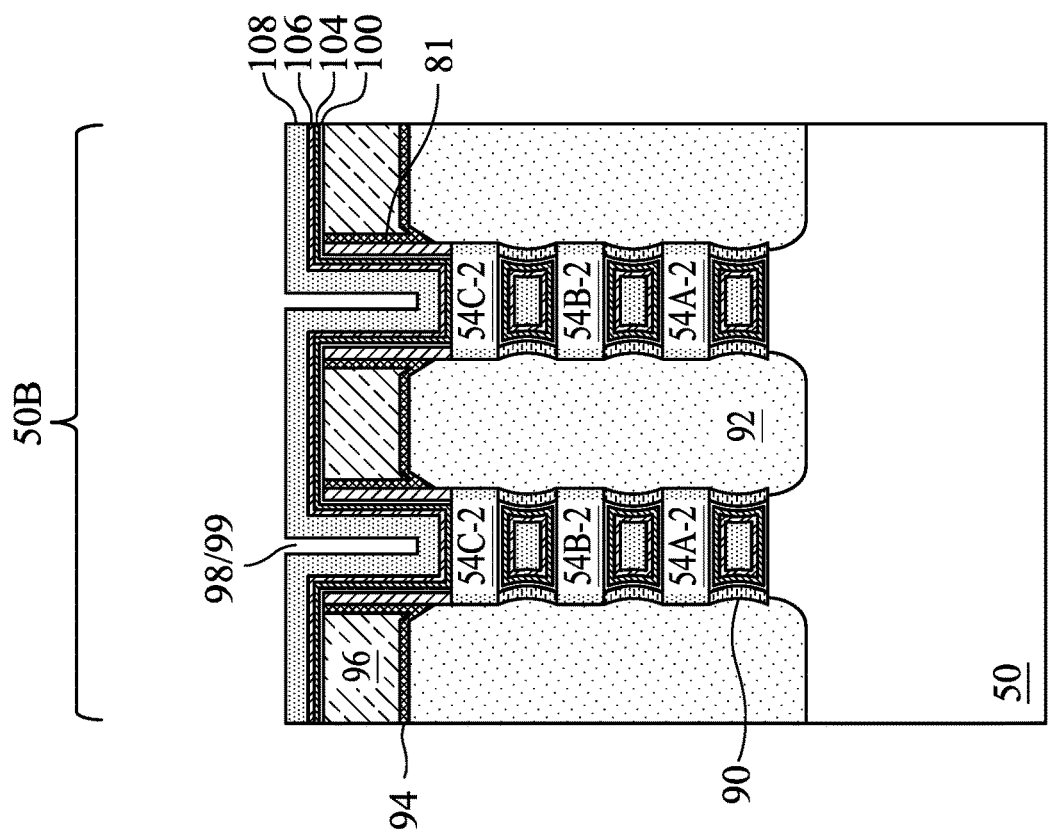
Figure 19C:
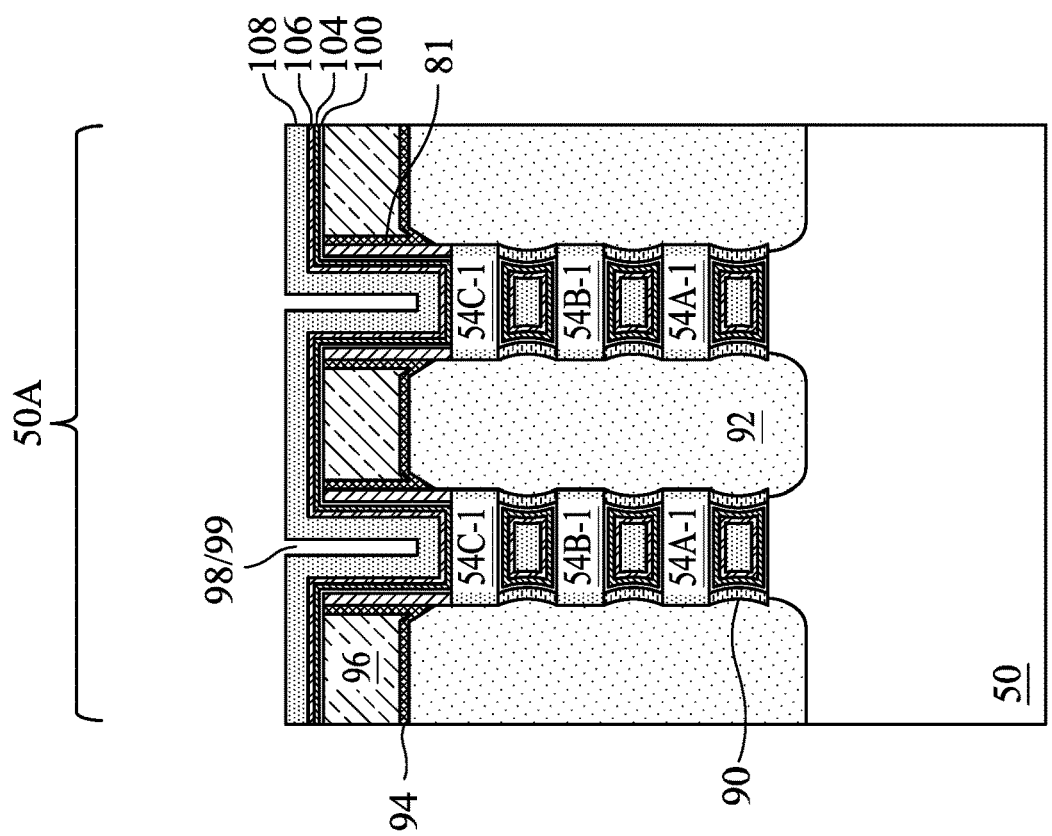

In FIGS. 19A, 19B, and 19C, a hard mask 108 is formed on the first dipole layer 106 in both the first region 50A and in the second region 50B in the recesses 98 and openings 99. This process is illustrated as step 255 of the flow diagram of FIG. 34. The hard mask 108 may be formed to a thickness between about 10 angstroms and about 100 angstroms. The hard mask 108 may be formed using any suitable materials such as aluminum oxide, silicon oxide, silicon oxycarbide, silicon nitride, silicon oxycarbonitride, silicon carbide, titanium nitride, the like, or combinations thereof. The hard mask 108 may be formed by any suitable deposition methods such as ALD, CVD, or spin-on coating. In embodiments where the hard mask 108 is formed using bulk deposition, such as spin-on coating, the entire openings 99 and recesses 98 may be filled, such as illustrated in the call out box in FIG. 19A. In other embodiments, where the hard mask 108 is formed using conformal deposition, the hard mask 108 may merge between the second nanostructures 54 (e.g., between 54A-1 and 54B-1, etc.), while in other embodiments a space may be maintained between the second nanostructures 54.

Figure 20A:
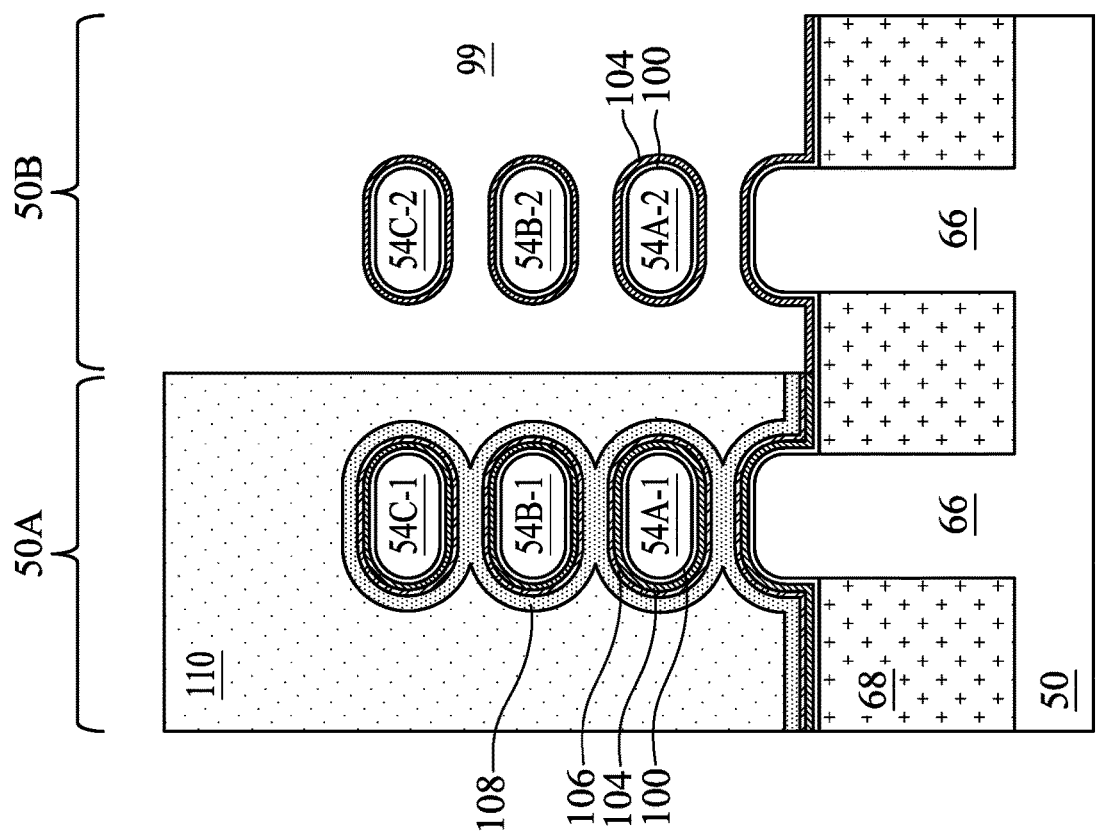
Figure 20C:
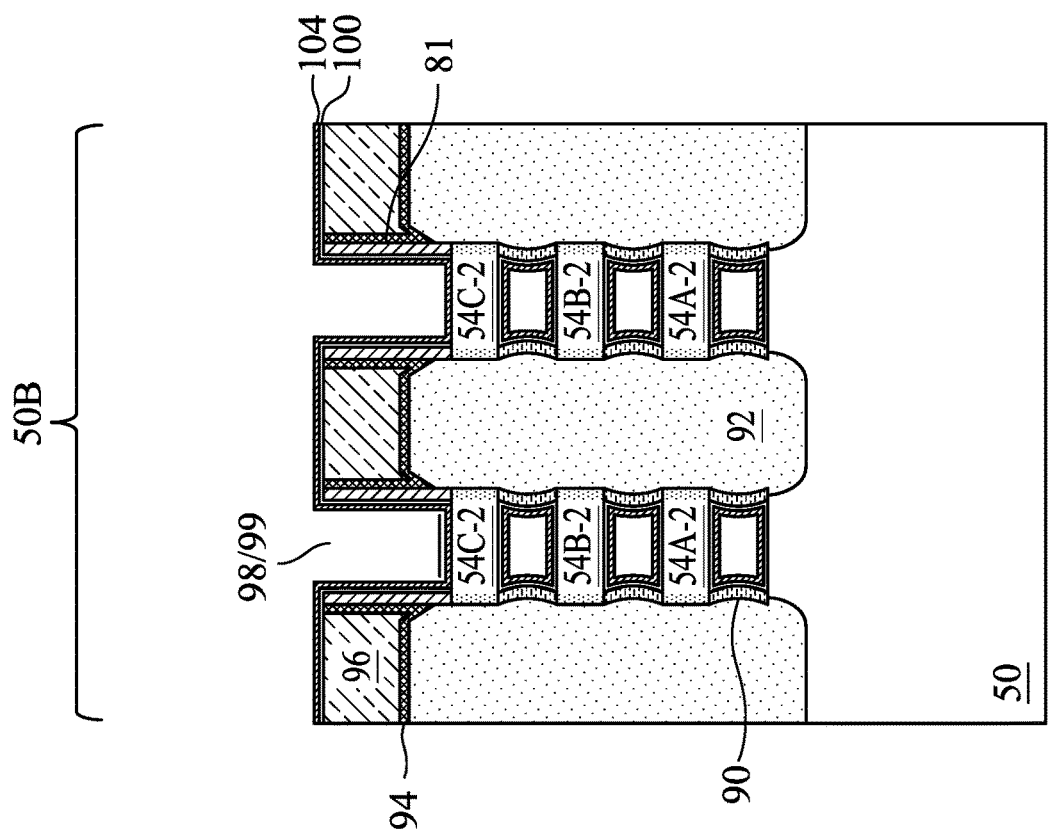
Figure 20B:
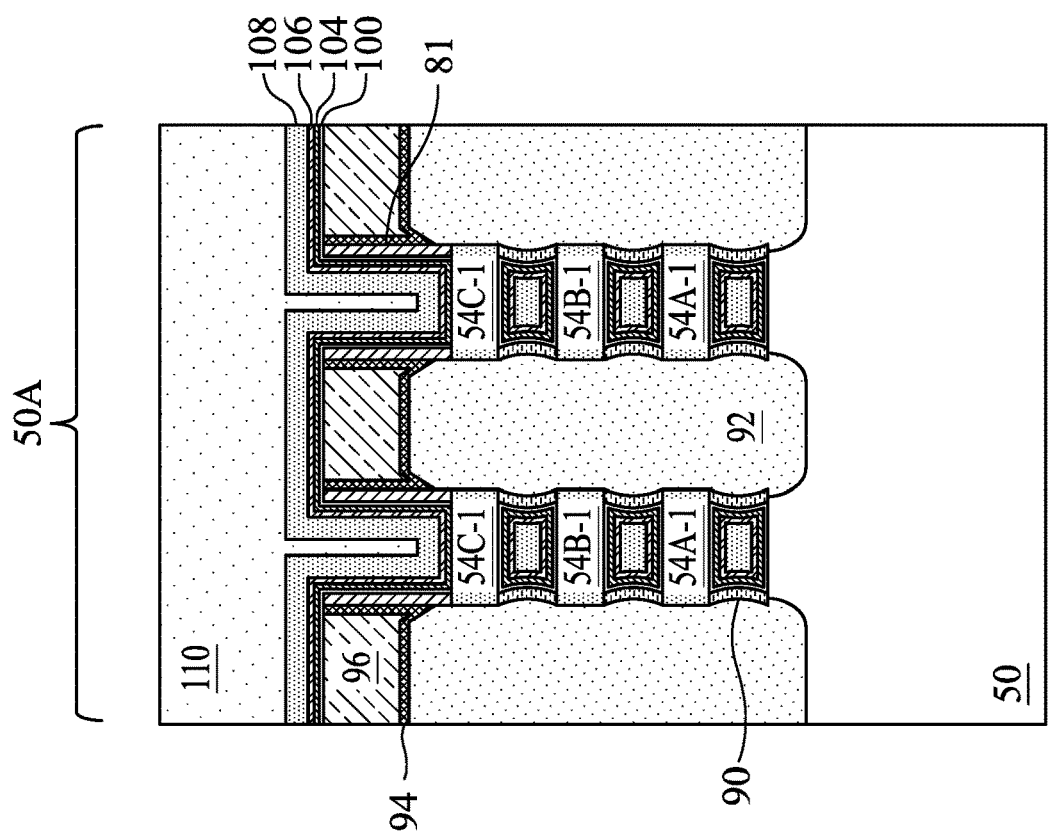

In FIGS. 20A, 20B, and 20C, a photoresist mask 110 may be formed over the first region 50A to protect the hard mask 108 in the first region 50A while the hard mask 108 and first dipole layer 106 are removed in the second region 50B. This process is illustrated as steps 260 to 265 of the flow diagram of FIG. 34. The photoresist mask 110 also defines the boundary region between the first region 50A and the second region 50B. The boundary region will be discussed in greater detail below with respect to FIGS. 25A, 25B, and 25C. The sidewall of the photoresist mask 110 corresponds to the boundary between the first region 50A and the second region 50B. In some embodiments, the photoresist mask 110 may fill the remaining portions of the openings 99 and recesses 98 (if any) and laterally encapsulate the hard mask 108 in the first region 50A. In other embodiments, such as when the hard mask 108 fills the openings 99 and recesses 98, the photoresist mask 110 may be disposed over the hard mask 108. After deposition, the photoresist mask 110 is patterned and developed so that the portion in the first region 50A remains and the portion in the second region 50B is removed. The photoresist mask 110 may be made of any suitable photosensitive masking material and patterned using acceptable techniques. In some embodiments, for example, the photoresist mask 110 may be a bottom antireflective coating, such as a nitrogen free antireflective coating.

Once the second region 50B is exposed from the photoresist mask 110, the hard mask 108 and first dipole layer 106 may be removed from the second region 50B. The first dipole layer 106 is removed from the second region 50B prior to the drive-in anneal process 114, described below. This process is illustrated as step 265 of the flow diagram of FIG. 34. The hard mask 108 and first dipole layer 106 may be removed by any suitable etching technique, such as a wet or dry etch using an etchant selective to the material of the hard mask 108 first and then an etchant selective to the material of the first dipole layer 106. In some embodiments, the etch selectivity of the hard mask 108 may be greater than 50, such as between 50 and 100. In the etching process of the first dipole layer 106, in some embodiments, a portion of the dielectric layer 104 may be removed. For example, about 0% to 25% of the dielectric layer 104 may be removed, such as about 10%. In some embodiments, process condition may have begun to diffuse some of the first dipole from the first dipole layer 106 into the dielectric layer 104, and removing a portion of the dielectric layer 104 may remove surface contamination of the dielectric layer 104 of the first dipole. While the hard mask 108 and first dipole layer 106 are removed from the second region 50B, the photoresist mask 110 protects these layers in the first region 50A from being removed. Thus, the first region 50A maintains the first dipole layer 106 and hard mask 108 while the second region 50B has the dielectric layer 104 exposed. After removing the hard mask 108 and first dipole layer 106 in the second region 50B, the photoresist mask 110 may be removed by a suitable removal technique, such as by ashing, etching, or an oxygen plasma removal process.

Figure 21A:
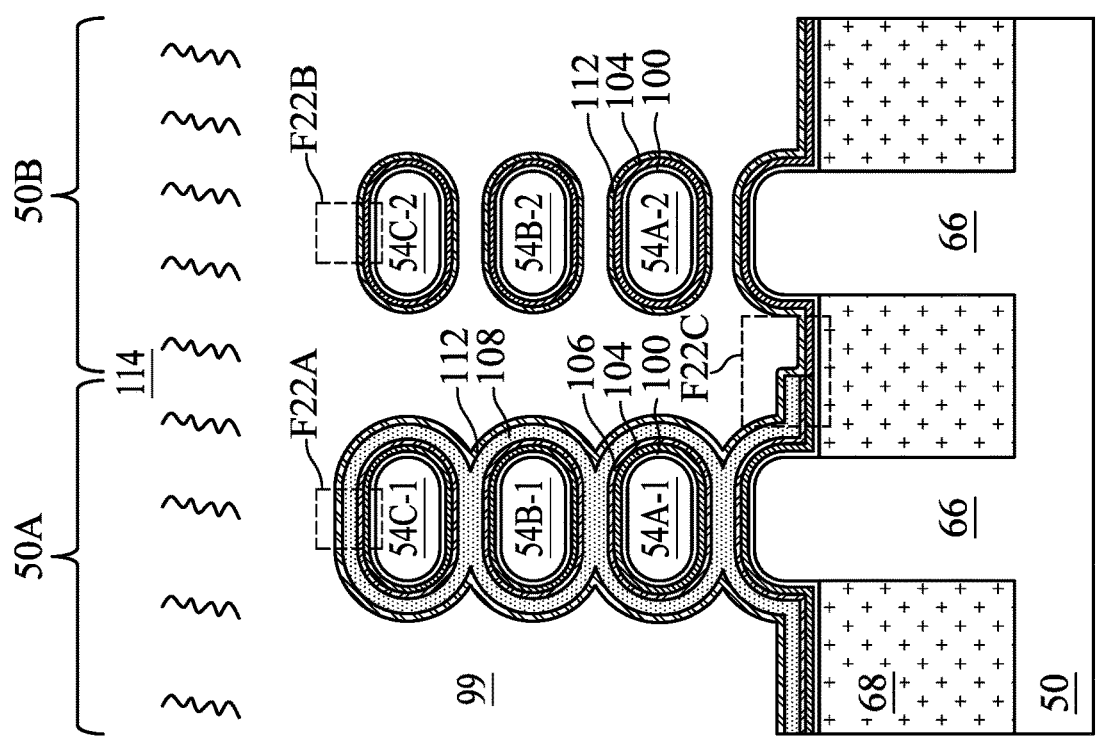
Figure 21C:
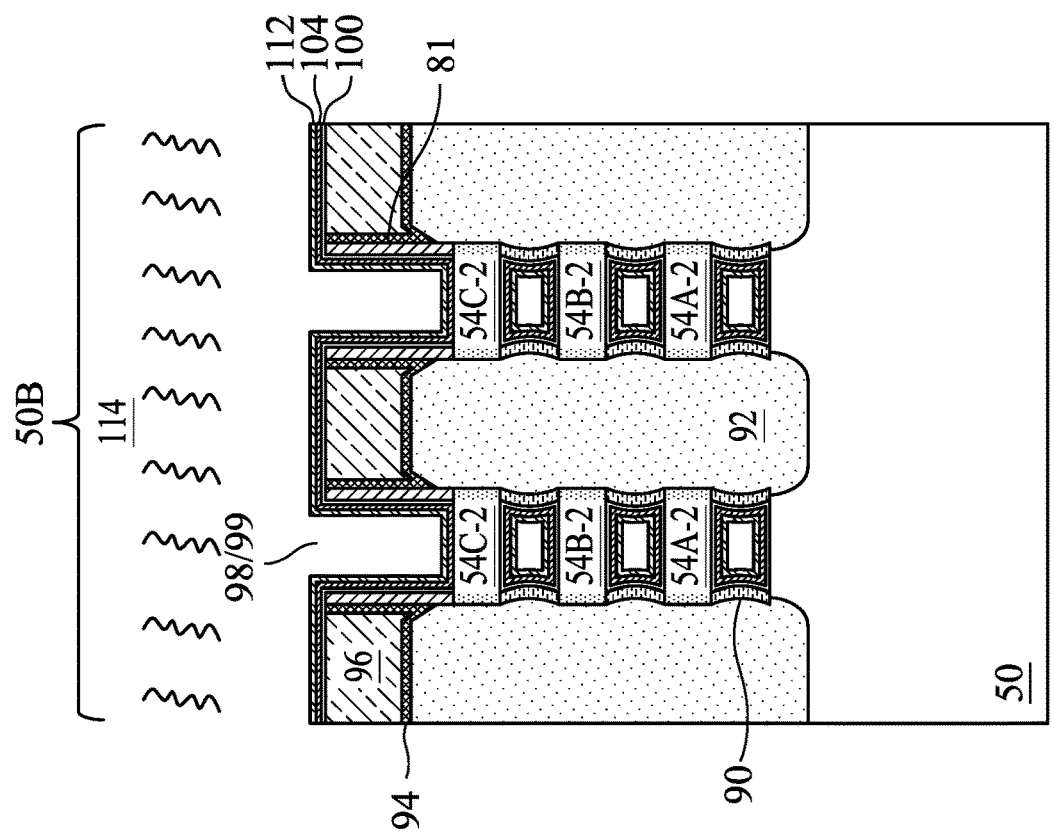
Figure 21B:
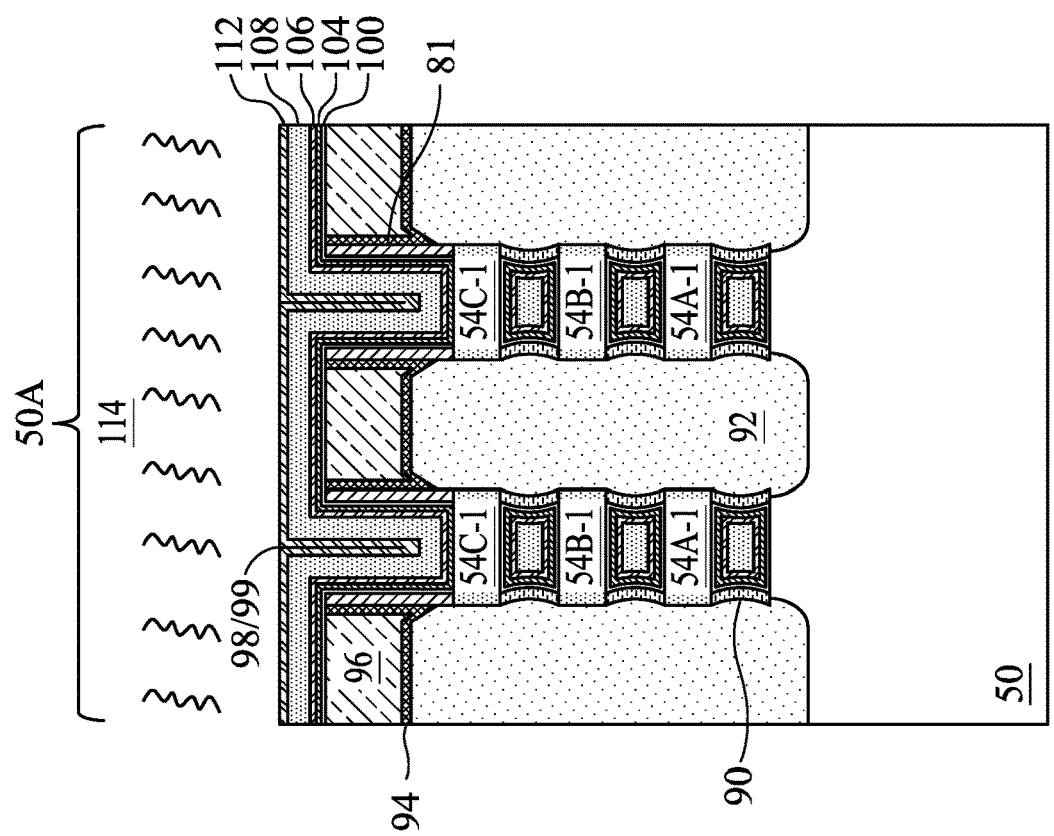

In FIGS. 21A, 21B, and 21C, a second dipole layer 112 is deposited over the remaining structures of FIG. 20A, 20B, and 20C. This process is illustrated as step 270 of the flow diagram of FIG. 34. In the first region 50A, the second dipole layer 112 is deposited directly on the hard mask 108. In the second region 50B, the second dipole layer 112 is deposited directly on the dielectric layer 104. Thus, following the deposition of the second dipole layer 112, the first dipole layer 106 is directly in contact with the dielectric layer 104 in the first region 50A and the second dipole layer 112 is directly in contact with the dielectric layer 104 in the second region 50B. The second dipole layer 112 may be deposited using similar materials and processes as those used to deposit the first dipole layer 106.

In some embodiments, the first dipole layer 106 and the second dipole layer 112 may be made of different materials, but having a same conductivity type, such as both being an n-type dipole or both being a p-type dipole. In some embodiments, the first dipole layer 106 and the second dipole layer 112 may be made of different materials and may have opposite conductivity types, such as one being an n-type dipole and the other being a p-type dipole. In other embodiments, the first dipole layer 106 and the second dipole layer 112 may be made of the same material. The second dipole layer 112 may be deposited to a thickness between about 1 angstrom and about 50 angstroms. The second dipole layer 112 may have the same thickness as the first dipole layer 106 in some embodiments, while in other embodiments they may have different thicknesses. In embodiments where the material of the first dipole layer 106 and the second dipole layer 112 are the same, the dipole layers may have different thicknesses and/or different dipole concentrations so that the final concentration of the first dipole material in the first region 50A and the second dipole material in the second region 50B may be different to achieve different threshold voltages.

Next, in FIGS. 21A, 21B, and 21C, an anneal process 114 is performed to diffuse (or drive in) ions of the first dipole material (referred to as the first dipole dopant) in the first dipole layer 106 into the dielectric layer 104 in the first region 50A. In the same anneal process 114, the anneal process 114 simultaneously diffuses (or drives in) ions of the second dipole material (referred to as the second dipole dopant) in the second dipole layer 112 into the dielectric layer 104 in the second region 50B, thereby forming a doped dielectric layer 116 (see FIGS. 23A and 24A) in the first region 50A and a doped dielectric layer 122 (see FIGS. 23B and 24B) in the second region 50B, in accordance with some embodiments. This process is illustrated as step 275 of the flow diagram of FIG. 34. In some embodiments, the anneal process 114 is a soak anneal. The soak anneal may include applying a fixed temperature of about 400° C. to about 1000° C. for about 0.1 seconds to 300 seconds in a vacuum or in an ambient environment of $N_2$, $NH_3$, $O_2$, $N_2O$, Ar, He, or a combination thereof. In some embodiments, the anneal process 114 may be a spike anneal. The spike anneal may include applying a first pre-heat temperature of about 400° C. to about 700° C. for about 5 seconds to about 120 seconds, an optional second pre-heat temperature about 100° C. to 200° C. higher than the first pre-heat temperature for about 5 seconds to about 120 seconds, and rapidly raising the temperature to a peak temperature of about 1000° C. and sustaining the peak temperature in a short period, such as about 0.1 seconds to about 5 seconds, after which the temperature is rapidly reduced. In some embodiments, the anneal process 114 may be a flash anneal. The flash anneal is similar to the spike anneal. The flash anneal may include a first pre-heat temperature for a temperature and time similar to that in the spike anneal, an optional second pre-heat temperature for a temperature and time similar to that in the spike anneal, and then a millisecond anneal at a temperature between 950° C. and 1100° C. for a duration each between about 2 ms and about 40 ms.

The dipole dopant material doped in a dielectric layer 104 may form dipole moments with the material of the interfacial layer 100, thereby creating differentials in the electrical potential of the overall gate structure, and thus the threshold voltage Vt of the gate structure may be adjusted to be different in the first region 50A versus the second region 50B. The n-type dipole dopant may decrease the threshold voltage Vt of a gate structure (for either an NMOS device or a PMOS device), and the p-type dipole dopant may increase the threshold voltage Vt of a gate structure (for either an NMOS device or a PMOS device). Utilizing different threshold voltages Vt for a single gate electrode provides the opportunity to switch on a first gate channel region when meeting a first threshold voltage $Vt_1$ and switch on a second gate channel region when meeting a second threshold voltage $Vt_2$ for the same signal source.

Utilizing a single drive-in anneal process 114 provides increased efficiency over multiple anneal processes. In addition, the risks of thermal damage to neighboring structures may also be reduced which may arise out of multiple drive-in anneal processes.

FIGS. 22A, 22B, and 22C illustrate enlarged portions of the FIG. 21A as denoted by the dashed boxes F22A, F22B, and F22C of FIG. 21A. FIG. 22A is an enlarged view of the box F22A of FIG. 21A. FIG. 22A illustrates a portion of the second nanostructure 54 (54-1) in the first region 50A, the interfacial layer 100, the dielectric layer 104, the first dipole layer 106, the hard mask 108, and the second dipole layer 112. Due to the anneal process 114, the first dipole dopant in the first dipole layer 106 is diffused into the dielectric layer 104 to convert at least a portion of the dielectric layer 104 to a doped dielectric layer 116. Because the hard mask 108 is interposed, however, between the second dipole layer 112 and the dielectric layer 104, the second dipole dopants in the second dipole layer 112 are blocked from diffusing into the dielectric layer 104. The first dipole dopants, however, are allowed to diffuse into the dielectric layer 104 during the anneal process 114 to form the doped dielectric layer 116 from a portion of the dielectric layer 104. The horizontal dashed lines and arrows indicate the diffusion depth 106dd of the diffused first dipole dopant in the dielectric layer 104. In some embodiments, the hard mask 108 may prevent the second dipole dopant in the second dipole layer 112 from diffusing into the dielectric layer 104 by physical separation, or in other words, the diffusion depth 112dd of the second dipole dopant into the hard mask 108 is less than the thickness of the hard mask 108. In some embodiments, the material of the hard mask 108 may be selected for its blocking properties with respect to the second dipole dopant. For example, if the hard mask 108 is made of titanium nitride, it can effectively block dipole dopant from aluminum oxide and lanthanum oxide from diffusing into the titanium nitride. Similarly, if the hard mask 108 is made of aluminum oxide, it can block dipole dopant from lanthanum oxide from diffusing into the aluminum oxide. These are merely examples and other combinations may be used to similar effect. In such embodiments, the diffusion of the second dipole dopant is minimal into the hard mask 108.

FIG. 22B illustrates a portion of the second nanostructure 54 (54-2) in the second region 50B, the interfacial layer 100, the dielectric layer 104, and the second dipole layer 112. The second dipole dopant from the second dipole layer 112 diffuses into the dielectric layer 104 during the anneal process 114 to form the doped dielectric layer 122 from at least a portion of the dielectric layer 104 in the second region 50B. The diffusion depth 122*dd* of the second dopant is illustrated by the dashed horizontal line and arrows.

In FIGS. 22A and 22B, the doped dielectric layer 116 and doped dielectric layer 122 may be considered those portions of the dielectric layer 104 which, after the treatment 114, have an average atomic concentration of their respective dipole dopants between about 1E12 atoms/cm$^2$ and about 1E15 atoms/cm$^2$. In some embodiments, the doped dielectric layer 116 may have an average atomic concentration of the first dipole dopant greater than an average atomic concentration of the second dipole dopant in the doped dielectric layer 122 and vise versa.

FIG. 22C illustrates the boundary region AB between the first region 50A and the second region 50B. The boundary region AB is an area of the dielectric layer 104 which contains dopants from both the first dipole layer 106 and the second dipole layer 112, i.e., the first dipole dopant and the second dipole dopant. At the boundary between the first region 50A and the second region 50B, when the second dipole dopant from the second dipole layer 112 diffuses into the dielectric layer 104 in the second region 50B, some of the second dipole dopant may also diffuse into a portion of the dielectric layer 104 in the first region 50A due to the proximity of the edge of the second dipole layer 112 to the dielectric layer 104 in the first region 50A. Likewise, when the first dipole dopant from the first dipole layer 106 diffuses into the dielectric layer 104 in the first region 50A, some of the first dipole dopant may also diffuse into a portion of the dielectric layer 104 in the second region 50B due to the proximity of the edge of the first dipole layer 106 to the dielectric layer in the second region 50B. This creates a boundary region AB as part of the dielectric layer 104 which contains both the first dipole dopant and the second dipole dopant. In other words, the boundary region AB is an overlapping region in which both the first dipole dopant and the second dipole dopant are present. If the dipole dopants in the first region 50A and in the second region 50B are the same material, but in different concentrations, then the boundary region AB is an overlapping region which has a dipole dopant concentration peak. Because the process only uses one mask to determine the coverage of the first dipole layer 106 in relation to the second dipole layer 112, the width $W_{AB}$ is minimized as compared to a process using two different masks. For example, if two masks are used, the boundary region AB may be much greater due to pattern mismatch of the two masks. And because the boundary region AB is minimized, the associated gate channel regions may be placed closer together. In some embodiments, the width $W_{AB}$ may be between 1 angstrom and 10 angstroms.

In FIG. 22C, the boundary region AB is disposed over a portion of the STI region 68. As such, the portion of the STI region 68 in the first region 50A is labeled 68-1 and the STI region 68 in the second region 50B is labeled 68-2, although the anneal process 114 does not appreciably alter the STI region 68-1 to be different from the STI region 68-2. The boundary region AB may be located closer to the second nanostructures 54-1 in the first region 50A or closer to the second nanostructures 54-2 in the second region 50B, or may be located approximately medially between the second nanostructures 54-1 in the first region 50A and the second nanostructures 54-2 in the second region 50B.

Figure 23A:
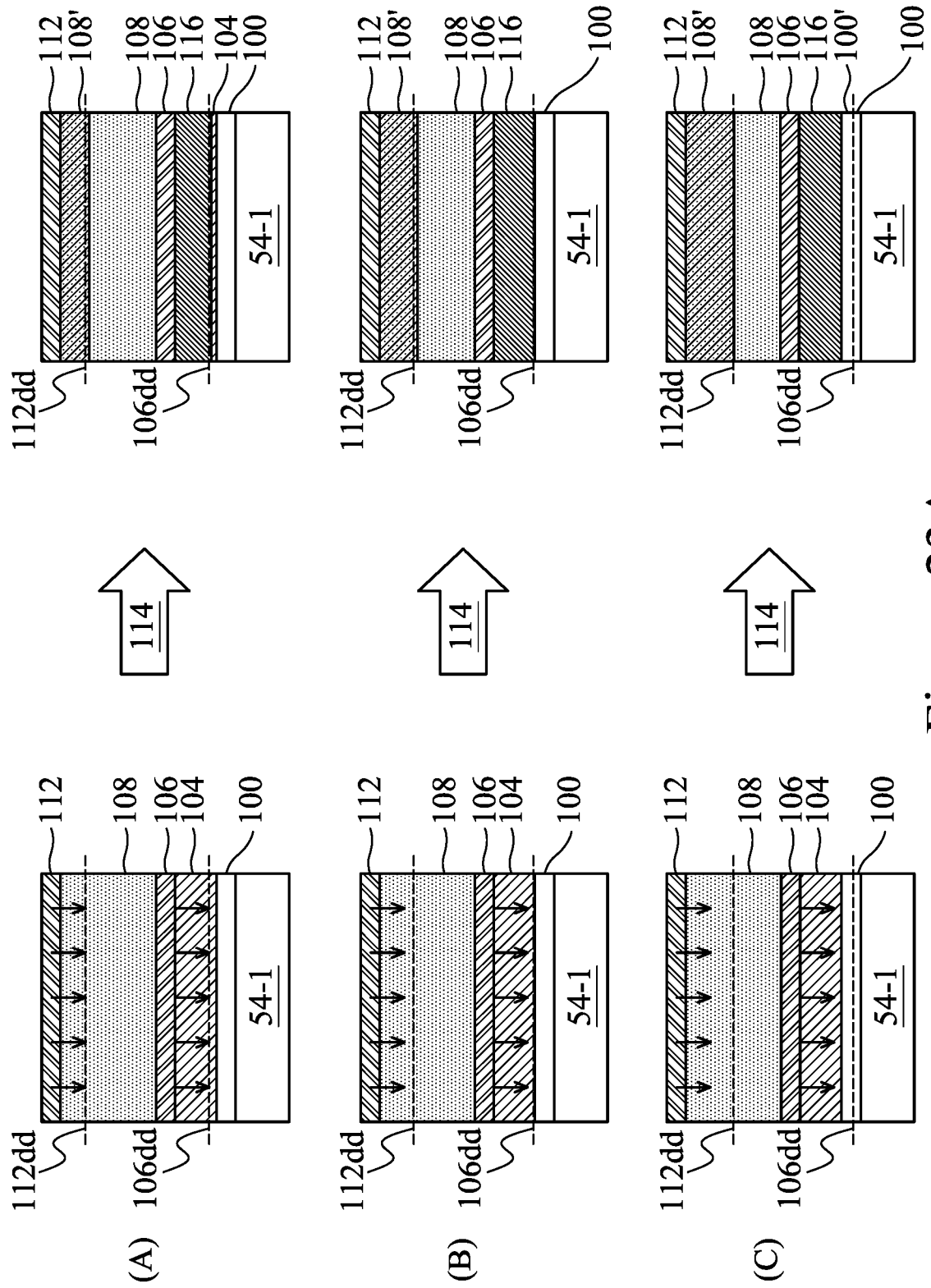
Figure 23B:
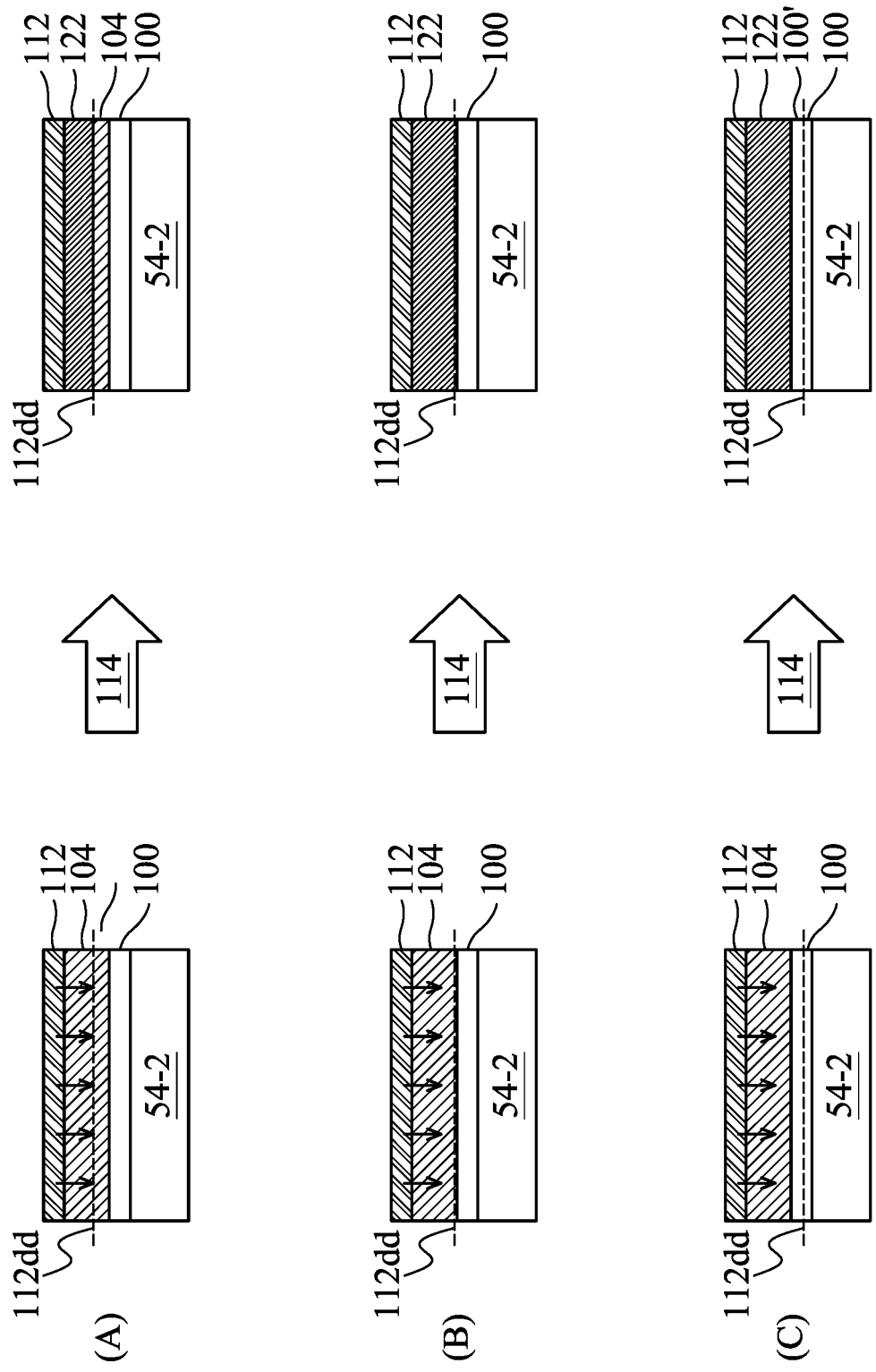

FIGS. 23A and 23B illustrate various configurations for the dipole dopant drive in for the first dipole layer 106 and the second dipole layer 112, in accordance with some embodiments. FIG. 23A provides additional details for the FIG. 22A for the first region 50A as illustrated in FIG. 22A and FIG. 23B provides additional details for the second region 50B as illustrated in FIG. 22B. The anneal process 114 may provide different drive-in depths 106*dd* and 112*dd* in the first region 50A and second region 50B depending on the process conditions of the anneal process 114, duration of the anneal process 114, concentration of the first dipole dopant in the first dipole layer 106, concentration of the second dipole dopant in the second dipole layer 112, thickness of the first dipole layer 106, and thickness of the second dipole layer 112. For example, longer anneal process 114, higher concentrations, and thicker dopant layers will result in more diffusion of the respective dipole dopants into the dielectric layer 104. FIGS. 23A and 23B illustrate the different drive-in depths which may be realized. Due to the differences in the first dipole layer 106 and the second dipole layer 112, the drive-in depth 106*dd* in the first region 50A may not correspond to the drive-in depth 112*dd* in the second region 50B. For example, the drive-in depth 106*dd* may correspond to FIG. 23A row (A) while the drive-in depth 112*dd* may correspond to FIG. 23B row (C). Any combination of these options may be obtainable.

In FIG. 23A row (A), the dipole depth 106*dd* is illustrated as being disposed partway through the dielectric layer 104, thereby forming a doped dielectric layer 116 and an undoped dielectric layer 104. The result illustrated in row (A) may be achieved, for example, by an anneal temperature which is on the lower end of the acceptable range of anneal temperatures, such as between about 300° C. and 500° C. In FIG. 23A row (B), the dipole depth 106*dd* corresponds to the same thickness of the dielectric layer 104, thereby forming a doped dielectric layer 116 from the entirety of the dielectric layer 104. The result illustrated in row (B) may be achieved, for example, by an anneal temperature which is in the middle of the acceptable range of anneal temperatures, such as between about 500° C. and 700 or 750° C. In FIG. 23A row (C), the dipole depth 106*dd* is illustrated as being disposed partway through the interfacial layer 100, thereby forming a doped dielectric layer 116, a doped interfacial layer 100', and an undoped interfacial layer 100. The result illustrated in row (C) may be achieved, for example, by an anneal temperature which is on the higher end of the acceptable range of anneal temperatures, such as between about 750° C. or 800° C. and 1000° C. In each of the rows (A), (B), and (C), the second dipole layer 112 can affect the hard mask 108 to form a doped hard mask 108' and an undoped hard mask 108, the doped hard mask 108' corresponding to the respective drive-in depths 112*dd* in the first region 50A (which may be a different drive in depth than the drive-in depth 112*dd* in the second region 50B because the material is different—hard mask 108 versus dielectric layer 104).

In FIG. 23B row (A), the dipole depth 112*dd* is illustrated as being disposed partway through the dielectric layer 104, thereby forming a doped dielectric layer 122 and an undoped dielectric layer 104. In FIG. 23B row (B), the dipole depth 112*dd* corresponds to the same thickness of the dielectric layer 104, thereby forming a doped dielectric layer 122 from the entirety of the dielectric layer 104. In FIG. 23B row (C), the dipole depth 112*dd* is illustrated as being disposed partway through the interfacial layer 100, thereby forming a doped dielectric layer 122, a doped interfacial layer 100', and an undoped interfacial layer 100.

Although the dipole depth 106*dd* in FIG. 23A appears to be the same depth as the corresponding dipole depth 112*dd* in FIG. 23B, it should be understood that the dipole depths may be different in each of the first region 50A and the second region 50B.

Figure 24A:
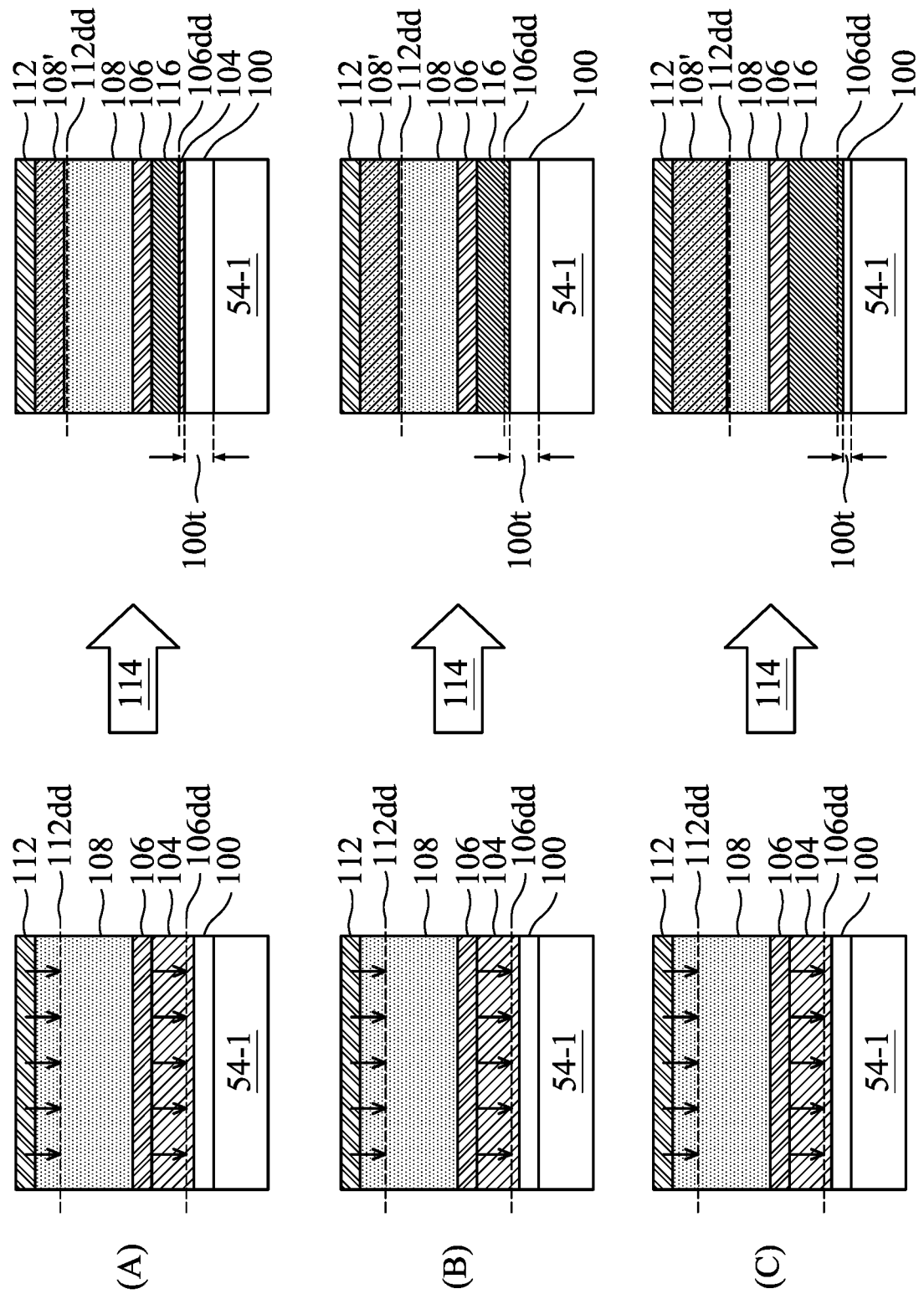
Figure 24B:
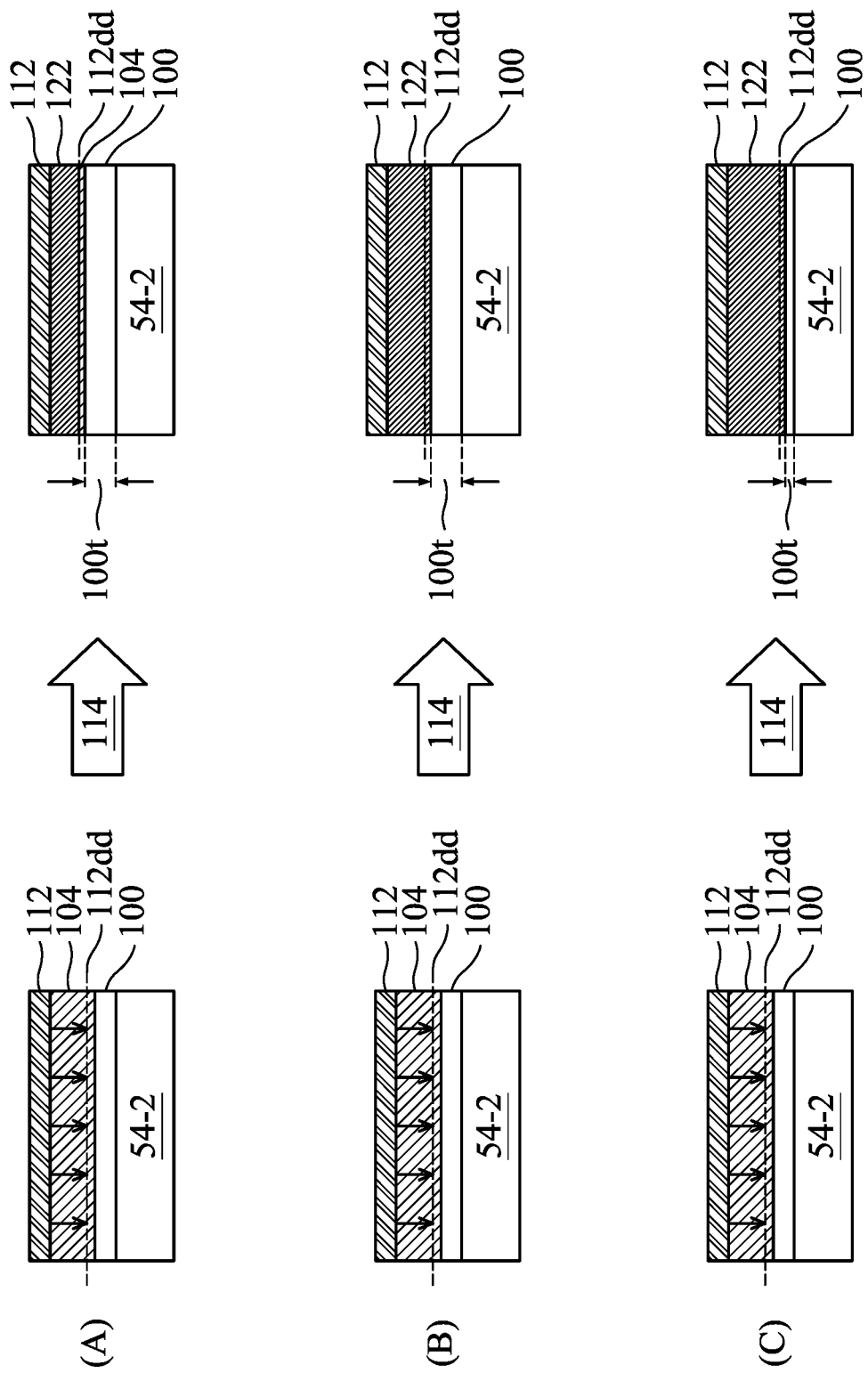

FIGS. 24A and 24B illustrate various configurations for the interfacial layer 100 (if used). A result of the anneal process 114 may be to alter the interfacial layer 100. As noted above, when used, the interfacial layer 100 may be a low-k dielectric material layer. In some embodiments, the heat from the anneal process 114 may cause the interfacial layer 100 to expand and become thicker. In some embodiments, oxygen in the interfacial layer 100 may be captured by metal ions of the dipole layer. For example, if the dipole layer contains free titanium, then the titanium may capture oxygen from the interfacial layer 100 and become titanium oxide in the dielectric layer 104 (turned doped dielectric layer 116 or 122) or in the first dipole layer 106 or second dipole layer 112. In some embodiments too, the thickness of the interfacial layer 100 may remain relatively unchanged, either due to non-significant thermal expansion and non-significant oxygen capture or due to a balancing of both thermal expansion and oxygen capture which results in substantially unchanged thickness of the interfacial layer 100.

FIG. 24A provides additional details for the FIG. 22A for the first region 50A as illustrated in FIG. 22A and FIG. 24B provides additional details for the second region 50B as illustrated in FIG. 22B. The anneal process 114 may provide different dipole depths 106dd and 112dd in the first region 50A and second region 50B, such as discussed above. For the purposes of FIGS. 24A and 24B, the dipole depths 106dd and 112dd are illustrated as being the same in each of the rows (A), (B), and (C), however, it should be understood that any of the drive-in dopant depths discussed above with respect to FIGS. 23A and 23B may be used. Due to the differences in the first dipole layer 106 and the second dipole layer 112, the dipole depth 106dd in the first region 50A may not correspond to the dipole depth 112dd in the second region 50B.

In FIG. 24A, in row (A), due to the anneal process 114, the interfacial layer 100 is increased in thickness. The thickness may be increased by about 0% to about 50% of the thickness of the interfacial layer 100 as deposited. In some embodiments, the thickness 100t of the interfacial layer 100 after the anneal process 114 may be between about 5 angstroms and about 45 angstroms due to thermal expansion. In row (B), the thickness 100t of the interfacial layer 100 may be substantially the same following the anneal process 114 as it was before the anneal process 114. In row (C), the thickness 100t of the interfacial layer 100 may be reduced by between 5% and 50% and may be between about 2.5 angstroms and about 15 angstroms due to oxygen recapture. In embodiments where the oxygen is recaptured into the dielectric layer 104, the thickness of the dielectric layer 104 may be increased, causing a thicker doped dielectric layer 116.

In FIG. 24B, the dipole depth 112dd is illustrated as being disposed partway through the dielectric layer 104, thereby forming a doped dielectric layer 122 following the anneal process 114 (represented by the large right arrows). In row (A), due to the anneal process 114, the interfacial layer 100 is increased in thickness. The thickness may be increased by about 5% to about 50% of the thickness of the interfacial layer 100 as deposited. In some embodiments, the thickness 100t of the interfacial layer 100 following the anneal process 114 may be between about 5 angstroms and about 45 angstroms due to thermal expansion. In row (B), the thickness 100t of the interfacial layer 100 may be substantially the same following the anneal process 114 as it was before the anneal. In row (C), the thickness 100t of the interfacial layer 100 may be reduced by between 5% and 50% and may be between about 2.5 angstroms and about 15 angstroms due to oxygen recapture. In embodiments where the oxygen is recaptured into the dielectric layer 104, the thickness of the dielectric layer 104 may be increased, causing a thicker doped dielectric layer 122.

Figure 25A:
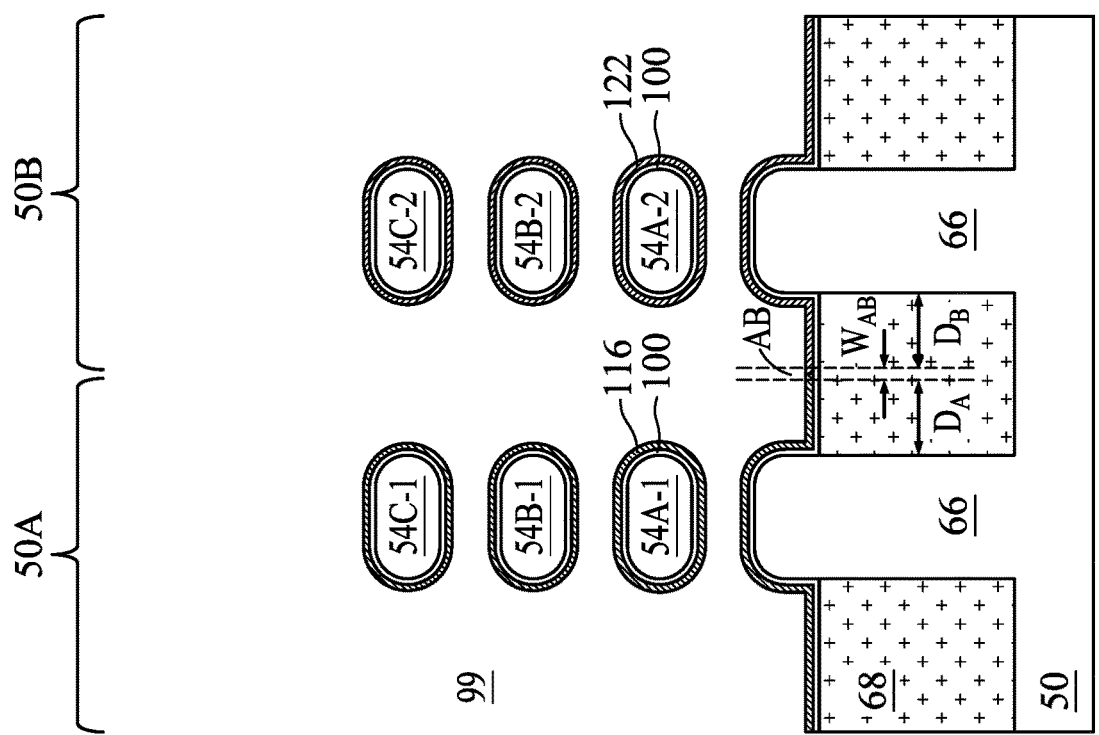
Figure 25C:
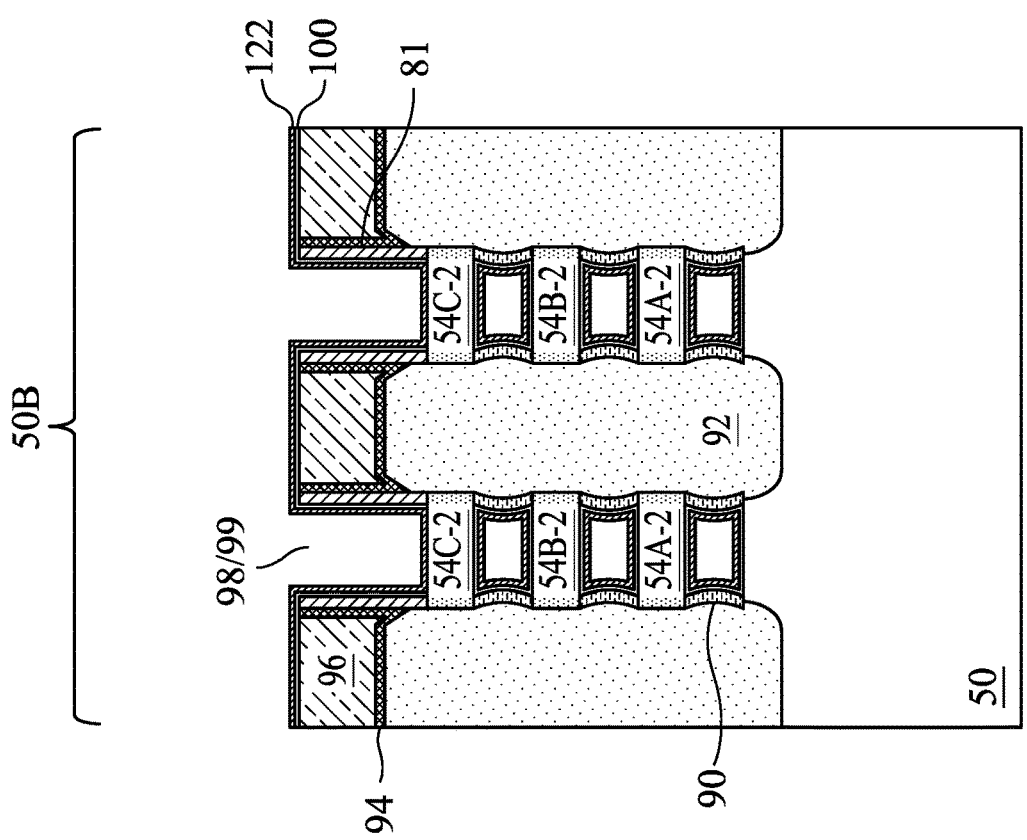
Figure 25B:
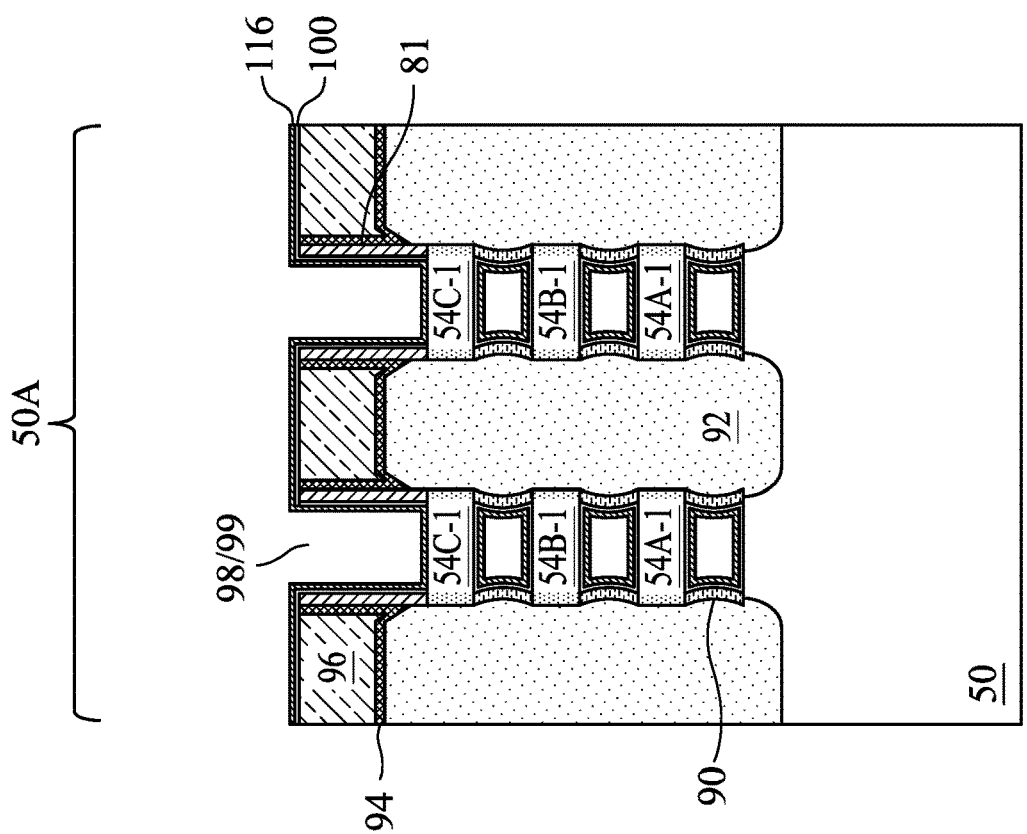

In FIGS. 25A, 25B, 25C, after the anneal process 114 is performed, the hard mask 108 in the first region 50A is removed. This process is illustrated as step 280 of the flow diagram of FIG. 34. In some embodiments, the first dipole layer 106 and second dipole layer 112 may also be removed. The hard mask 108, first dipole layer 106, and second dipole layer 112 may be removed by a suitable etching method, for example, by a wet etch process that etches the hard mask 108 in the first region 50A at a faster rate than the second dipole layer 112 and/or doped dielectric layer 122 in the second region 50B, etches the first dipole layer 106 in the first region 50A at a faster rate than the second dipole layer 112 and/or doped dielectric layer 122 in the second region 50B, and etches the second dipole layer 112 in the second region 50B at a faster rate than the first dipole layer 106 and/or doped dielectric layer 116 in the first region 50A.

In some embodiments, the dipole dopants are diffused into the dielectric layer 104 to form the doped dielectric layer 116 and doped dielectric layer 122 utilizing a zero thickness approach—that is, without altering an overall thickness of the interfacial layer 100 and dielectric layer 104. Accordingly, by providing variable voltage threshold tuning in a multi-threshold device without altering the thicknesses of the dielectric layers, the channel regions and device regions may be formed to be closer to each other, thereby providing a reduced size and increase yield.

The lateral distance $D_A$ between the boundary region AB and the channel regions (second nanostructures 54-1 (54A-1, 54B-1, 54C-1)) in the first region 50A may be between about 5 nm and 100 nm, such as between 5 nm and 50 nm, or between 5 nm and 25 nm. The lateral distance $D_B$ between the boundary region AB and the channel regions (second nanostructures 54-2 (54A-2, 54B-2, 54C-2)) in the second region 50B may be the same as the lateral distance $D_A$ in some embodiments. In some embodiments, the ratio of the lateral distance $D_A$ to the lateral distance $D_B$ may be between about 10:1 and about 1:10. As noted above, the width $W_{AB}$ of the boundary region may be between about 1 nm and 10 nm. A ratio of the width $W_{AB}$ to the distance $D_A$ or the distance $D_B$ may be between about 1:5 and about 1:50. Because the width $W_{AB}$ is minimized, the overall distance ($D_A+D_B+W_{AB}$) between adjacent channel regions may be increased by no more than the width $W_{AB}$, resulting in the overall distance being less than achievable using other processes.

In FIGS. 26A, 26B, 26C, 26D, 26E, 26F, 26G, and 26H, the gate electrodes 125 are deposited for filling the remaining portions of the second recesses 98 and openings 99 (e.g., deposited over the doped dielectric layer 116 and over the doped dielectric layer 122). This process is illustrated as step 285 of the flow diagram of FIG. 34. The gate electrodes 125 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 125 are illustrated in FIGS. 26A, 26B, 26C, 26D, and 26E, the gate electrodes 125 may comprise any number of liner layers, any number of work function tuning layers, and a fill material. Any combination of the layers which make up the gate electrodes 125 may be deposited in the first region 50A and the second region 50B.

After the filling of the second recesses 98, a planarization process, such as a CMP, may be performed to remove the excess portions of the interfacial layer 100 (if used), the doped dielectric layer 116, the doped dielectric layer 122, and the material of the gate electrodes 125, which excess portions are over the top surface of the first ILD 96. The remaining portions of the material of the gate electrodes 125 and the doped dielectric layers 116 and 122 thus form replacement gate structures of the resulting nano-FETs. The interfacial layer 100, the doped dielectric layer 116, and the gate electrode 125 in the first region 50A may be collectively referred to as a gate structure 127A, and the interfacial layer 100, the doped dielectric layer 122, and the gate electrode 125 in the second region 50B may be referred to as a gate structure 127B.

Figure 26A:
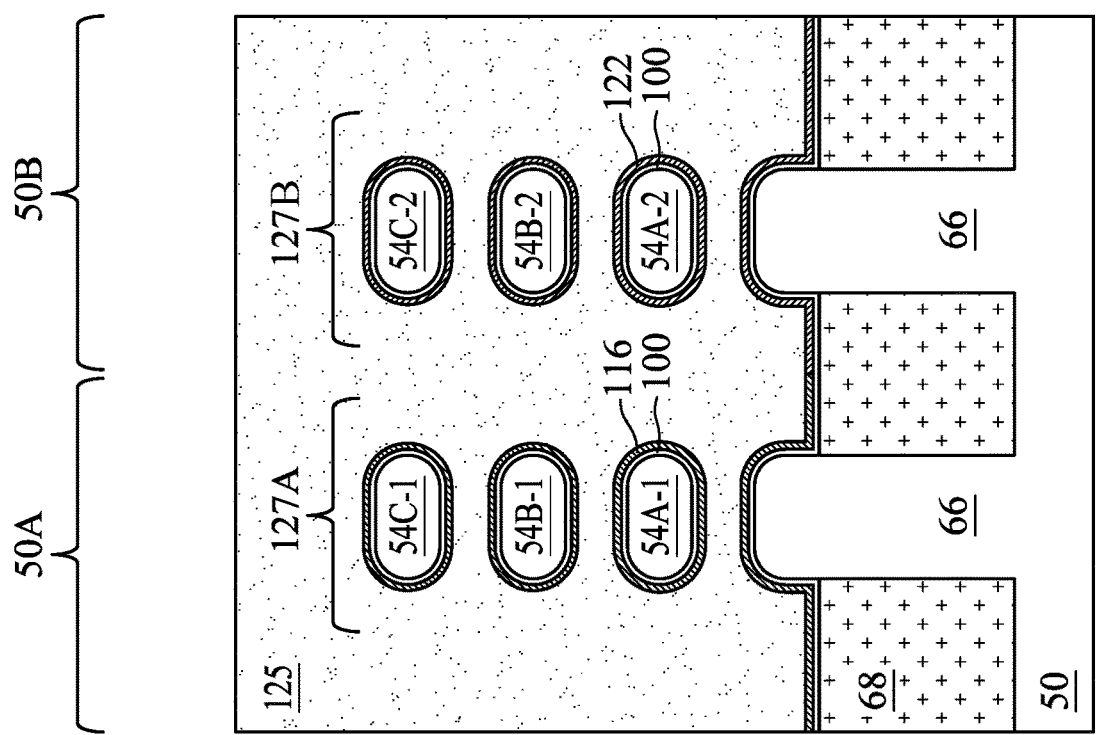
Figure 26C:
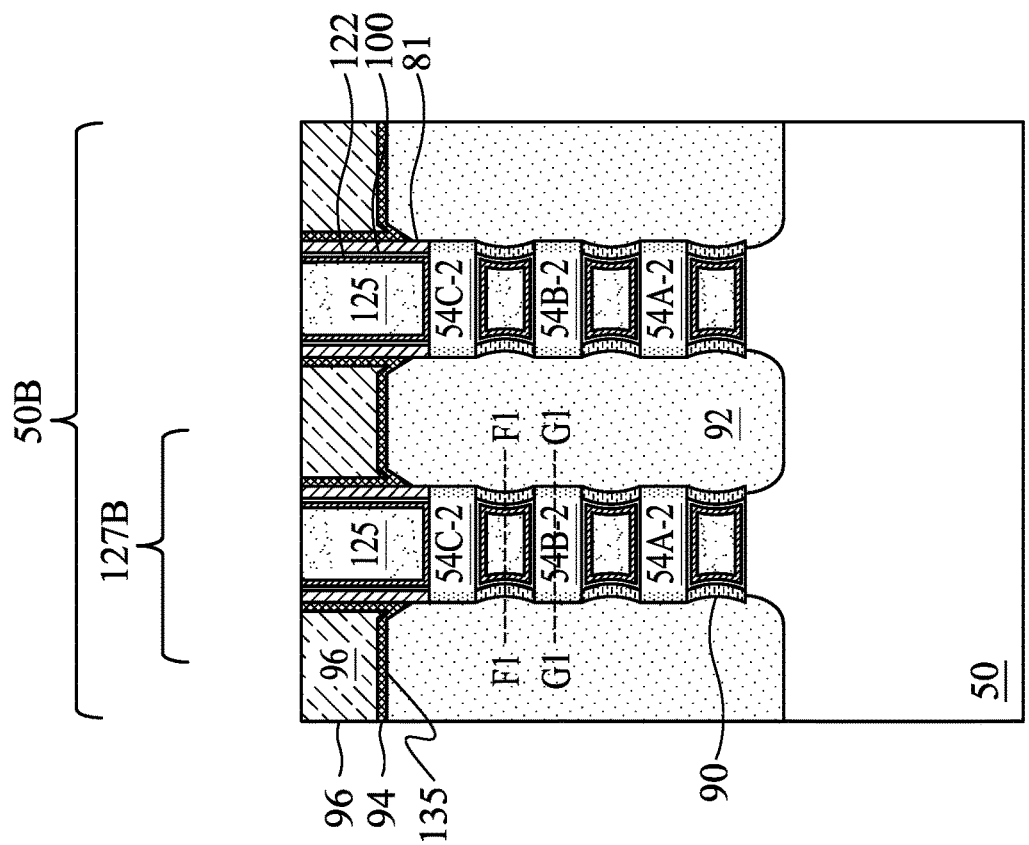
Figure 26B:
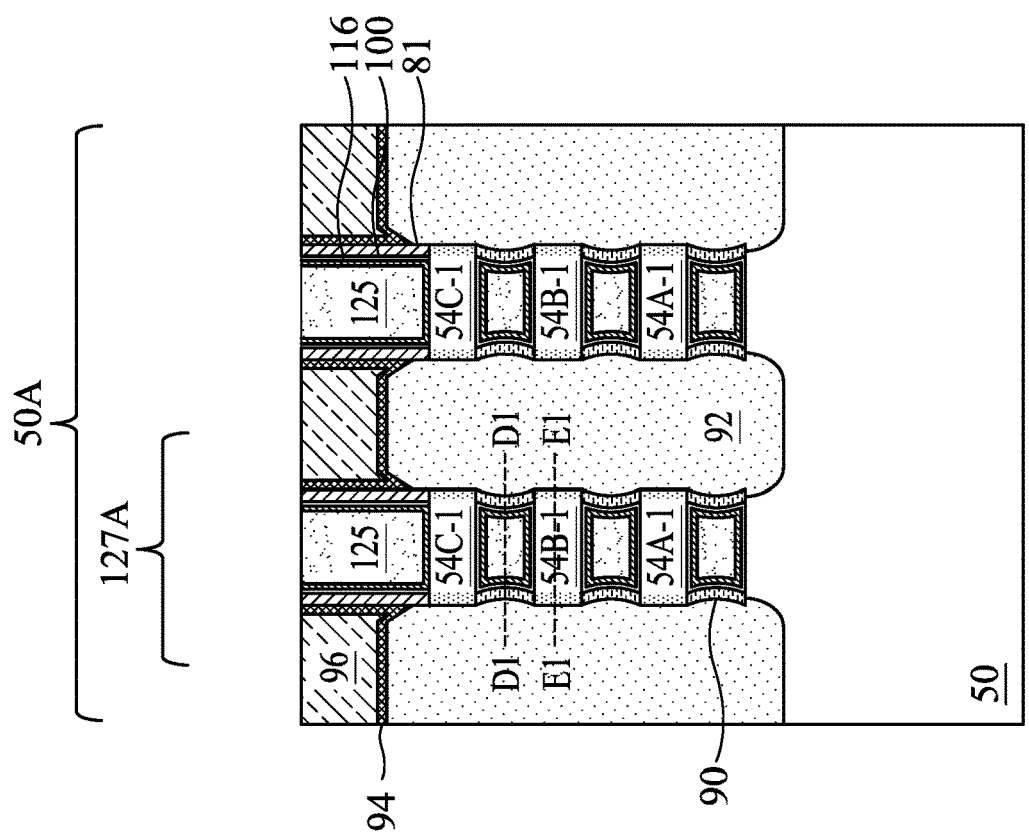
Figure 26E:
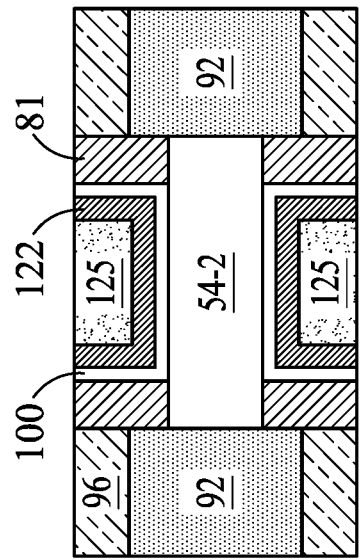
Figure 26G:
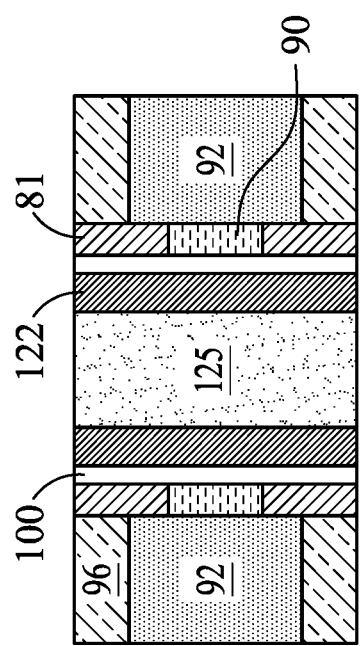
Figure 26D:
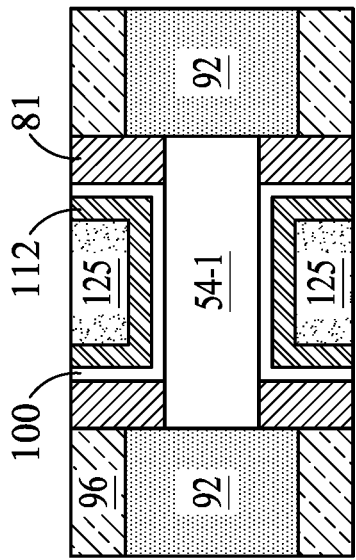
Figure 26F:
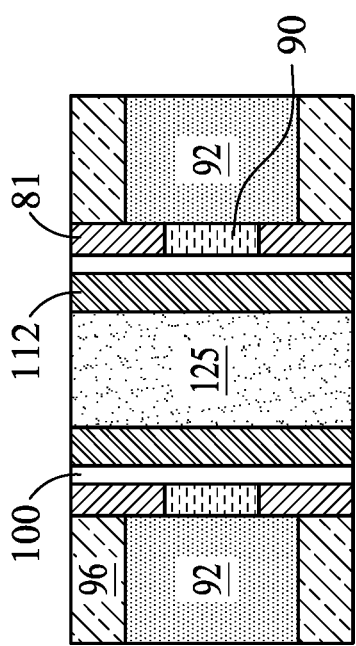
Figure 26H:
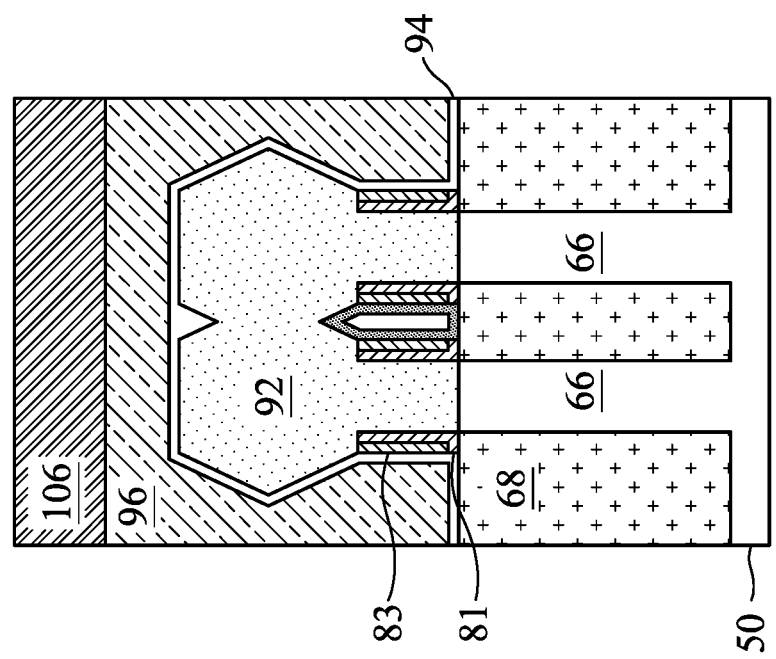

FIG. 26D is a partial view of a horizontal cross-section along the reference line D1-D1 in FIG. 26B in the first region 50A. FIG. 26E is a partial view of a horizontal cross-section along the reference line E1-E1 in FIG. 26B in the first region 50A. FIG. 26F is a partial view of a horizontal cross-section along the reference line F1-F1 in FIG. 26C in the second region 50B. FIG. 26G is a partial view of a horizontal cross-section along the reference line G1-G1 in FIG. 26C in the second region 50B. FIGS. 26D, 26E, 26F, and 26G illustrate another view of the inner spacer 90 separating the source/drain regions 92 from the interfacial 100, and another view of the interface between the channel region 54-1 in the first region 50A interfacing with the source/drain regions 92 and the channel region 54-2 in the second region 50B interfacing with the source/drain regions 92.

In FIGS. 27A, 27B, 27C, and 27D, the gate structures 127A and 127B (including the interfacial dielectric layer 100, first and second doped gate dielectric layers 116 and 122, and the corresponding overlying gate electrodes 125) are recessed, so that a recess is formed directly over the gate structure and between opposing portions of first spacers 81. A gate mask 129 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as contacts 136, discussed below with respect to FIGS. 28A and 28B) penetrate through the gate mask 129 to contact the top surface of the recessed gate electrodes 125.

As further illustrated by FIGS. 27A-27D, a second ILD 131 is deposited over the first ILD 96 and over the gate mask 129. In some embodiments, the second ILD 131 is a flowable film formed by FCVD. In some embodiments, the second ILD 131 is formed of a dielectric material such as PSG, BSG, BPSG, USG, or the like, and may be deposited by any suitable method, such as CVD, PECVD, or the like.

Figure 27A:
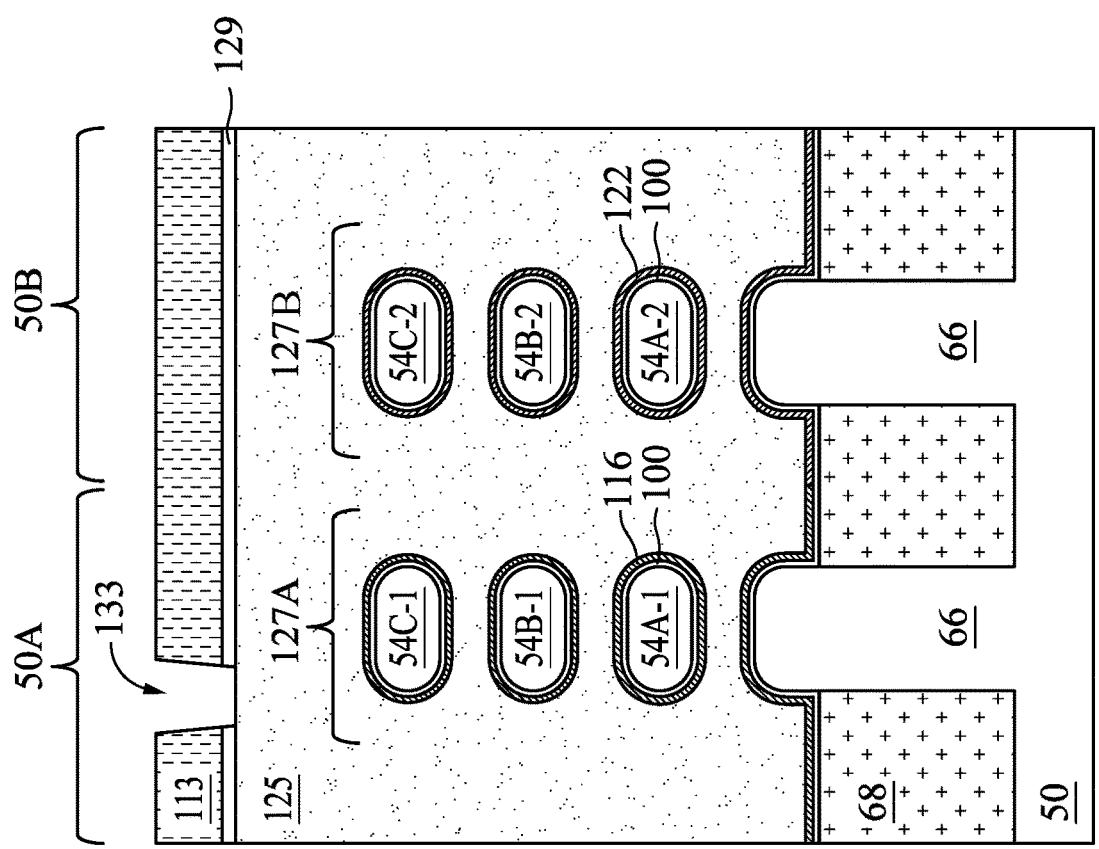
Figure 27B:
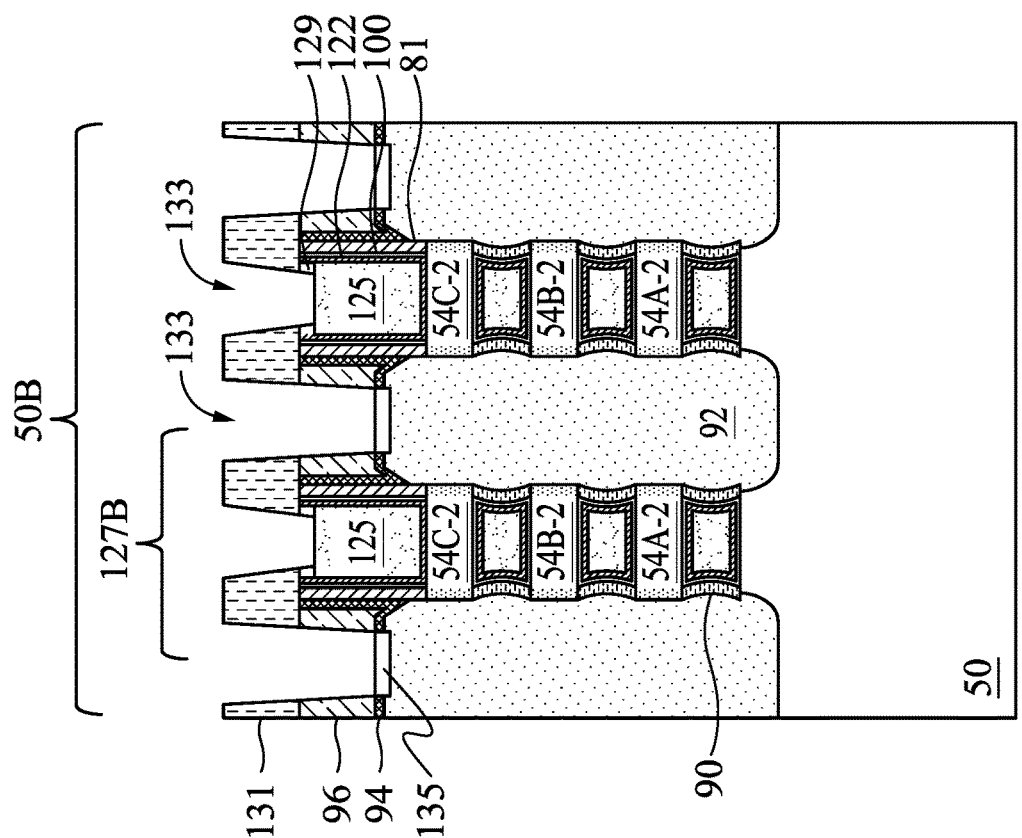
Figure 27C:
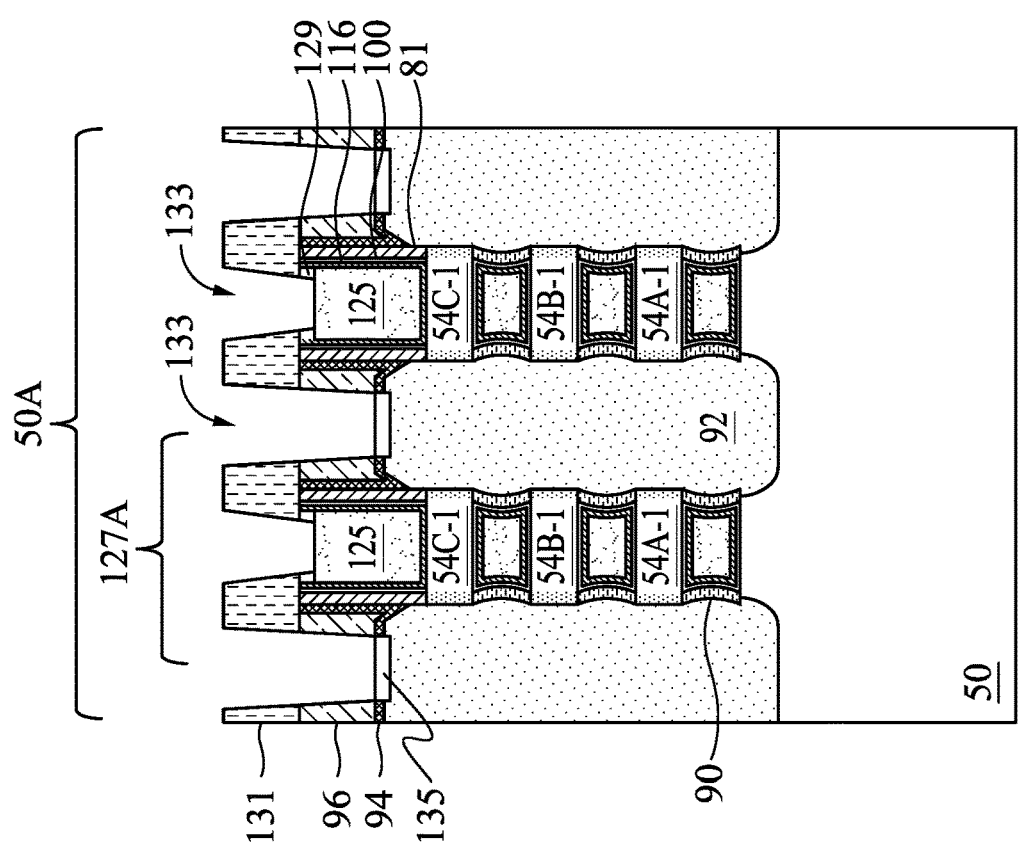
Figure 27D:
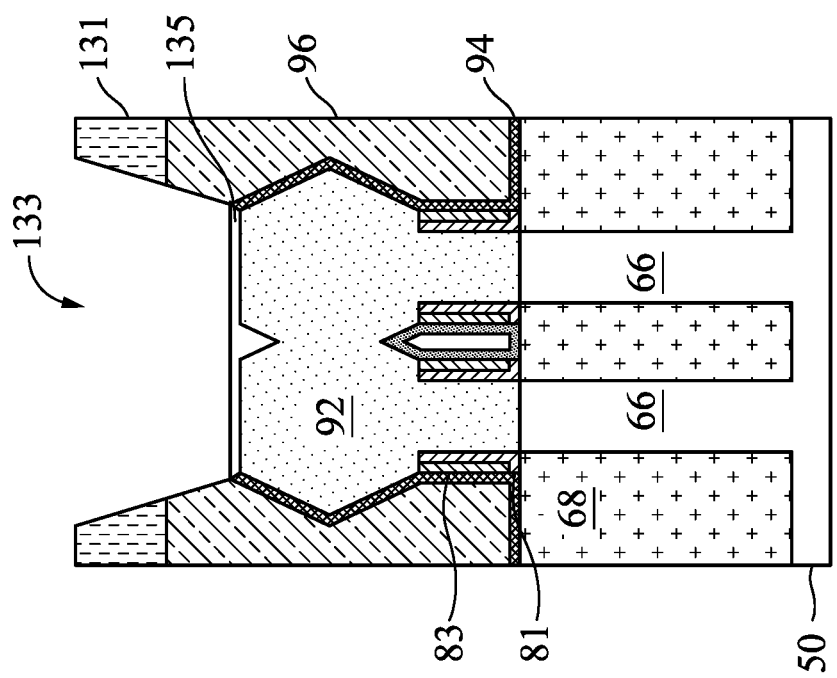
Figure 28A:
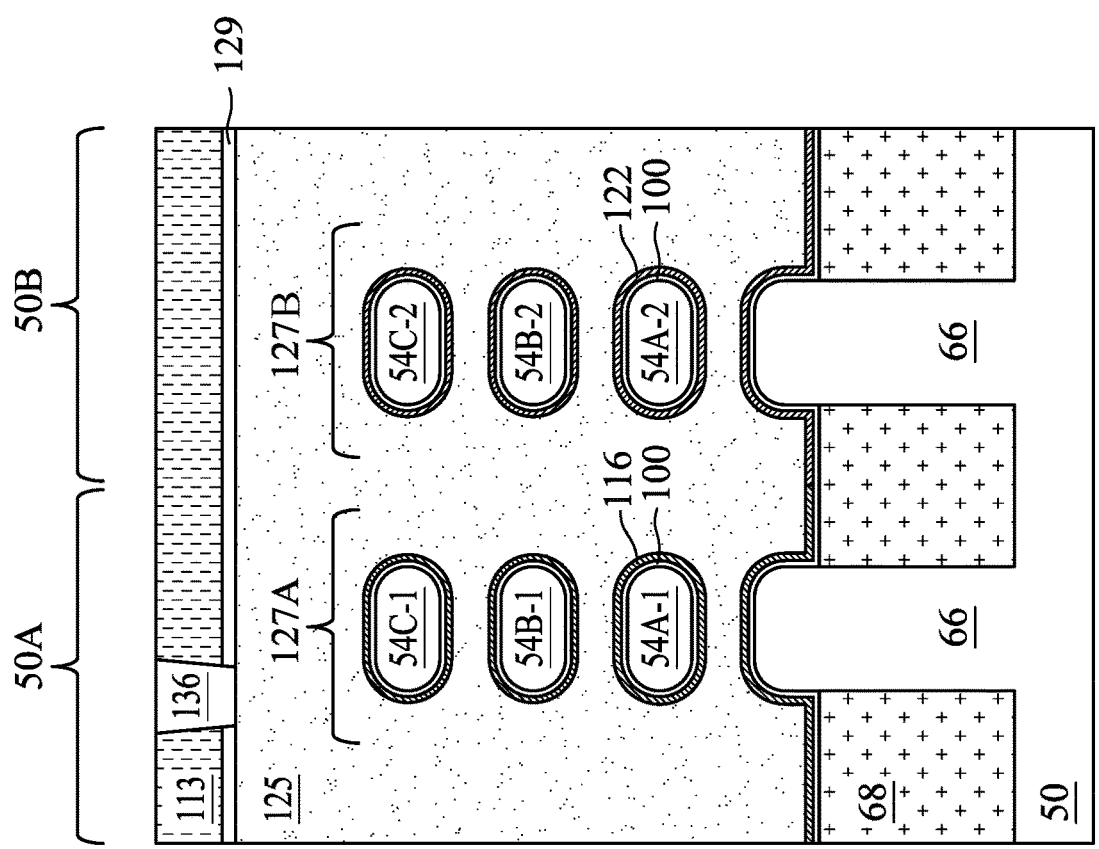
Figure 28C:
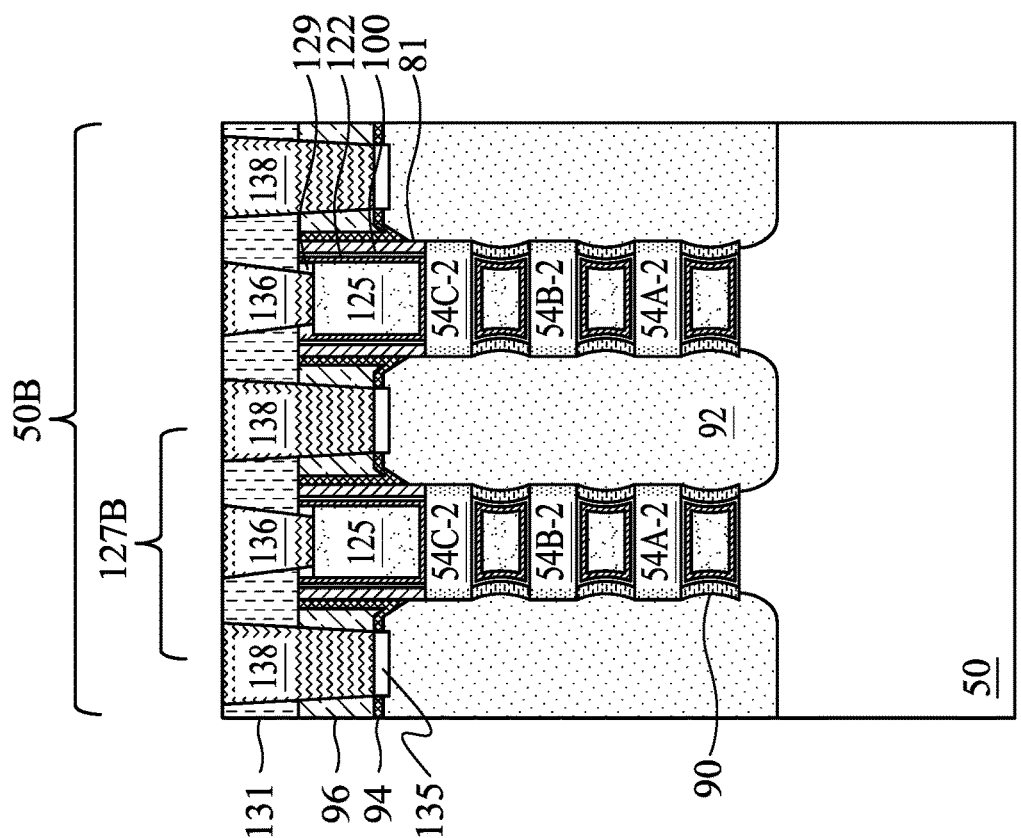
Figure 28B:
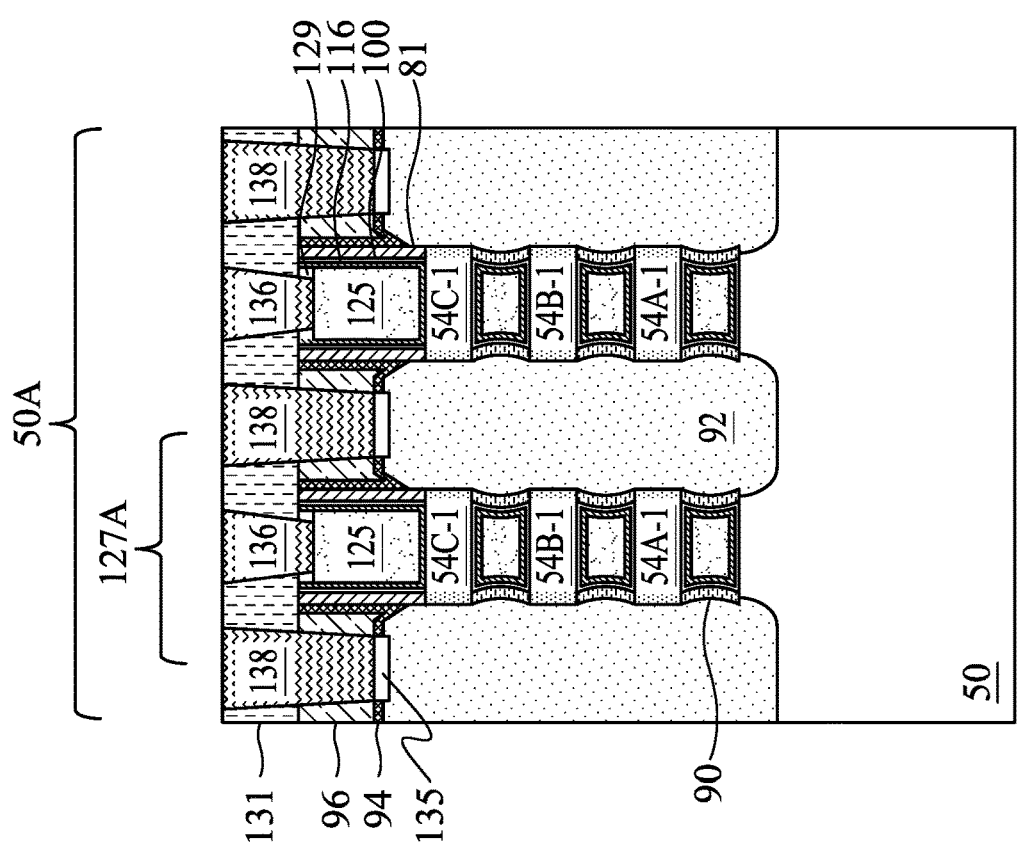
Figure 28D:
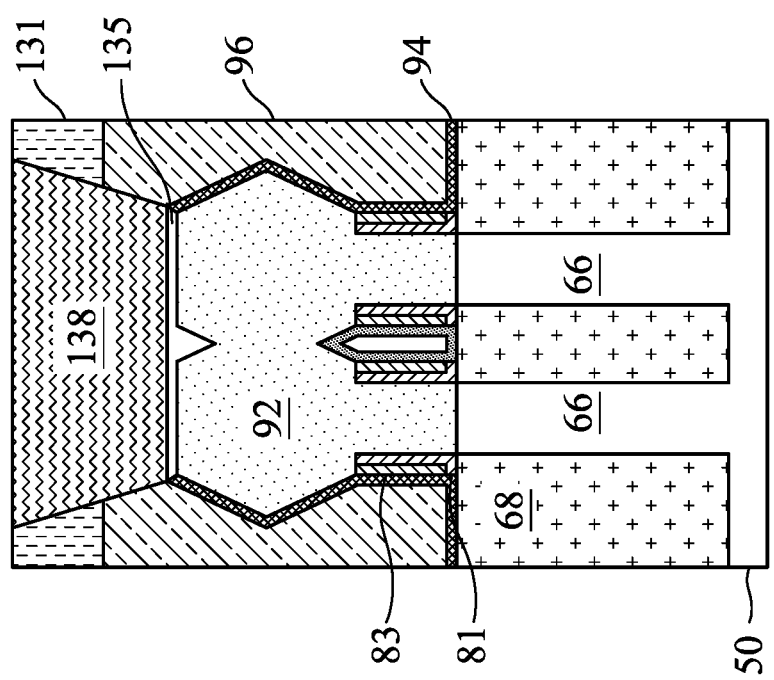

As further illustrated by FIGS. 27A-27D, the second ILD 131, the first ILD 96, the CESL 94, and the gate masks 129 are etched to form third recesses 133 exposing surfaces of the epitaxial source/drain regions 92 and/or the gate structure. The third recesses 133 may be formed by etching using an anisotropic etching process, such as RIE, NBE, or the like. In some embodiments, the third recesses 133 may be etched through the second ILD 131 and the first ILD 96 using a first etching process; may be etched through the gate masks 129 using a second etching process; and may then be etched through the CESL 94 using a third etching process. A mask, such as a photoresist, may be formed and patterned over the second ILD 131 to mask portions of the second ILD 131 from the first etching process and the second etching process. In some embodiments, the etching process may over-etch, and therefore, the third recesses 133 extend into the epitaxial source/drain regions 92 and/or the gate structure, and a bottom of the third recesses 133 may be level with (e.g., at a same level, or having a same distance from the substrate), or lower than (e.g., closer to the substrate) the epitaxial source/drain regions 92 and/or the gate structure. Although FIGS. 27B and 27C illustrate the third recesses 133 as exposing the epitaxial source/drain regions 92 and the gate structure in a same cross-section, in various embodiments, the epitaxial source/drain regions 92 and the gate structure may be exposed in different cross-sections, thereby reducing the risk of shorting subsequently formed contacts. After the third recesses 133 are formed, silicide regions 135 are formed over the epitaxial source/drain regions 92. In some embodiments, the silicide regions 135 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 135. The un-reacted portions of the deposited metal are then removed, e.g., by an etching process. Although silicide regions 135 are referred to as silicide regions, silicide regions 135 may also be germanide regions, or silicon germanide regions (e.g., regions comprising silicide and germanide). In an embodiment, the silicide region 135 comprises TiSi, and has a thickness in a range between about 2 nm and about 10 nm.

Next, in FIGS. 28A, 28B, 28C, and 28D, contacts 136 and 138 (may also be referred to as contact plugs) are formed in the third recesses 133. This process is illustrated as step 290 of the flow diagram of FIG. 34. The contacts 136 and 138 may each comprise one or more layers, such as barrier layers, diffusion layers, and fill materials. For example, in some embodiments, the contacts 136 and 138 each include a barrier layer and a conductive material, and is electrically coupled to the underlying conductive feature (e.g., gate electrodes 125 and/or silicide region 135 in the illustrated embodiment). The contacts 136 are electrically coupled to the gate electrodes 125 and may be referred to as gate contacts, and the contacts 138 are electrically coupled to the silicide regions 135 and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 131.

Figure 29A:
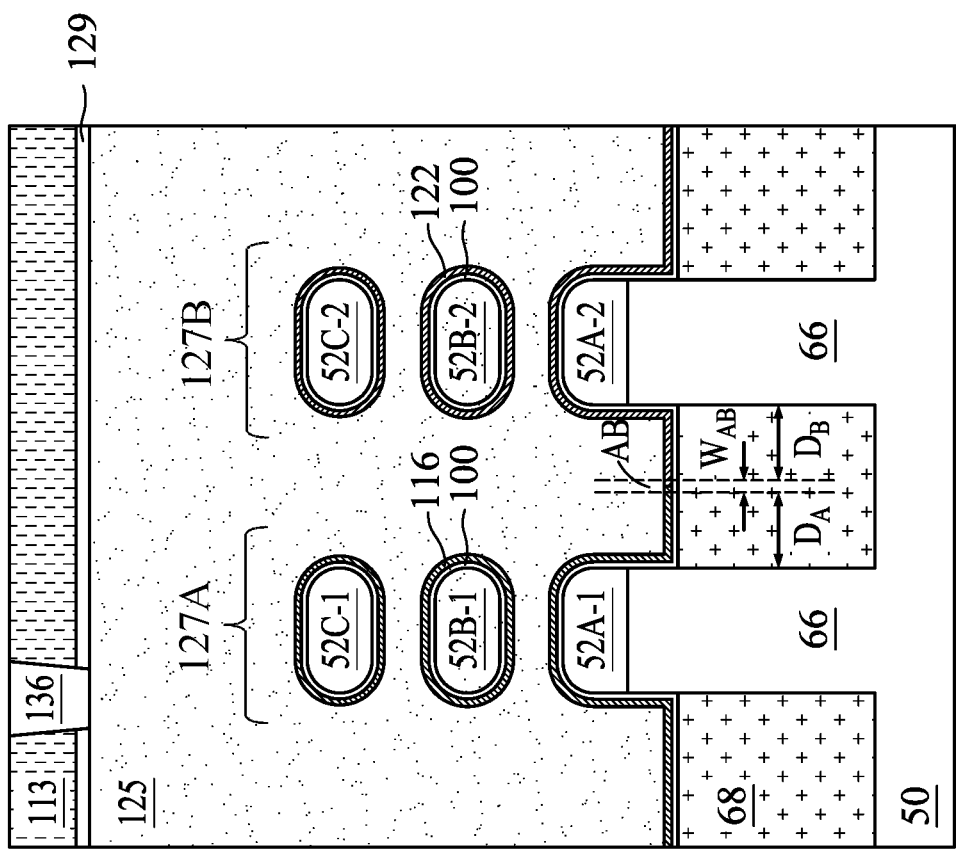
FIGS. 29A, 29B, 29C, and 29D are cross-sectional views of a nano-FET, in accordance with some embodiments.
Figure 29C:
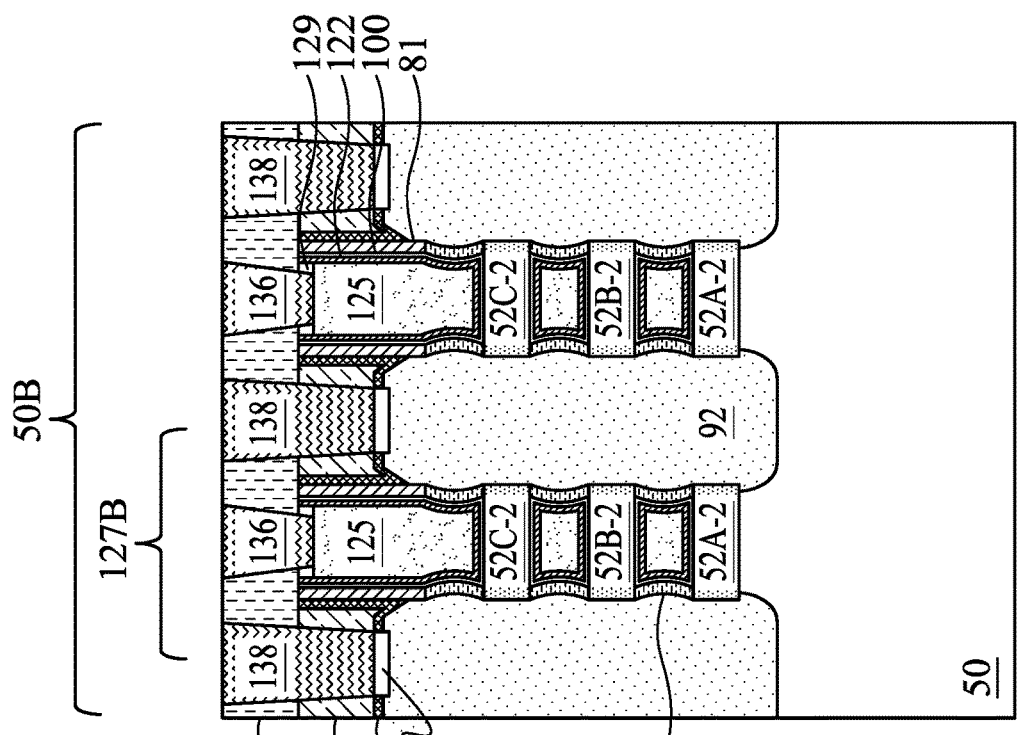
Figure 29B:
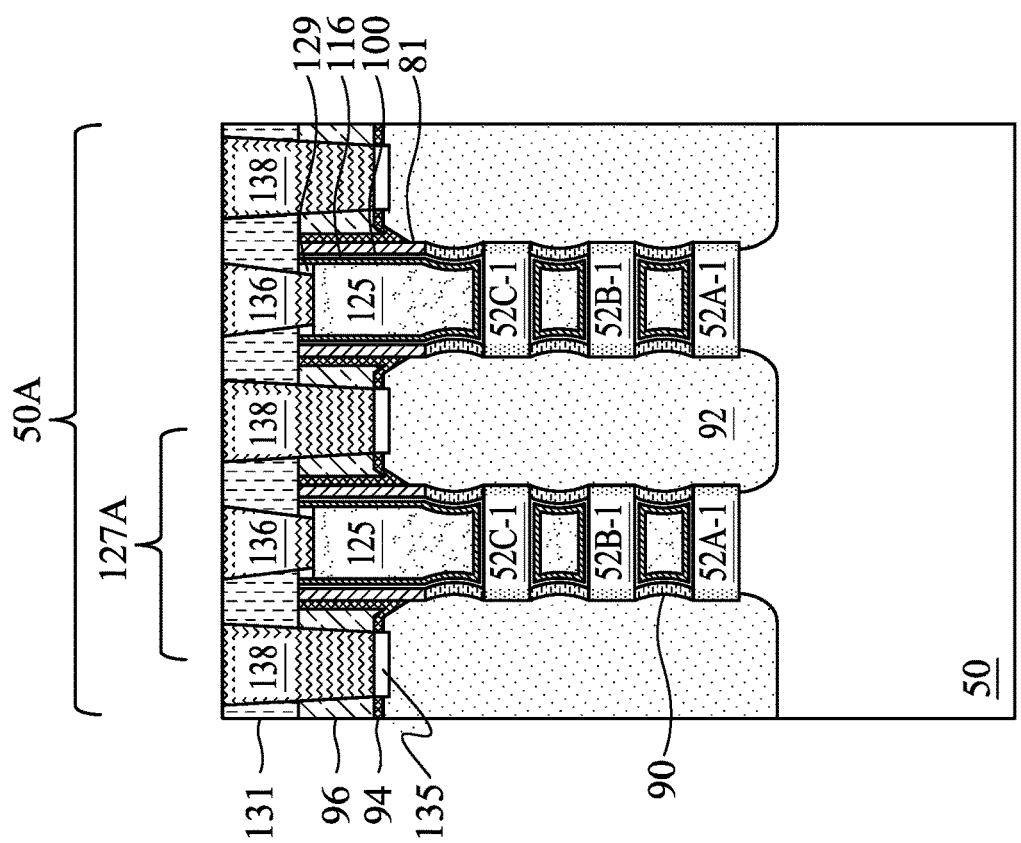
Figure 29D:
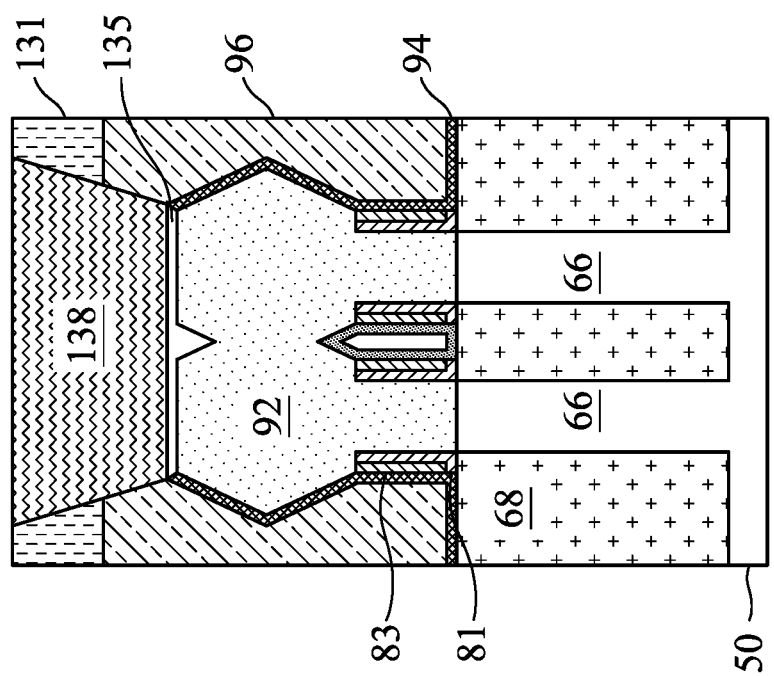

FIGS. 29A, 29B, 29C, and 29D illustrate cross-sectional views of a device according to some alternative embodiments. FIG. 29A illustrates reference cross-section A-A' illustrated in FIG. 1. FIG. 29B illustrates reference cross-section B-B' illustrated in FIG. 1. FIG. 29C illustrates reference cross-section C-C' illustrated in FIG. 1. FIG. 29D illustrates reference cross-section D-D' illustrated in FIG. 1. In FIGS. 29A-29D, like reference numerals indicate like elements formed by like processes as the structure of FIGS. 28A-28D. However, in FIGS. 29A-29D, channel regions in the first region 50A and the second region 50B are formed of different materials. For example, the first nanostructures 52, which may comprise silicon germanium, may provide channel regions in the first and second regions 50A and 50B, rather than the second nanostructures 54. In other embodiments, the channel regions in the first region 50A may be formed from the first nanostructures 52 or the second nanostructures 54 and channel regions in the second region 50B may be formed from the other of the second nanostructures 54 or the first nanostructures 52. For example, the second nanostructures 54, which comprise silicon or silicon carbide, may provide channel regions in the first region 50A, and the first nanostructures 52, which may comprise silicon germanium, may provide channel regions in the second region 50B. The structures of FIGS. 29A-29D be formed, for example, by removing the second nanostructures in the first region 50A and in the second region 50B; forming the interfacial layer 100 over the first nanostructures 52; and forming the remainder of the gate structures 127A and 127B in accordance with processes described above. In embodiments utilizing first nanostructures 52 as channel regions in one region and second nanostructures 54 as channel regions in another region, masks may be used to cover or expose those areas of the channel which are being formed.

Figure 30:
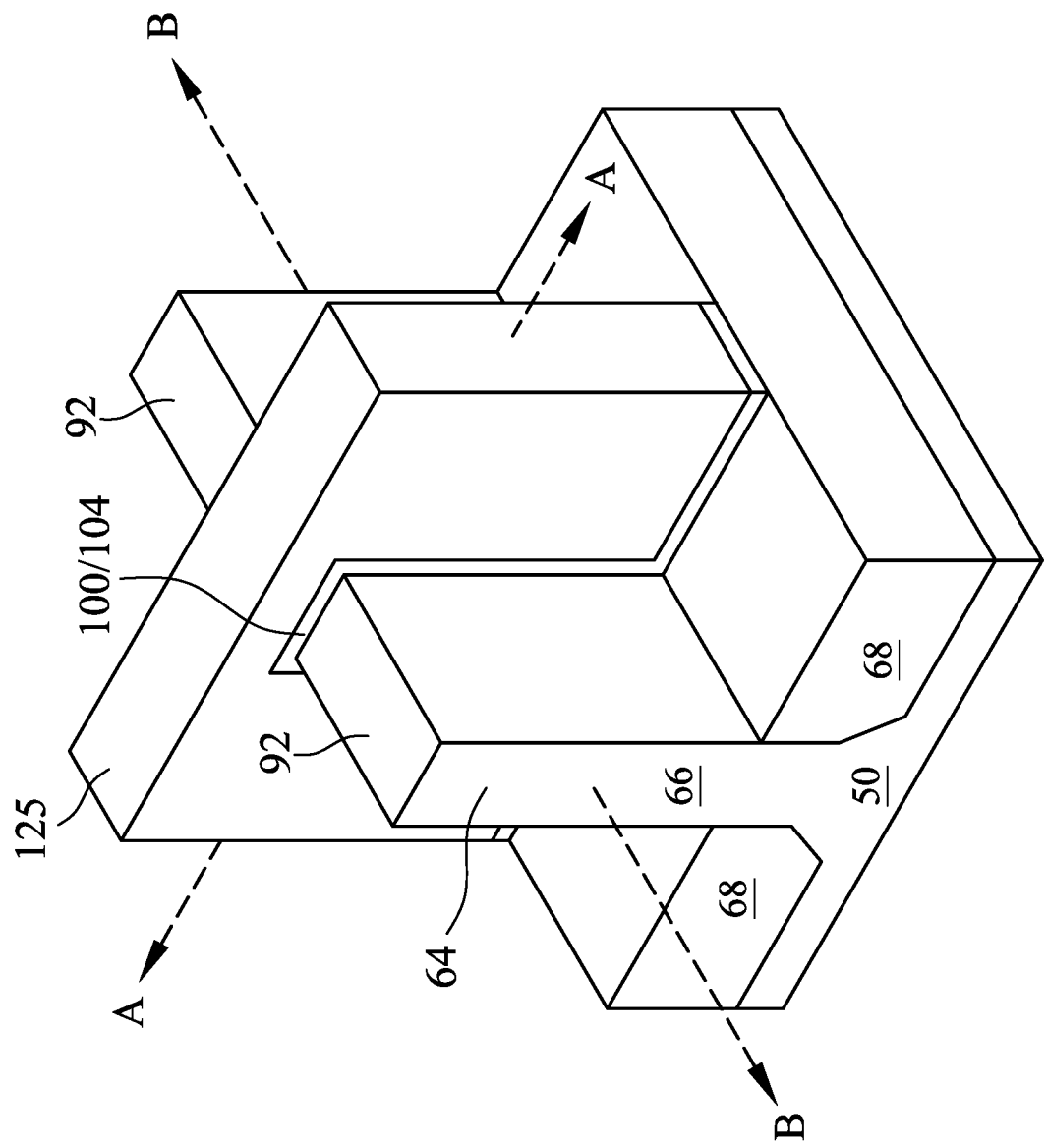
FIG. 30 illustrates an example of a fin field-effect transistor (FinFET) in a three-dimensional view, in accordance with some embodiments.

In FIG. 30, a fin field-effect transistor (FinFET) is illustrated in three-dimensional view. Reference lines are provided on the FinFET of FIG. 30 which are referred to with respect to FIGS. 31A, 31B, and 31C. Like elements are labeled with like references as those discussed above with respect to the nano-FET. The FinFET of FIG. 30 includes a substrate 50 with a fin 66 extending vertically from the substrate. A top portion of the fin 66 has a channel region 54 under a gate electrode 102 and interfacial layer 100. Source/drain regions 92 are disposed on each side of the gate electrode 102 in recessed portions of the fin 66 which have been regrown with the source/drain regions 92. Shallow trench isolations regions 68 surround a base portion of the fin 66.

Figures 31A, 31B:
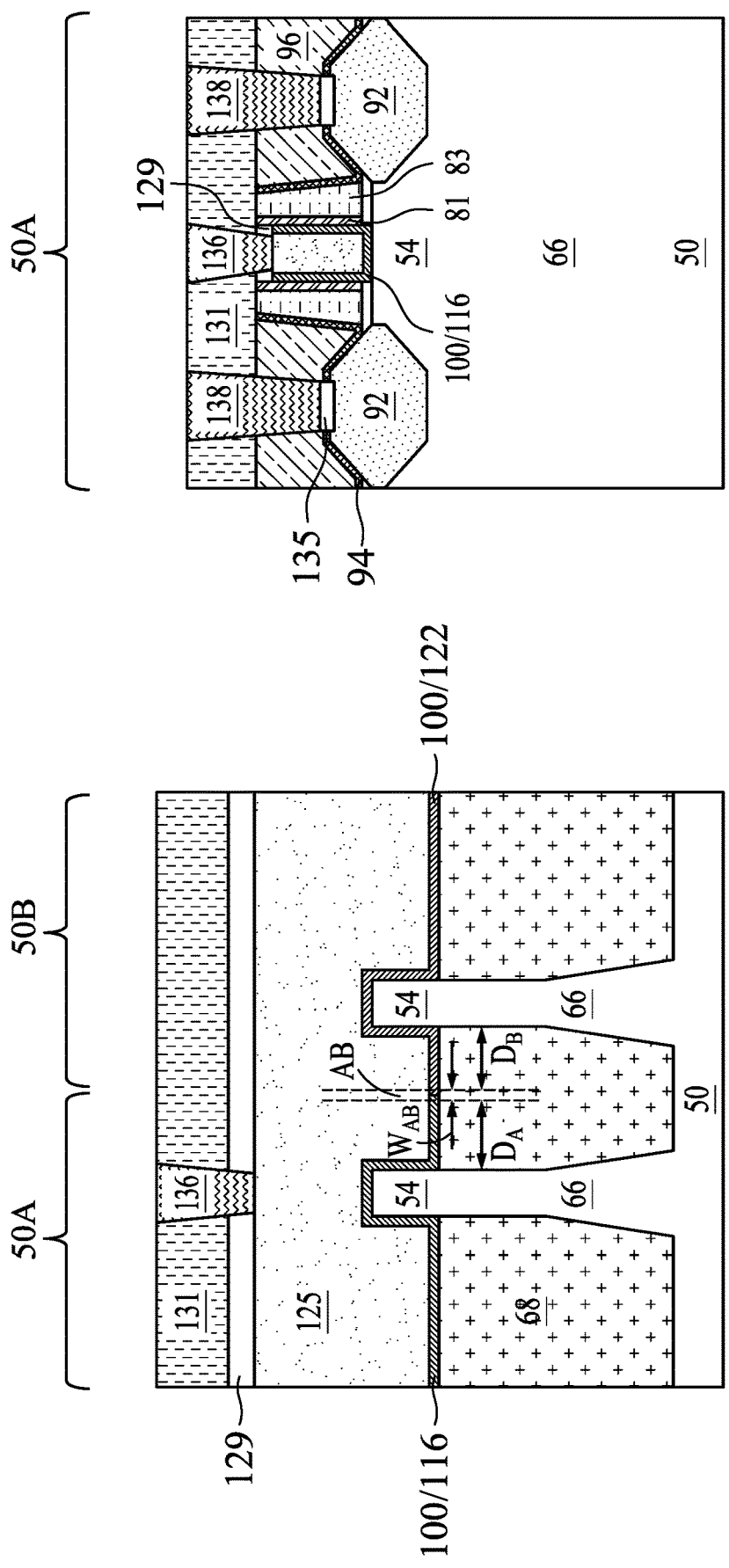
FIGS. 31A, 31B, 31C illustrate cross-sectional views of a FinFET, in accordance with some embodiments.
Figure 31C:
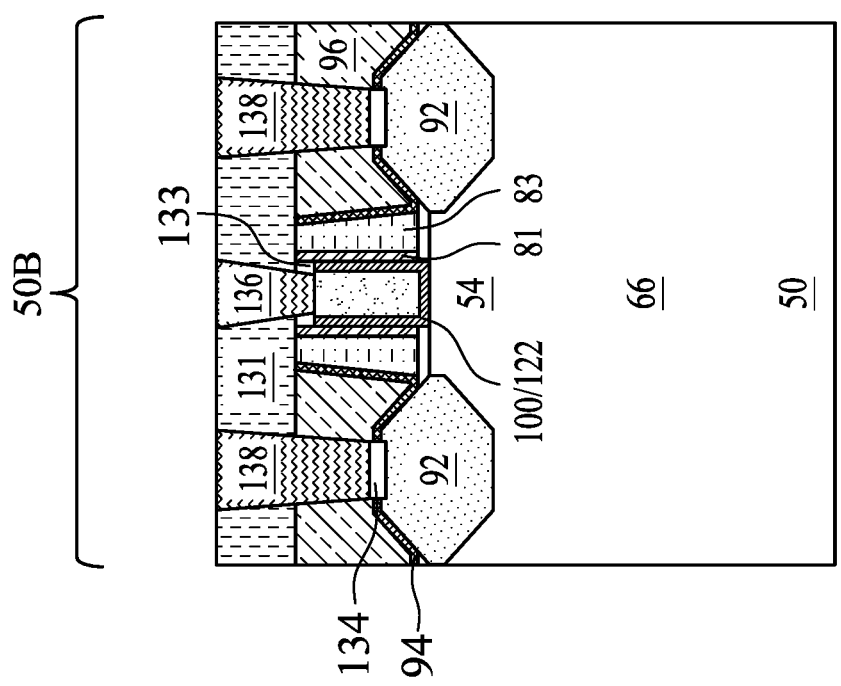

In FIGS. 31A, 31B, and 31C, a FinFET device is illustrated after undergoing dipole doping to form a doped dielectric layer 116 and second dipole gate dielectric 122. FIG. 31A is a cross-sectional view along the reference cross-section A-A' of FIG. 30, FIG. 31B is a cross-sectional view along the reference cross-section B-B' of FIG. 30, FIG. 31C is a cross-sectional view along a cross-section parallel to B-B' of FIG. 30 through an adjacent fin 66. The fins 66 may be formed using understood processes. A dummy gate structure is formed over the fins 66, and then replaced in a gate replacement cycle. A dummy gate dielectric is removed and replaced with an interfacial layer 100, such as described above. A dielectric layer 104 is then deposited, such as described above. Then a first gate dipole layer, such as the first dipole layer 106 is deposited in the recess for the replacement gate. A hard mask, such as the hard mask 108 is formed over a first region 50A of the FinFET and then the first dipole layer is removed. Then a second dipole layer, such as the second dipole layer 112 is formed over the hard mask in the first region 50A and over the dielectric layer 104 in the second region 50B. Then, a drive-in treatment process, such as the anneal process 114 is performed to drive-in dipole dopants from the first dipole layer into the dielectric layer 104 in the first region 50A to form a doped dielectric layer 116 and to drive-in dipole dopants from the second dipole layer into the dielectric layer 104 in the second region 50B to form a doped dielectric layer 122.

After the doped dielectric layer 116 is formed and the doped dielectric layer 122 is formed, the hard mask is removed, and the first dipole layer 106 and the second dipole layer 112 may be removed. Then a gate electrode, such as the gate electrode 125 may be deposited over the doped dielectric layer 116 and the doped dielectric layer 122. The gate electrode may then be recessed and a gate mask, such as the gate mask 129, may be formed. A second ILD, such as the second ILD 131 may then be formed and contacts, such as the gate contacts 136 and source/drain contacts 138 may be formed through the second ILD.

The doping of the dielectric layer 104 between the first region 50A and the second region 50B causes a boundary region AB to be formed. The boundary region AB is as described above, including the descriptions of the distances and ratios for $D_A$, $D_B$ and $W_{AB}$.

Accordingly, a FinFET having multiple threshold states may be formed, such as described herein.

Figure 32:
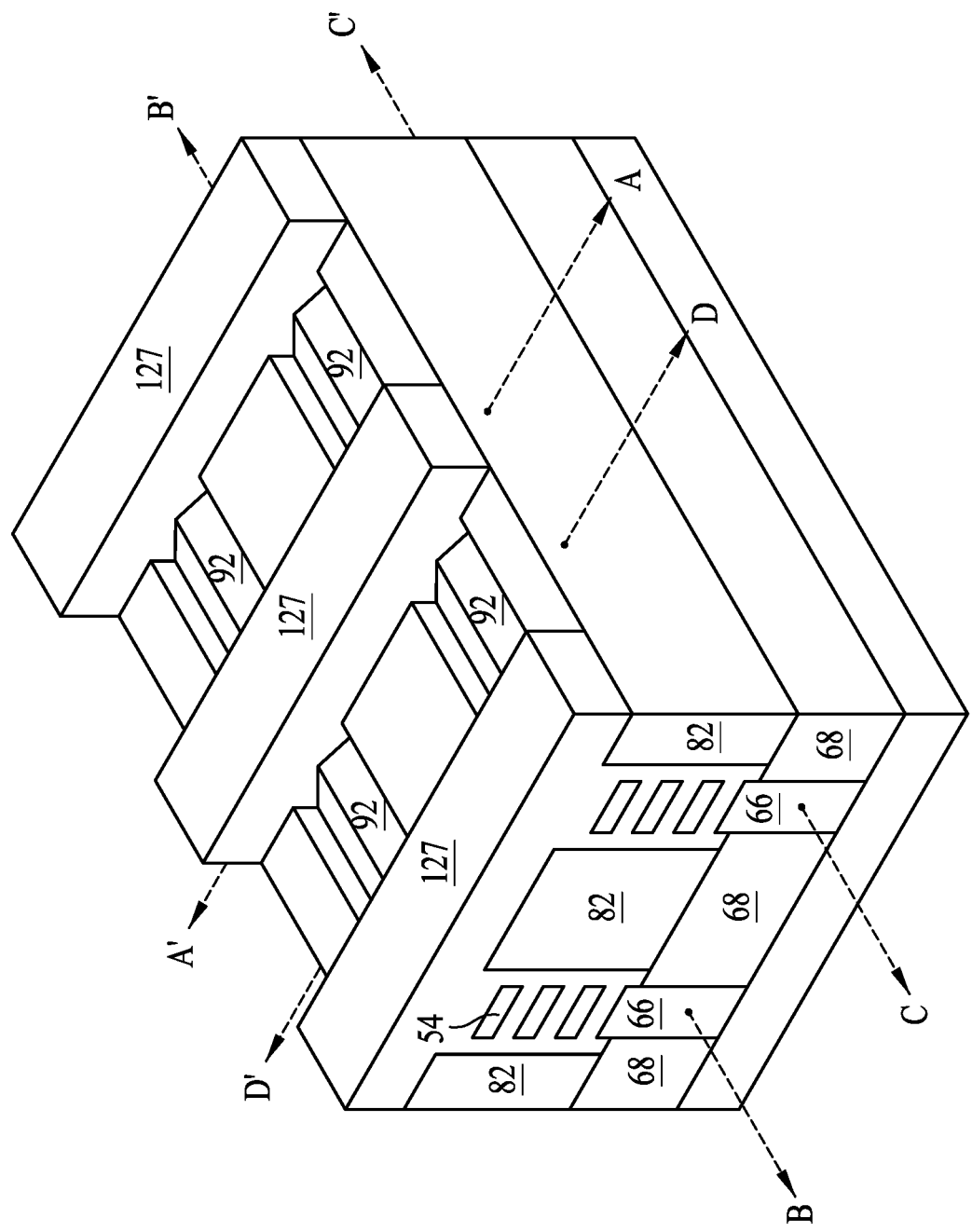
FIG. 32 illustrates an example of a nanostructure field-effect transistor (nano-FET) in a three-dimensional view, in accordance with some embodiments.
Figure 33A:
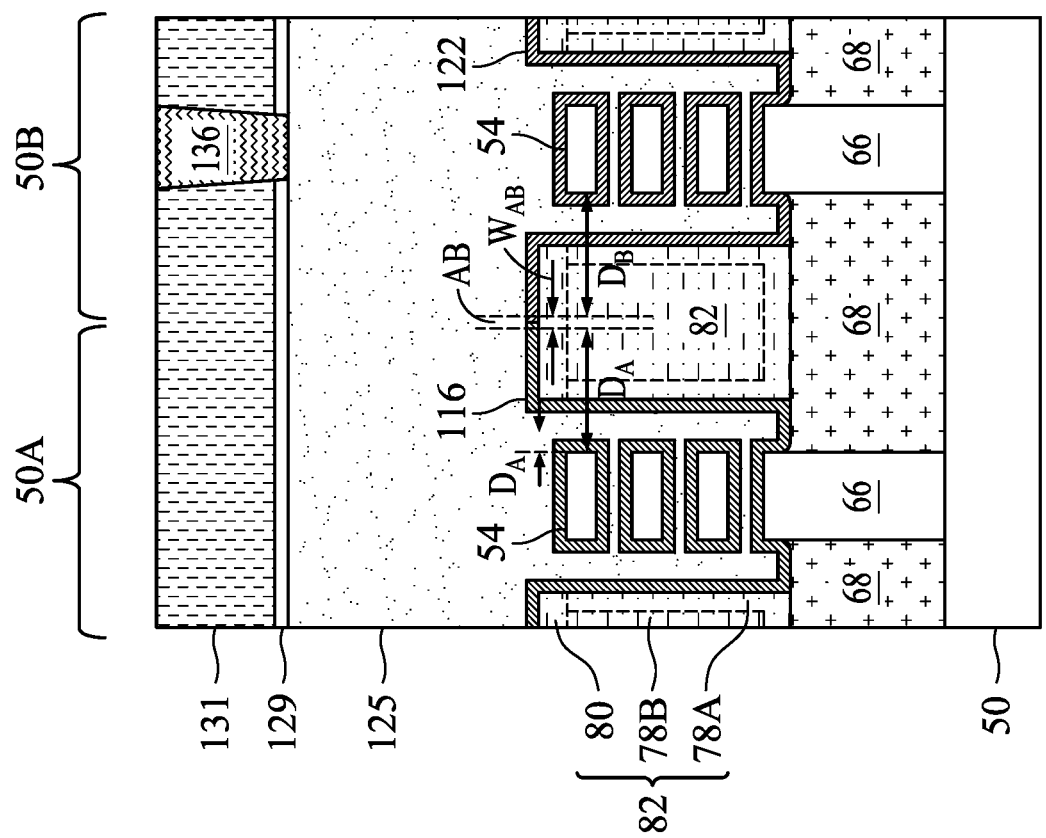
FIGS. 33A, 33A', 33B, 33C, and 33D are cross-sectional views of a nano-FET, in accordance with some embodiments.
Figure 33A:
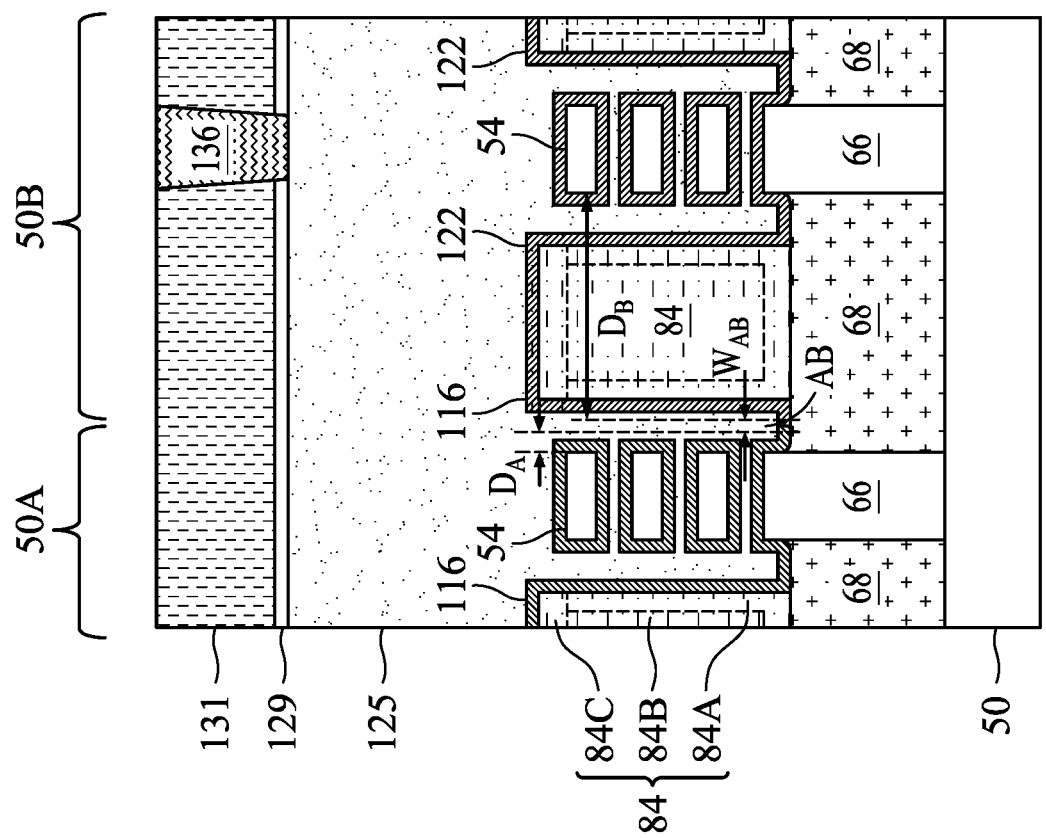

FIGS. 32, 33A, 33A', 33B, 33C, and 33D illustrate a nano-FET structure similar to that described above, except that a hybrid fin or isolation fin is formed between adjacent nanostructures and between adjacent source/drain regions 92. Like elements are labeled with like references with respect to the nano-FET structure described above and be made of similar materials using similar processes.

FIG. 32 illustrates an example of nano-FETs (e.g., nanowire FETs, nanosheet FETs, or the like), in accordance with some embodiments. FIG. 32 is a three-dimensional view, where some features of the nano-FETs are omitted for illustration clarity. The nano-FETs may be nanosheet field-effect transistors (NWFETs), nanowire field-effect transistors (NWFETs), gate-all-around field-effect transistors (GAAFETs), or the like.

The nano-FETs include second nanostructures 54 (e.g., nanosheets, nanowires, or the like) over semiconductor fins 66 on a substrate 50 (e.g., a semiconductor substrate), with the second nanostructures 54 acting as channel regions for the nano-FETs. The second nanostructures 54 may include p-type nanostructures, n-type nanostructures, or a combination thereof. Isolation regions 68, such as shallow trench isolation (STI) regions, are disposed between adjacent semiconductor fins 66, which may protrude above and from between adjacent isolation regions 68. Although the isolation regions 68 are described/illustrated as being separate from the substrate 50, as used herein, the term "substrate" may refer to the semiconductor substrate alone or a combination of the semiconductor substrate and one or more additional structures, such as the isolation regions 68. Additionally, although the bottom portions of the semiconductor fins 66 are illustrated as being separate from the substrate 50, the bottom portions of the semiconductor fins 66 may be single, continuous materials with the substrate 50. In this context, the semiconductor fins 66 refer to the portion extending above and from between the adjacent isolation regions 68.

Gate structures 127 are over top surfaces of the semiconductor fins 66 and along top surfaces, sidewalls, and bottom surfaces of the second nanostructures 54. Epitaxial source/drain regions 92 are disposed on the semiconductor fins 66 at opposing sides of the gate structures 127. The epitaxial source/drain regions 92 may be shared between various semiconductor fins 66. For example, adjacent epitaxial source/drain regions 92 may be electrically connected, such as through coupling the epitaxial source/drain regions 92 with a same source/drain contact. Source/drain region(s) 92 may refer to a source or a drain, individually or collectively dependent upon the context.

Insulating fins 84, also referred to as hybrid fins or dielectric fins, are disposed over the isolation regions 68, and between adjacent epitaxial source/drain regions 92. The insulating fins 84 block epitaxial growth during the epitaxial source/drain regions 92 formation to prevent coalescing of adjacent epitaxial source/drain regions 92. For example, in some embodiments, the insulating fins 84 may be formed to separate the epitaxial source/drain regions 92 of adjacent transistors.

FIG. 32 further illustrates reference cross-sections that are used in later figures. Cross-section A-A' is along a longitudinal axis of a gate structure 127 and in a direction, for example, perpendicular to a direction of current flow between the epitaxial source/drain regions 92 of a nano-FET. Cross-section B-B' is along a longitudinal axis of a semiconductor fin 66 in a first region 50A and in a direction of, for example, a current flow between the epitaxial source/drain regions 92 of the nano-FET. Cross-section C-C' is along a longitudinal axis of a semiconductor fin 66 in a second region 50B adjacent the semiconductor fin 66 in the first region 50A. Cross-section D-D' is parallel to cross-section A-A' and extends through epitaxial source/drain regions 92 of the nano-FETs. Subsequent figures refer to these reference cross-sections for clarity.

Figures 33B, 33C:
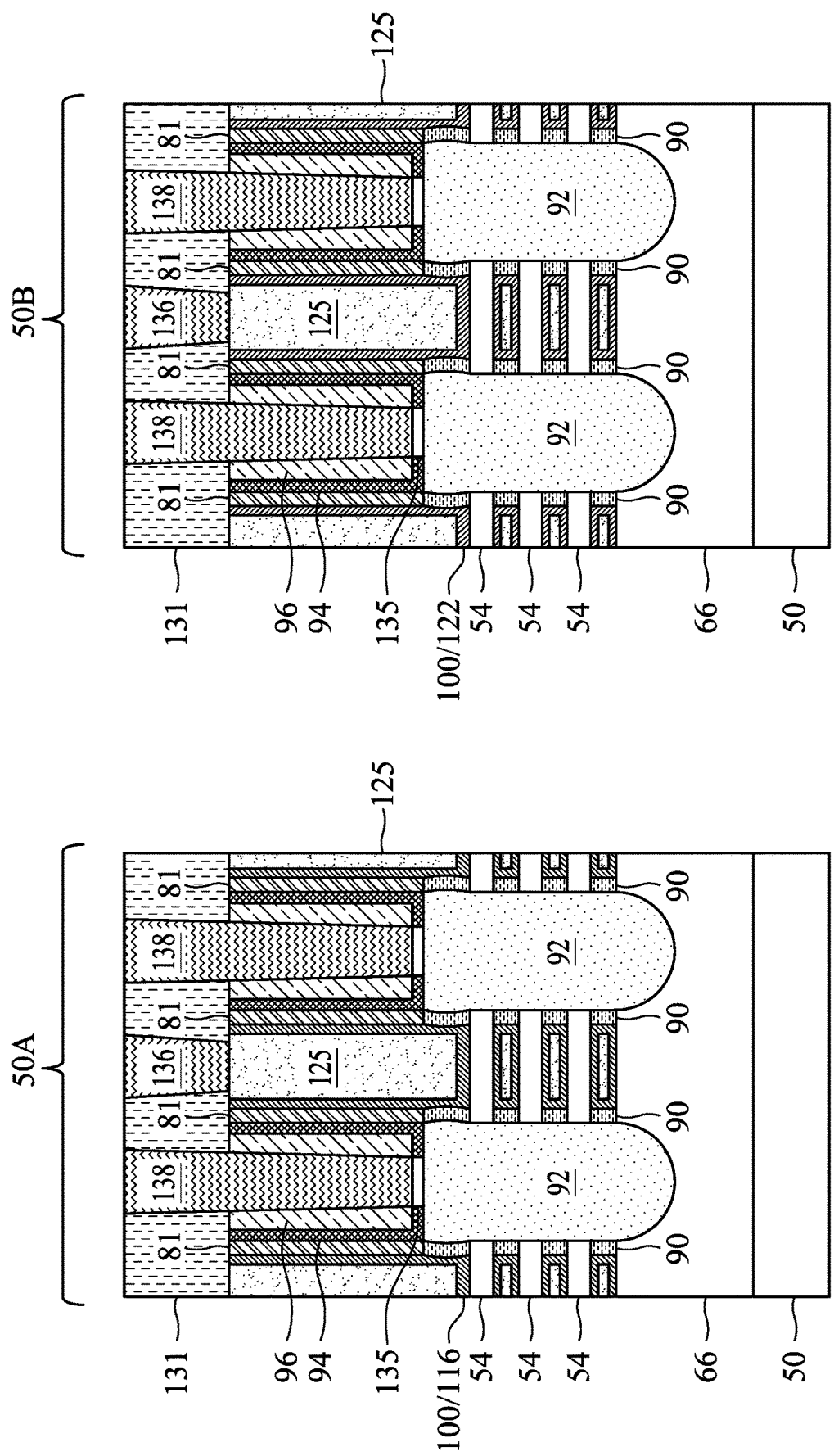
Figure 33D:
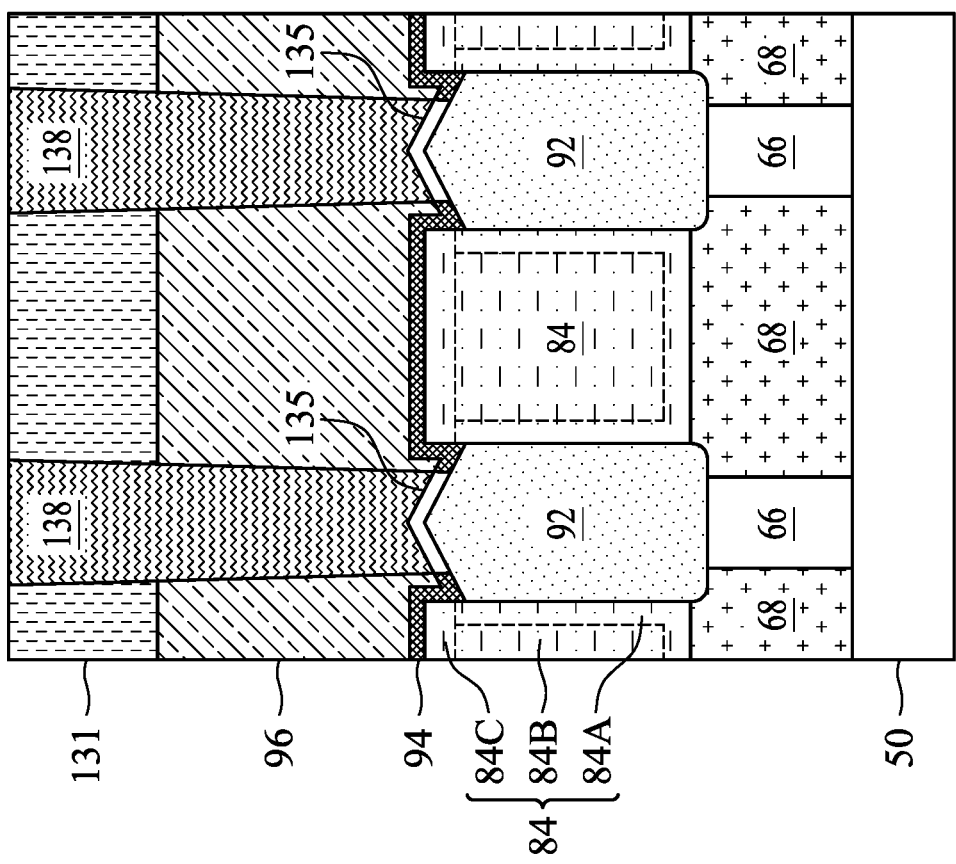

FIGS. 33A and 33A' are cross-sectional views illustrated along a similar cross-section as reference cross-section A-A' in FIG. 32. FIG. 33B is a cross-sectional views illustrated along a similar cross-section as reference cross-section B-B' in FIG. 32. FIG. 33C is a cross-sectional view illustrated along a similar cross-section as reference cross-section C-C' in FIG. 32. FIG. 33D a is cross-sectional view illustrated along a similar cross-section as reference cross-section D-D' in FIG. 32.

In FIGS. 33A, 33A', 33B, 33C, and 33D a nano-FET device is illustrated after undergoing dipole doping to form a doped dielectric layer 116 and second dipole gate dielectric 122. The illustrated structure and formation thereof may be understood from the above description for forming the nano-FET device above, except for the insulating fin 84. One example for forming the insulating fins 84 is provided, however, it should be understood that other processes may be used to form the insulating fins 84. After the formation of the STI regions 68, described above with respect to FIG. 4, and prior to forming the dummy gate dielectric layers, described above with respect to FIG. 5, the insulating fins 84 may be formed.

After forming the fins 66 and nanostructures 55, temporary cladding layers may be formed over the top surfaces and the sidewalls of the fin structures and over the top surface of the STI region 68. A mask layer may remain over the fin structures during this process. The cladding layers may be made of semiconductor materials, such as silicon germanium (SiGe). In some embodiments, the cladding layers and the first nanostructures 52 are made of the same semiconductor material. The cladding layer may be grown by a process such as vapor phase epitaxy (VPE) or molecular beam epitaxy (MBE), deposited by a process such as chemical vapor deposition (CVD) or atomic layer deposition (ALD), or the like. Horizontal portions of the cladding layer may be removed by reactive ion etch or the like. The cladding layers act like a spacer for the fin structures to pad the sides of the fin structures. An area between two adjacent vertical walls of two adjacent fin structures remains empty. A liner layer 84A may be formed over the cladding layers and the STI region 68, in accordance with some embodiments. The liner layer 84A may be made of a low k dielectric material having a k value lower than 7. In some embodiments, the liner layer 84A is made of SiN, SiCN, SiOCN, SiON, or the like. The liner layer 84A may be deposited using CVD, PVD, ALD, HDPCVD, MOCVD, RPCVD, PECVD, LPCVD, ALCVD, APCVD, other applicable methods, or combinations thereof. In some embodiments, the liner layer 84A has a thickness in a range from about 2 nm to about 8 nm.

Next, a filling layer 84B is formed over the cladding layers and the STI regions 68, in accordance with some embodiments. After the liner layer 84A is formed, the filling layer 84B is formed over the liner layer 84A to completely fill the spaces between the adjacent fin structures, and a polishing process is performed until the top surfaces of the cladding layers are exposed, in accordance with some embodiments. In some embodiments, the filling layer 84B and the liner layer 84A may both be made of oxide but formed by different methods. In some embodiments, the filling layer 84B is made of SiN, SiCN, SiOCN, SiON, or the like. The filling layer 84B may be deposited using a flowable CVD (FCVD) process that includes, for example, depositing a flowable material (such as a liquid compound) and converting the flowable material to a solid material by a suitable technique, such as thermal annealing and/or ultraviolet radiation treating.

Next, recesses are formed between the fin structures, for example, by performing an etching process. Afterwards, a cap layer 84C is formed in the recesses, thereby forming insulating fins 84 (including the liner layer 84A, the filling layer 84B, and the cap layer 84C. In some embodiments, the cap layer 84C is made of a high k dielectric material, such as $HfO_2$, $ZrO_2$, $HfAlO_x$, $HfSiO_x$, $Al_2O_3$, or the like. The dielectric materials for forming the cap layer 84C may be formed by performing ALD, CVD, PVD, oxidation-based deposition process, other suitable process, or combinations thereof. After the cap layers 84C are formed, a CMP process is performed until the mask layers over the fin structures are exposed. The cap layers 84C should be thick enough to protect the insulating fins 84 during the subsequent etching processes, so that the insulating fins 84 may be used to separate the adjacent source/drain structures formed afterwards. Next, the mask layers over the fin structures and the cladding layers are removed, leaving the insulating fin 84 behind.

Next, a dummy gate structure and the subsequent steps as described above may be used to form the structure illustrated in FIGS. 33A, 33A', 33B, 33C, and 33D. In a gate replacement process, a dummy gate dielectric is removed and replaced with an interfacial layer 100, such as described above. A dielectric layer 104 is then deposited, such as described above. Then a first gate dipole layer, such as the first dipole layer 106 is deposited in the recess for the replacement gate. A hard mask, such as the hard mask 108 is formed over a first region 50A of the nano-FET and then the first dipole layer is removed in the second region 50B. Then a second dipole layer, such as the second dipole layer 112 is formed over the hard mask in the first region 50A and over the dielectric layer 104 in the second region 50B. Then, a drive-in treatment process, such as the anneal process 114, is performed to drive-in dipole dopants from the first dipole layer into the dielectric layer 104 in the first region 50A to form a doped dielectric layer 116 and to drive-in dipole dopants from the second dipole layer into the dielectric layer 104 in the second region 50B to form a doped dielectric layer 122.

After the doped dielectric layer 116 is formed and the doped dielectric layer 122 is formed, the hard mask is removed, and the first dipole layer 106 and the second dipole layer 112 may be removed. Then a gate electrode, such as the gate electrode 125 may be deposited over the doped dielectric layer 116 and the doped dielectric layer 122. The gate electrode may then be recessed and a gate mask, such as the gate mask 129, may be formed. A second ILD, such as the second ILD 131 may then be formed and contacts, such as the gate contacts 136 and source/drain contacts 138 may be formed through the second ILD.

In some embodiments, the doping of the dielectric layer 104 between the first region 50A and the second region 50B causes a boundary region AB to be formed. The boundary region AB is as described above, including the descriptions of the distances and ratios for $D_A$, $D_B$ and $W_{AB}$. Because the insulating fin 84 is present, however, the boundary region AB may be disposed at an upper surface of the insulating fin 84, such as illustrated in FIG. 33A. In other embodiments, however, the boundary region AB, however, may instead be disposed at one side or at the other side of the insulating fin 84, such as illustrated in FIG. 33A'.

Accordingly, a nano-FET with an insulating fin and having multiple threshold states may be formed, such as described herein.

Advantages achieved by the above-described embodiments include the ability to provide a zero-thickness dipole structure to provide tunable threshold voltages for a gate structure. Moreover, the different dipole layers utilized for doping a gate dielectric with the dipoles may be placed using a single masking process which results in minimizing the size of the boundary between the two portions of the gate dielectric where the dipoles overlap.

According to embodiments of the present disclosure, a semiconductor device comprising gate dielectric layers doped with dipole dopant materials and methods of forming the semiconductor device are provided. The dipole dopant materials doped in the gate dielectric layers may adjust the threshold voltages of gate structures comprising the gate dielectric layers. In some embodiments, the one or more dipole dopant materials are doped into a gate dielectric layer by one or more individual doping loops, and each of the doping loops comprises an individual dipole layer formation and an individual anneal process. Accordingly, the concentration and concentration profiles of each dipole dopant material in one or more gate dielectric layers may be individually controlled, such as by controlling the thickness of the dipole layer or the temperature and/or time period of the anneal process in each doping loops. The methods according to some embodiments may also provide doping two or more dipole dopant materials in a single gate dielectric layer, with well-controlled concentration and concentration profiles of each of the dipole dopant materials, to provide fine-tuned threshold voltage.

One embodiment is a method including depositing a gate dielectric over a first channel region and a second channel region. The method also includes depositing a first dipole metal on the gate dielectric in the first channel region and on the gate dielectric in the second channel region. The method also includes forming a mask over the first dipole metal. The method also includes removing the mask and the first dipole metal from the second channel region, the mask remaining on the first channel region. The method also includes depositing a second dipole metal over the mask in the first channel region and over the gate dielectric in the second channel region. The method also includes diffusing a first dipole dopant from the first dipole metal into the gate dielectric over the first channel region, thereby forming a first dipole gate dielectric, and diffusing a second dipole dopant from the second dipole metal into the gate dielectric over the second channel region to form a second dipole gate dielectric. The method also includes removing the mask from the first dipole metal. The method also includes depositing a gate electrode surrounding the first dipole gate dielectric and the second dipole gate dielectric. In an embodiment, a corresponding first gate of the first dipole gate dielectric has a first voltage threshold, where a corresponding second gate of the second dipole gate dielectric has a second voltage threshold, the second voltage threshold different than the first voltage threshold. In an embodiment, the method includes removing the first dipole metal and the second dipole metal prior to depositing the gate electrode. In an embodiment, while diffusing the first dipole dopant into the gate dielectric, altering a thickness of the gate dielectric in the first channel region; and while diffusing the second dipole dopant into the gate dielectric, altering a thickness of the gate dielectric in the second channel region. In an embodiment, the first dipole dopant diffuses through a partial thickness of the gate dielectric over the first channel region. In an embodiment, the first dipole metal and the second dipole metal are each selected from lanthanum oxide, yttrium oxide, scandium oxide, gadolinium oxide, aluminum oxide, titanium oxide, indium oxide, gallium oxide, or zinc oxide. In an embodiment, the method may include: in a boundary area at an interface of the first dipole metal and the second dipole metal, diffusing the first dipole dopant and the second dipole dopant into the gate dielectric. In an embodiment, the boundary area is less than 1 nm wide. A depth of diffusion of the second dipole dopant into the mask is less than a thickness of the mask.

Another embodiment is a method including removing a dummy gate electrode and a dummy gate dielectric to form a first recess in a gate structure, the removing exposing a first transistor channel in a first region of the gate structure and a second transistor channel in a second region of the gate structure. The method also includes depositing a gate dielectric over the first transistor channel and the second transistor channel, the gate dielectric lining the first recess. The method also includes depositing a first dipole material over the gate dielectric. The method also includes forming a masking structure over the first dipole material. The method also includes patterning the masking structure to expose a second portion of the first dipole material in the second region, while a first portion of the first dipole material in the first region remains covered by the masking structure. The method also includes removing the second portion of the first dipole material. The method also includes depositing a second dipole material over of the masking structure in the first region and over the gate dielectric in the second region. The method also includes annealing the first dipole material and the second dipole material, the annealing driving in a first dipole dopant into the gate dielectric in the first region and driving in a second dipole dopant into the gate dielectric in the second region. The method also includes removing the first dipole material, the second dipole material, and the masking structure to expose the gate dielectric. The method also includes forming a gate electrode in the first recess. In an embodiment, the first dipole material interfaces the second dipole material at an interface of the first region and the second region, may include driving in the second dipole dopant into a first boundary region of the first region and driving in the first dipole dopant into a second boundary region of the second region. In an embodiment, a width of the first boundary region and the second boundary region are less than about 1 nm together. In an embodiment, a drive-in depth of the first dipole dopant in the first region is different than a drive-in depth of the second dipole dopant in the second region. In an embodiment, a drive-in depth of the first dipole dopant in the first region is greater than a thickness of the gate dielectric in the first region.

Another embodiment is a device including a first gate region including a gate dielectric layer doped with a first dopant. The device also includes a second gate region including the gate dielectric layer doped with a second dopant different than the first dopant, the second gate region contiguous with the first gate region, a threshold voltage of the first gate region different than a threshold voltage of the second gate region. The device also includes a boundary region between the first gate region and the second gate region, the boundary region including the gate dielectric layer doped with the first dopant and the second dopant. In an embodiment, the boundary region is less than 1 nm wide. In an embodiment, a distance between the boundary region and a first channel region in the first gate region is less than a distance between the boundary region and a second channel region in the second gate region. In an embodiment, the boundary region is disposed at an upper surface of the isolation fin. In an embodiment, the gate dielectric layer is a second gate dielectric layer, and the device may include a first gate dielectric layer under the second gate dielectric layer, the first dopant extending through the second gate dielectric layer and partially through the first gate dielectric layer. In an embodiment, a thickness of the first gate dielectric layer in the first gate region is different than a thickness of the first gate dielectric layer in the second gate region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    depositing a gate dielectric over a first channel region and a second channel region;
    depositing a first dipole metal on the gate dielectric in the first channel region and on the gate dielectric in the second channel region;
    forming a mask over the first dipole metal;
    removing the mask and the first dipole metal from the second channel region, the mask remaining on the first channel region;
    depositing a second dipole metal over the mask in the first channel region and over the gate dielectric in the second channel region;
    diffusing a first dipole dopant from the first dipole metal into the gate dielectric over the first channel region, thereby forming a first dipole gate dielectric, and diffusing a second dipole dopant from the second dipole metal into the gate dielectric over the second channel region to form a second dipole gate dielectric;
    removing the mask from the first dipole metal; and
    depositing a gate electrode surrounding the first dipole gate dielectric and the second dipole gate dielectric.

2. The method of claim 1, wherein a corresponding first gate of the first dipole gate dielectric has a first voltage threshold, wherein a corresponding second gate of the second dipole gate dielectric has a second voltage threshold, wherein the second voltage threshold is different than the first voltage threshold.

3. The method of claim 1, further comprising:
    removing the first dipole metal and the second dipole metal prior to depositing the gate electrode.

4. The method of claim 1, further comprising:
    while diffusing the first dipole dopant into the gate dielectric, altering a thickness of the gate dielectric in the first channel region; and
    while diffusing the second dipole dopant into the gate dielectric, altering a thickness of the gate dielectric in the second channel region.

5. The method of claim 1, wherein the first dipole dopant diffuses through a partial thickness of the gate dielectric over the first channel region.

6. The method of claim 1, wherein the first dipole metal and the second dipole metal are each selected from lanthanum oxide, yttrium oxide, scandium oxide, gadolinium oxide, aluminum oxide, titanium oxide, indium oxide, gallium oxide, or zinc oxide.

7. The method of claim 1, further comprising:
    in a boundary area at an interface of the first dipole metal and the second dipole metal, diffusing the first dipole dopant and the second dipole dopant into the gate dielectric.

8. The method of claim 7, wherein the boundary area is less than 1 nm wide.

9. The method of claim 1, further comprising:
    diffusing the second dipole dopant into the mask over the first channel region, wherein a depth of diffusion of the second dipole dopant into the mask is less than a thickness of the mask.

10. A method comprising:
    removing a dummy gate electrode and a dummy gate dielectric to form a first recess in a gate structure, the removing exposing a first transistor channel in a first region of the gate structure and a second transistor channel in a second region of the gate structure;
    depositing a gate dielectric over the first transistor channel and the second transistor channel, the gate dielectric lining the first recess;
    depositing a first dipole material over the gate dielectric;
    forming a masking structure over the first dipole material;
    patterning the masking structure to expose a second portion of the first dipole material in the second region, while a first portion of the first dipole material in the first region remains covered by the masking structure;
    removing the second portion of the first dipole material;
    depositing a second dipole material over the masking structure in the first region and over the gate dielectric in the second region;
    annealing the first dipole material and the second dipole material, the annealing driving in a first dipole dopant into the gate dielectric in the first region and driving in a second dipole dopant into the gate dielectric in the second region;
    removing the first dipole material, the second dipole material, and the masking structure to expose the gate dielectric; and
    forming a gate electrode in the first recess.

11. The method of claim 10, wherein the first dipole material interfaces the second dipole material at an interface of the first region and the second region, further comprising driving in the second dipole dopant into a first boundary region of the first region and driving in the first dipole dopant into a second boundary region of the second region.

12. The method of claim 11, wherein a width of the first boundary region and a width of the second boundary region are less than about 1 nm together.

13. The method of claim 10, wherein a drive-in depth of the first dipole dopant in the first region is different than a drive-in depth of the second dipole dopant in the second region.

14. The method of claim 10, wherein a drive-in depth of the first dipole dopant in the first region is greater than a thickness of the gate dielectric in the first region.

15. A device comprising:
a first gate region including a first gate electrode over a first portion of a gate dielectric layer, wherein the first portion of the gate dielectric layer is doped with a first dopant;
a second gate region including a second gate electrode over a second portion of the gate dielectric layer, wherein the second portion of the gate dielectric layer is doped with a second dopant different than the first dopant, wherein a threshold voltage of the first gate region is different than a threshold voltage of the second gate region; and
a boundary region between the first gate region and the second gate region, the boundary region including an overlap between the first portion of the gate dielectric layer doped with the first dopant and the second portion doped with the second dopant, wherein the gate dielectric layer in the boundary region is contiguous with the gate dielectric layer in the first gate region and the gate dielectric layer in the second gate region.

16. The device of claim 15, wherein the boundary region is less than 1 nm wide.

17. The device of claim 15, wherein a distance between the boundary region and a first channel region in the first gate region is less than a distance between the boundary region and a second channel region in the second gate region.

18. The device of claim 15, further comprising:
an isolation fin disposed between a first channel region in the first gate region and a second channel region in the second gate region, wherein the boundary region is disposed at an upper surface of the isolation fin.

19. The device of claim 15, wherein the gate dielectric layer is a second gate dielectric layer, further comprising a first gate dielectric layer under the second gate dielectric layer, the first dopant extending through the second gate dielectric layer and partially through the first gate dielectric layer.

20. The device of claim 19, wherein a thickness of the first gate dielectric layer in the first gate region is different than a thickness of the first gate dielectric layer in the second gate region.

* * * * *